US010727326B2

United States Patent
Lee et al.

(10) Patent No.: US 10,727,326 B2
(45) Date of Patent: *Jul. 28, 2020

(54) TRENCH-GATE INSULATED-GATE BIPOLAR TRANSISTORS (IGBTS)

(71) Applicant: SEMICONDUCTOR COMPONENTS INDUSTRIES, LLC, Phoenix, AZ (US)

(72) Inventors: Meng-Chia Lee, Chubbuck, ID (US); Ralph N. Wall, Pocatello, ID (US); Mingjiao Liu, Gilbert, AZ (US); Shamsul Arefin Khan, Chandler, AZ (US); Gordon M. Grivna, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 74 days.

This patent is subject to a terminal disclaimer.

(21) Appl. No.: 15/884,773

(22) Filed: Jan. 31, 2018

(65) Prior Publication Data

US 2019/0058055 A1   Feb. 21, 2019

Related U.S. Application Data

(60) Provisional application No. 62/548,361, filed on Aug. 21, 2017.

(51) Int. Cl.
*H01L 29/739* (2006.01)
*H01L 29/06* (2006.01)
(Continued)

(52) U.S. Cl.
CPC ...... *H01L 29/7397* (2013.01); *H01L 29/0623* (2013.01); *H01L 29/0649* (2013.01);
(Continued)

(58) Field of Classification Search
CPC .......... H01L 29/66348; H01L 29/7397; H01L 29/0649; H01L 29/4236; H01L 29/1095;
(Continued)

(56) References Cited

U.S. PATENT DOCUMENTS 6,608,350 B2 * 8/2003 Kinzer ................ H01L 29/0634
257/341
6,621,132 B2 * 9/2003 Onishi ................ H01L 29/0634
257/409

(Continued)

OTHER PUBLICATIONS

Hao Feng et al., "A 1200 V-class Fin P-body IGBT with Ultra-narrow-mesas for Low Conduction Loss," Proceedings of the 2016 28th International Symposium on Power Semiconductor Devices and ICs (ISPSD), Jun. 12-16, 2016, Prague, Czech Republic.

(Continued)

*Primary Examiner* — Khiem D Nguyen
(74) *Attorney, Agent, or Firm* — Brake Hughes Bellermann LLP

(57) ABSTRACT

In a general aspect, an insulated gate bipolar transistor (IGBT) device can include an active region, an inactive region and a trench extending along a longitudinal axis in the active region. The IGBT can also include a first mesa defining a first sidewall of the trench and in parallel with the trench and a second mesa defining a second sidewall of the trench and in parallel with the trench. At least a portion of the first mesa can include an active segment of the IGBT device, and at least a portion of the second mesa can include an inactive segment of the IGBT device.

18 Claims, 39 Drawing Sheets

(51) Int. Cl.
  H01L 29/66 (2006.01)
  H01L 29/423 (2006.01)
  H01L 29/08 (2006.01)
  H01L 29/40 (2006.01)
(52) U.S. Cl.
  CPC ...... H01L 29/0661 (2013.01); H01L 29/0696 (2013.01); H01L 29/083 (2013.01); H01L 29/401 (2013.01); H01L 29/407 (2013.01); H01L 29/4236 (2013.01); H01L 29/4238 (2013.01); H01L 29/42376 (2013.01); H01L 29/66348 (2013.01)
(58) Field of Classification Search
  CPC ........... H01L 29/0696; H01L 29/66734; H01L 29/7811; H01L 29/0623; H01L 29/0619; H01L 29/407
  See application file for complete search history.

(56) References Cited

U.S. PATENT DOCUMENTS

| | | | | |
|---|---|---|---|---|
| 6,833,584 | B2* | 12/2004 | Henninger | H01L 29/42368 257/334 |
| 2005/0269633 | A1* | 12/2005 | Singh | H01L 29/7825 257/336 |
| 2006/0006458 | A1* | 1/2006 | Motai | H01L 29/0634 257/330 |
| 2006/0216896 | A1* | 9/2006 | Saito | H01L 29/0634 438/270 |
| 2006/0231917 | A1* | 10/2006 | Ono | H01L 29/0634 257/500 |
| 2009/0079002 | A1* | 3/2009 | Lee | H01L 29/0634 257/355 |
| 2010/0314659 | A1* | 12/2010 | Yilmaz | H01L 21/26586 257/139 |
| 2011/0018055 | A1* | 1/2011 | Ohta | H01L 29/0634 257/329 |
| 2012/0193748 | A1* | 8/2012 | Yedinak | H01L 29/0692 257/488 |
| 2012/0273884 | A1* | 11/2012 | Yedinak | H01L 29/0634 257/341 |
| 2015/0279985 | A1* | 10/2015 | Philippou | H01L 29/1095 257/334 |
| 2015/0325641 | A1* | 11/2015 | Hirler | H01L 29/063 257/330 |
| 2018/0286971 | A1* | 10/2018 | Philippou | H01L 29/7393 |

OTHER PUBLICATIONS

M. Momose et al., "A 600V Super Low Loss IGBT with Advanced Micro-P Structure for the next Generation IPM," Proceedings of the 22nd International Symposium on Power Semiconductor Devices & ICs, Hiroshima, Jan. 2010.

Masakiyo Sumitomo et al., "Low loss IGBT with Partially Narrow Mesa Structure (PNM-IGBT)," Proceedings of the 2012 24th International Symposium on Power Semiconductor Devices and ICs, Jun. 3-7, 2012—Bruges, Belgium.

M. Shiraishi et al., "Side Gate HiGT with Low dv/dt Noise and Low Loss," Proceedings of the 2016 28th International Symposium on Power Semiconductor Devices qnd ICs (ISPSD), Jun. 12-16, 2016, Prague, Czech Republic.

M. Sawada et al., "Trench Shielded Gate Concept for Improved Switching Performance with the Low Miller Capacitance," Proceedings of the 2016 28th International Symposium on Power Semiconductor Devices and ICs (ISPSD), Jun. 12-16, 2016, Prague, Czech Republic.

T. Arai et al., "The Advanced Trench HiGT with Separate Floating p-Layer for Easy Controllability and Robustness," PCIM Europe, pp. 313-319, 2011.

John Shen, "The Past, Present, and Future of IGBT Technology," Illinois Institute of Technology, pp. 1-27, Apr. 7, 2014.

Meng-Chia Lee, "Accumulation Enhanced Insulated Gate Bipolar Transistor (AEGT) an Methods of Use Thereof," U.S. Appl. No. 15/792,283, filed Oct. 24, 2017.

* cited by examiner

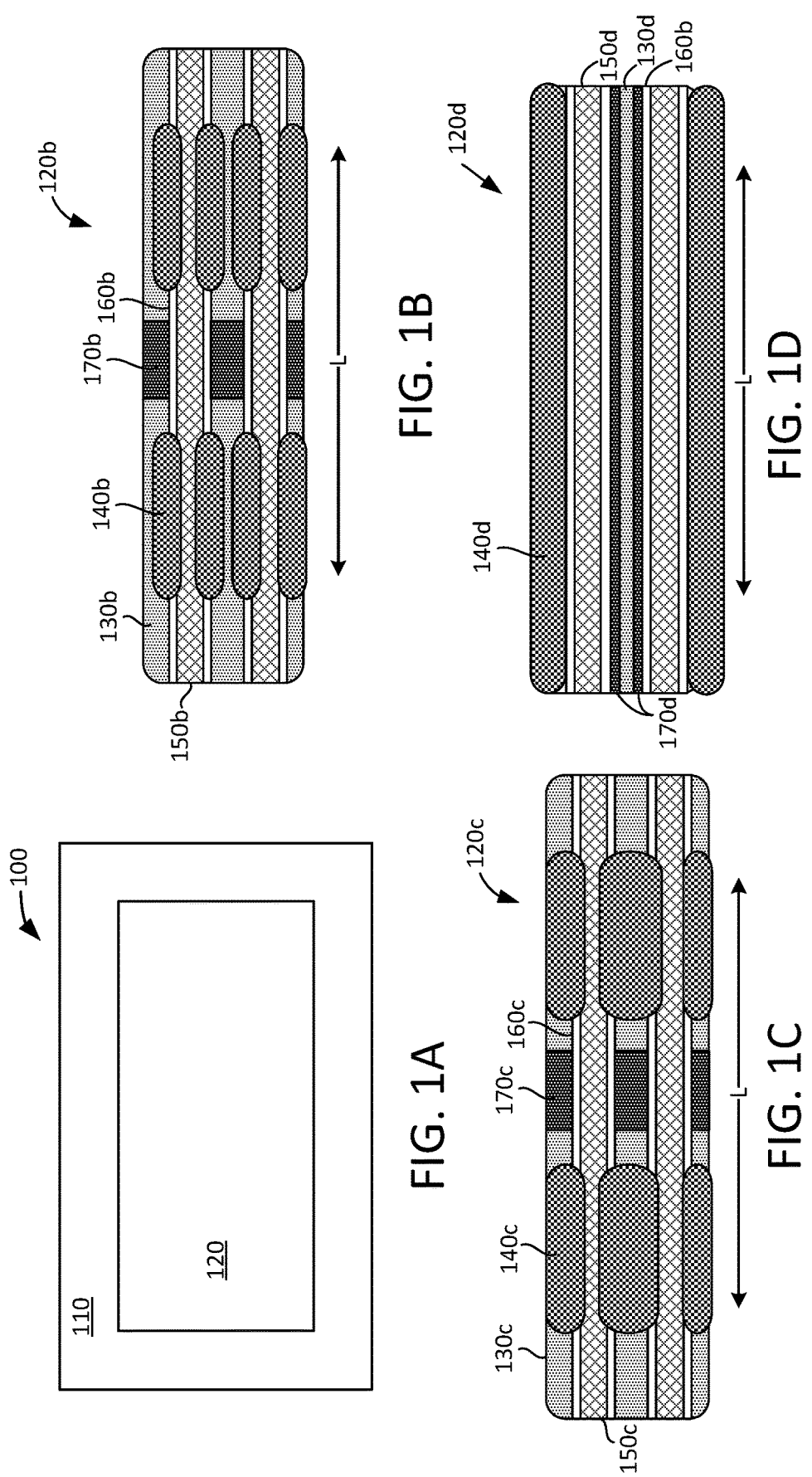

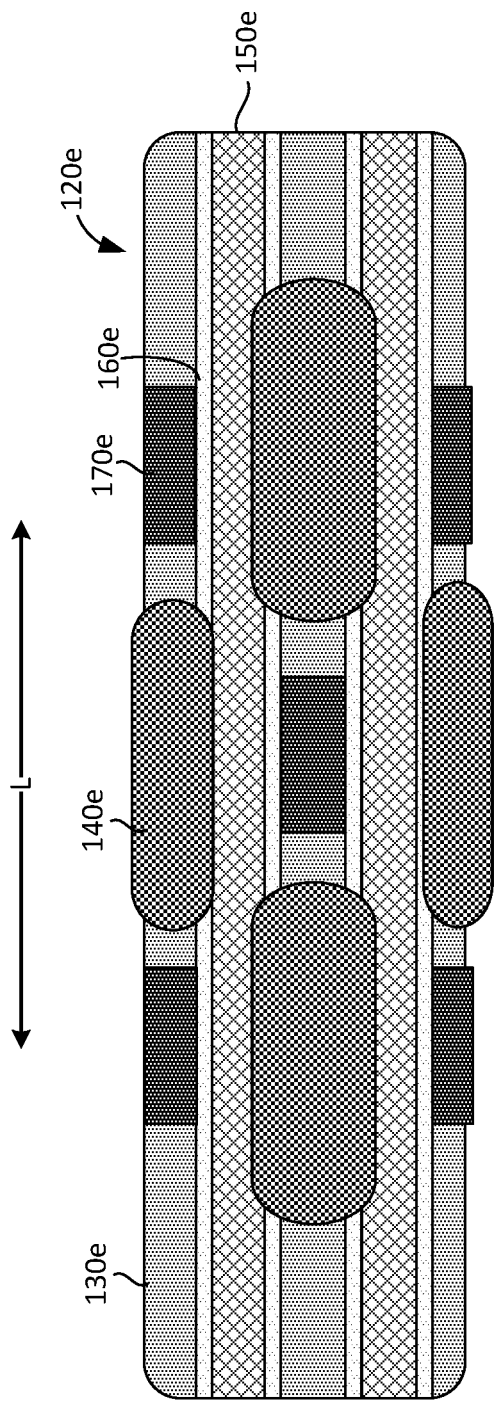
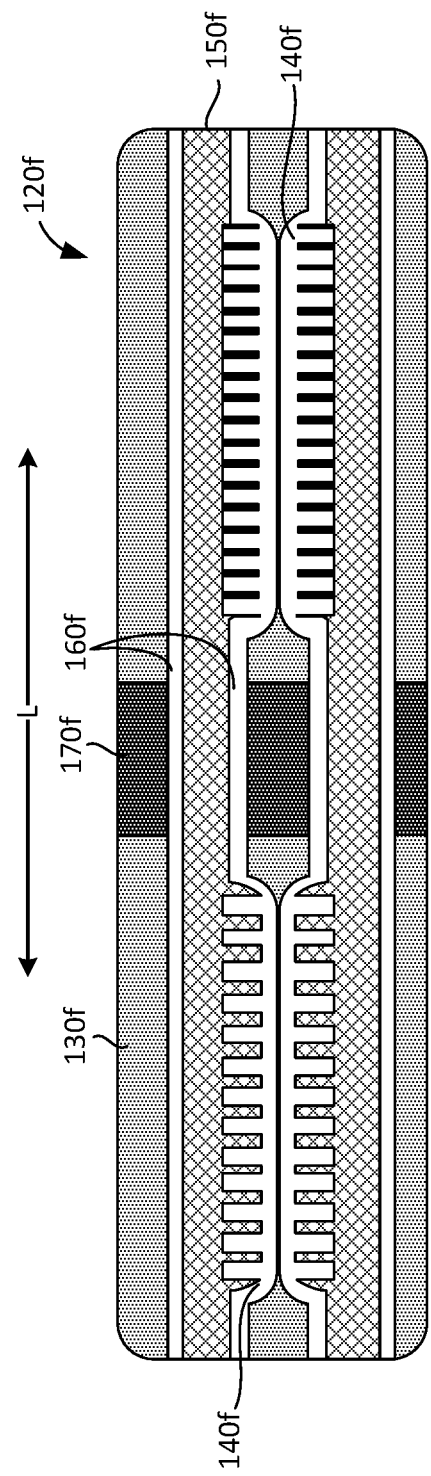
FIG. 1E
FIG. 1F

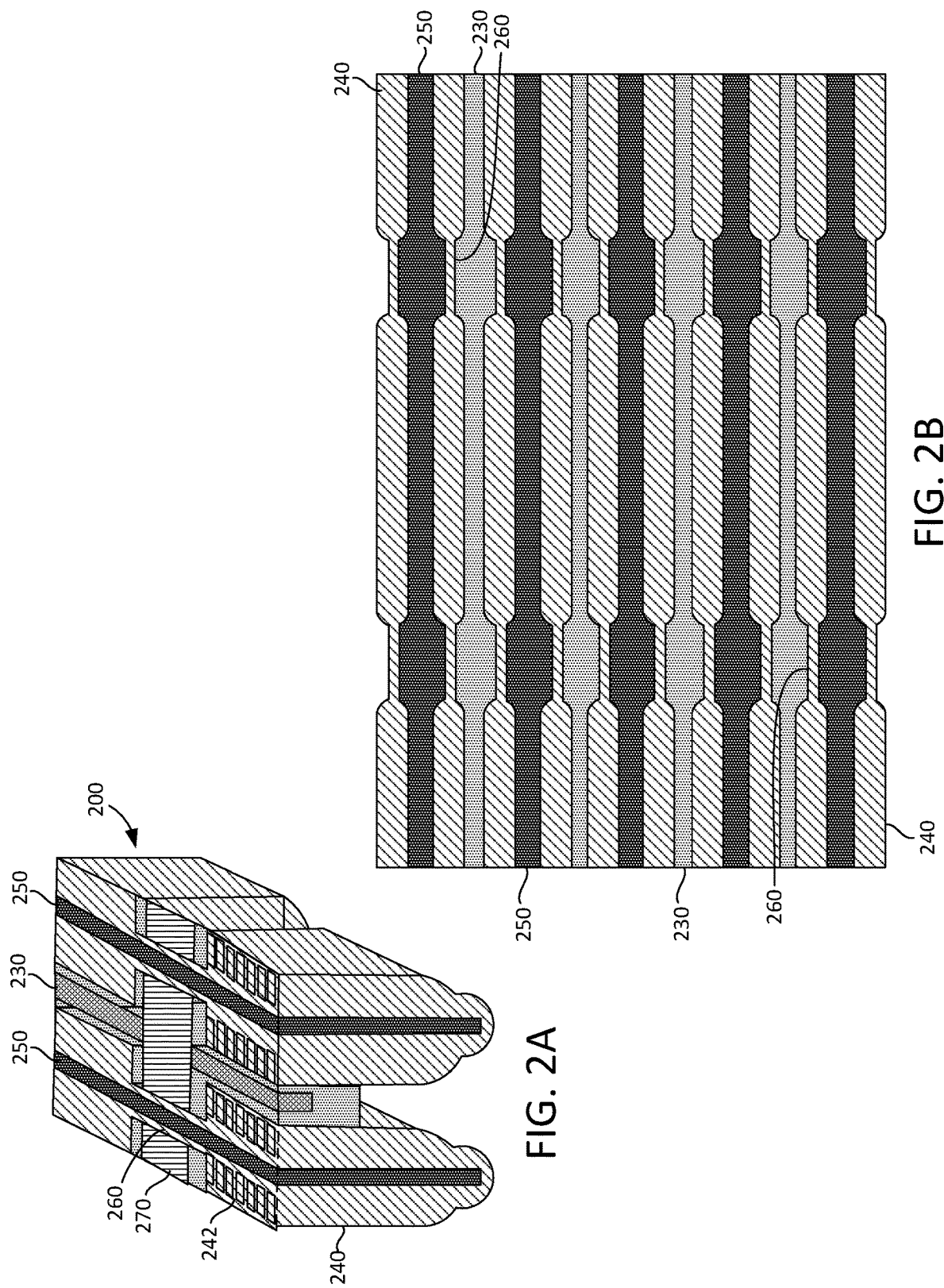

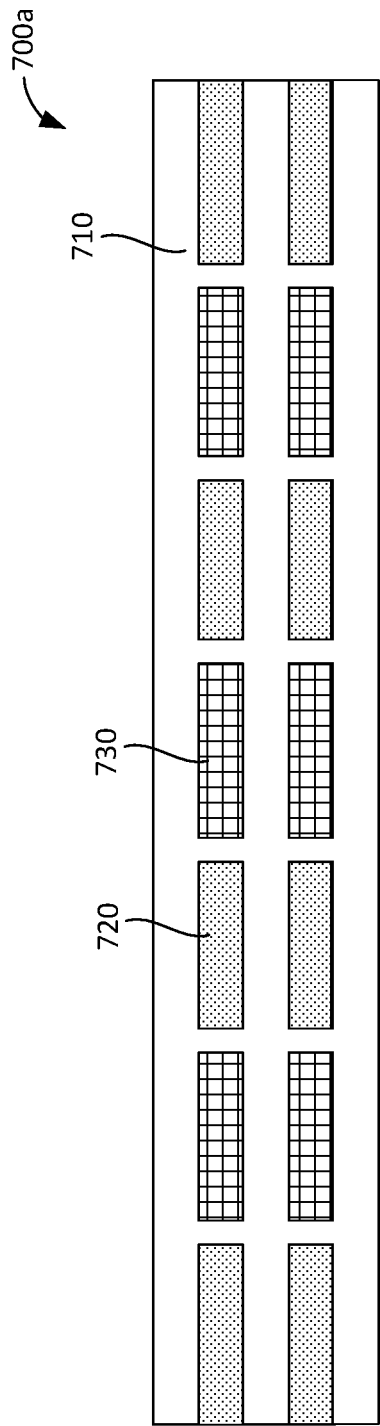
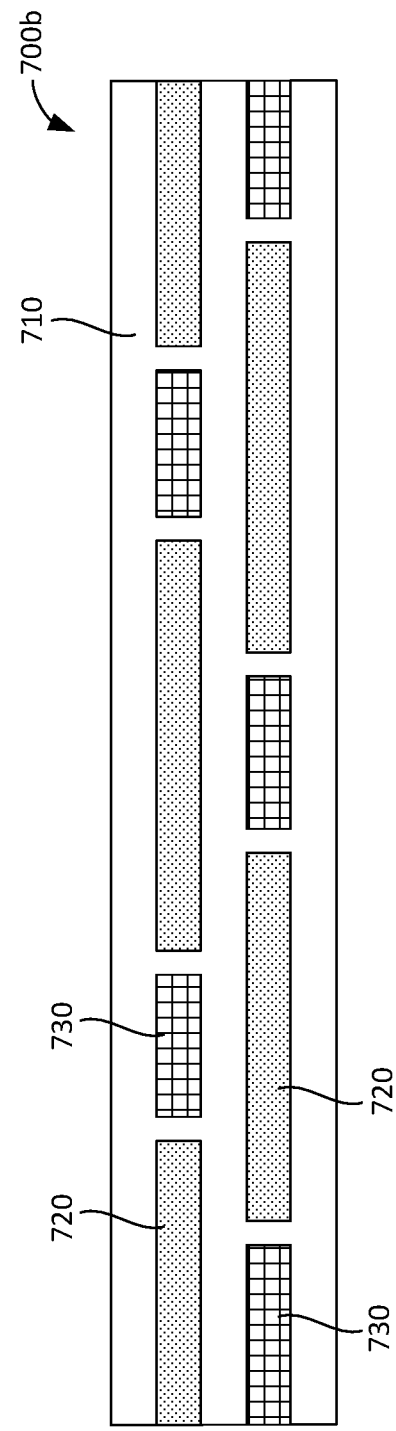

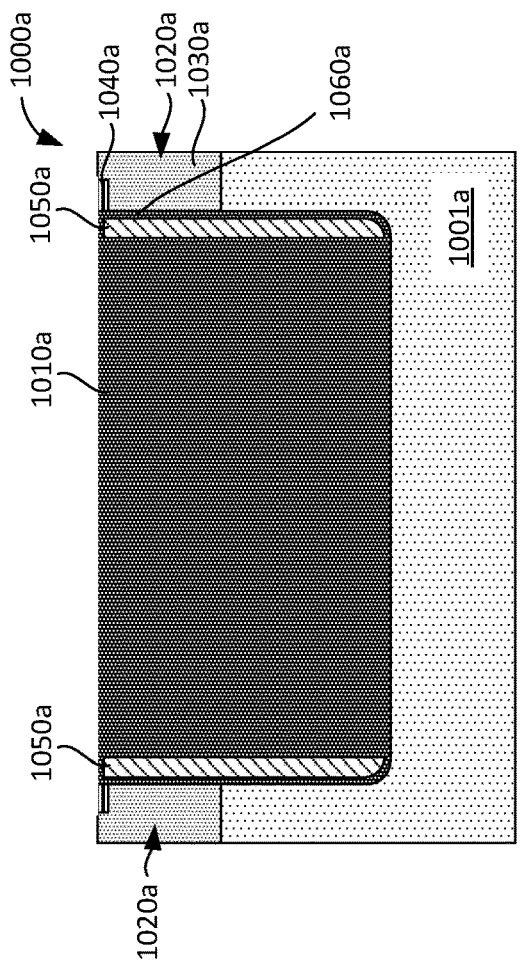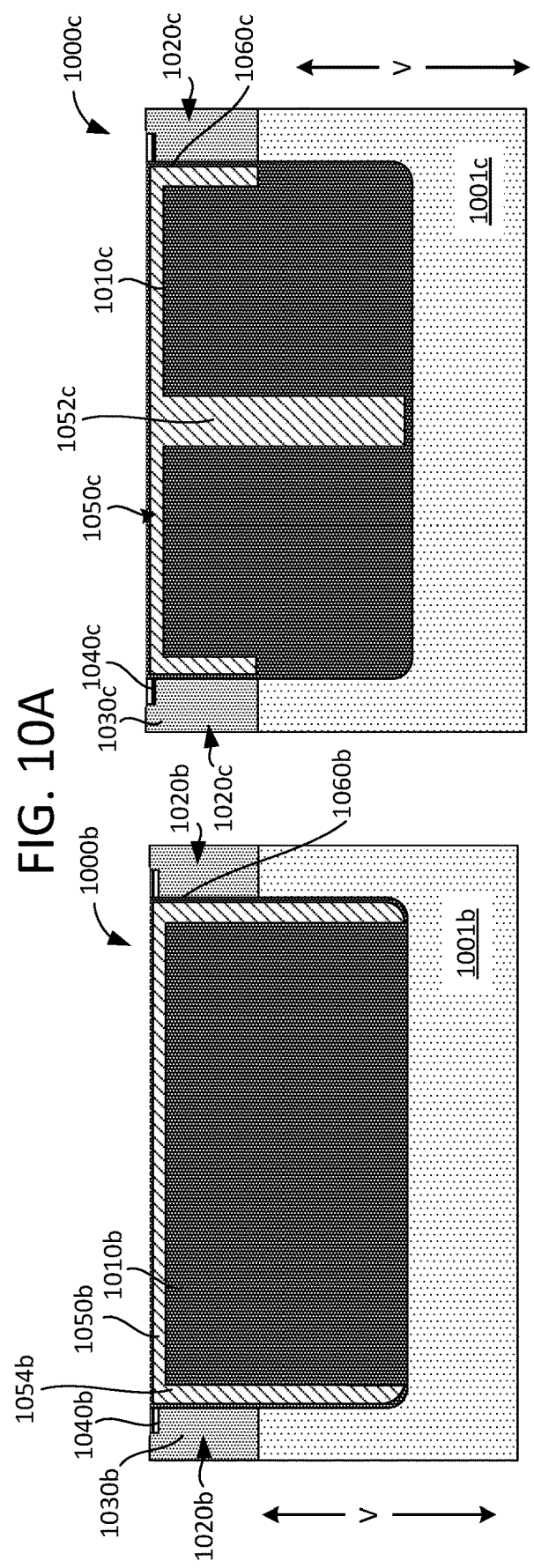
FIG. 10A
FIG. 10B
FIG. 10C

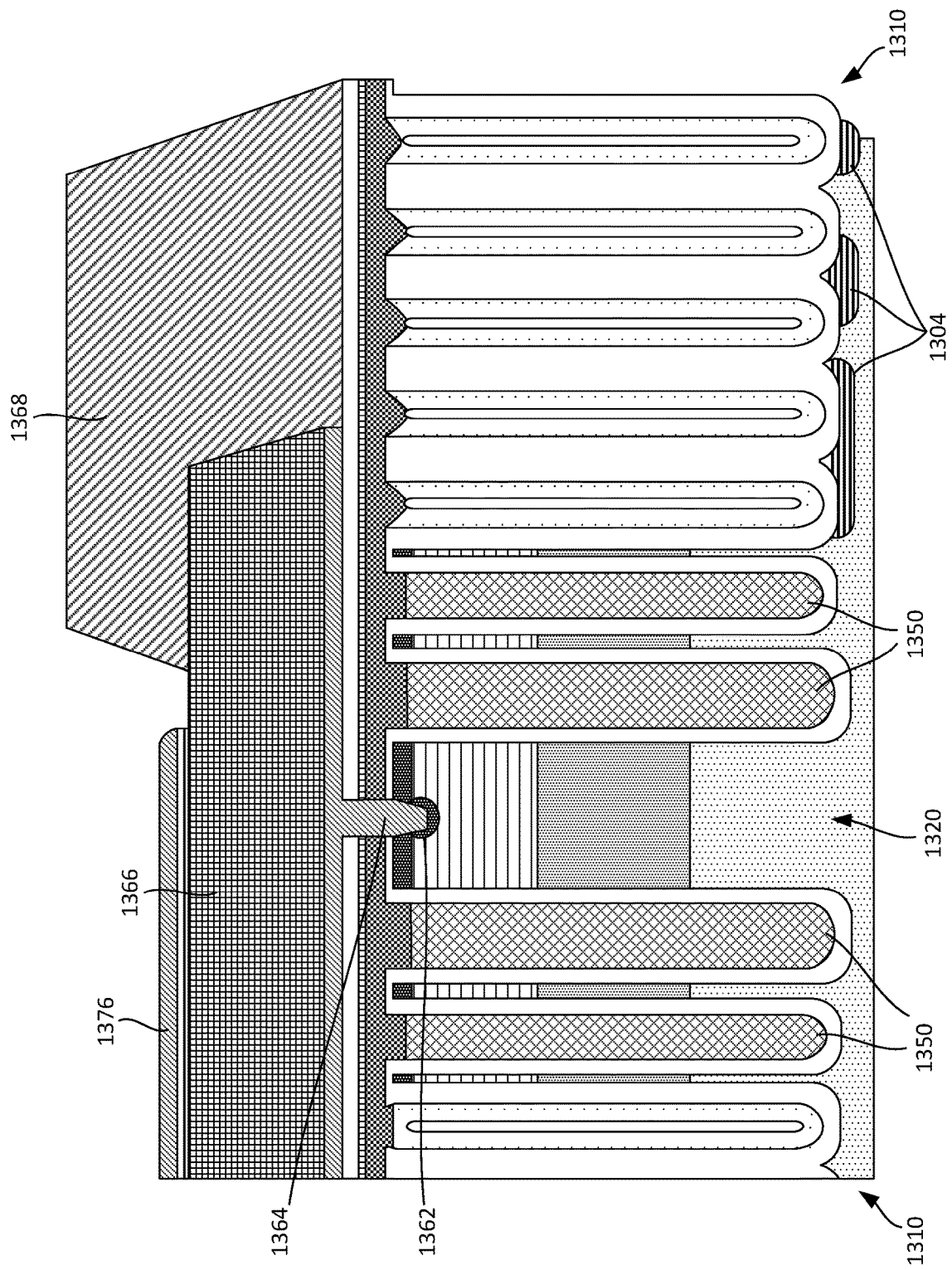

TRENCH-GATE INSULATED-GATE BIPOLAR TRANSISTORS (IGBTS)

CROSS REFERENCE TO RELATED APPLICATIONS

This application claims priority to and the benefit of U.S. Provisional Application No. 62/548,361, filed Aug. 21, 2017, entitled "SILICON IGBT TECHNOLOGIES OUTLOOK FOR ACHIEVING ROBUSTNESS AND HIGH EFFICIENCY IN ELECTRIC VEHICLE APPLICATION DEVICE AND CIRCUIT IMPROVEMENTS", which is hereby incorporated by reference in its entirety. This application is also related to co-pending patent application Ser. No. 15/884,779, filed on a date even with the present application and entitled "TRENCH-GATE INSULATED-GATE BIPOLAR TRANSISTORS (IGBTs) AND METHODS OF MANUFACTURE", which is also hereby incorporated by reference in its entirety.

TECHNICAL FIELD

This description relates to insulated-gate bipolar transistor (IGBT) devices and associated methods of producing such IGBT devices.

BACKGROUND

Insulated-gate bipolar transistor (IGBT) devices are commonly used in a number of high voltage applications, such as, e.g., power factor correction (PFC) and automotive ignition systems, motor drives, etc. Is some applications, such as motor drives, it may be desirable that an IGBT device is able to meet a short circuit withstand requirement. That is, such an IGBT should be able to withstand a short circuit current (e.g., between its emitter and collector terminals) for a specific (short) period of time without damaging the device. In other applications, such as power factor correction, it may be desirable that an IGBT device have low input capacitance (e.g. Miller capacitance) and fast switching times. In current IGBT implementations, increasing short circuit capability (short circuit withstand time, etc.) can result in undesirable increases in collector-to-emitter voltage when the device is in conduction (Vce,sat), and can have high input capacitance that can increase device switching times. Conversely in current IGBT implementations, improving switching times and/or reducing Vce,sat can have an adverse impact on short circuit withstand capability.

SUMMARY

In a general aspect, an insulated gate bipolar transistor (IGBT) device can include an active region, an inactive region and a trench extending along a longitudinal axis in the active region. The IGBT device can also include a first mesa defining (extending adjacent to, etc.) a first sidewall of the trench and in parallel with the trench and a second mesa defining (extending adjacent to, etc.) a second sidewall of the trench and in parallel with the trench. At least a portion of the first mesa can include an active segment of the IGBT device, and at least a portion of the second mesa can include an inactive segment of the IGBT device.

In another general aspect, an insulated-gate bipolar (IGBT) device can include an active region, an inactive region and a trench extending along a longitudinal axis in the active region. The IGBT can also include first mesa defining (extending adjacent to, etc.) a first sidewall of the trench and in parallel with the trench and a second mesa defining (extending adjacent to, etc.) a second sidewall of the trench and in parallel with the trench. A first active segment of the IGBT device can be included in a first portion of the first mesa and a first inactive segment of the IGBT device can be included in a second portion of the first mesa. A second active segment of the IGBT device can be included in a first portion of the second mesa and a second inactive segment of the IGBT device included in a second portion of the second mesa.

In another general aspect, an insulated-gate bipolar device (IGBT) can include an active region, an inactive region and a trench extending along a longitudinal axis in the active region. A first inhomogeneous mesa can define (extend adjacent, etc.) to a first sidewall of the trench and in parallel with the trench. A second inhomogeneous mesa can define (extend adjacent to, etc.) a second sidewall of the trench and in parallel with the trench.

BRIEF DESCRIPTION OF THE DRAWINGS

FIGS. 1A-1F are diagrams that schematically illustrate various trench-gate insulated-gate bipolar transistor (IGBT) devices.

FIG. 2A is an isometric diagram that illustrates a portion of a trench-gate IGBT device with active and inactive gate segments.

FIG. 2B is a diagram that illustrates a plan view of a portion of a trench-gate IGBT device corresponding with FIG. 2A.

FIGS. 7A and 7B are diagrams that schematically illustrate portions of trench-gate IGBT devices that can include one or more oxide-filled mesa segments.

FIGS. 10A-10C are cross-sectional diagrams that illustrate schematically active mesas and associated dielectric isolation and termination, which can be included in a trench gate-IGBT device, such as the trench-gate IGBT device of FIG. 9.

FIGS. 13A-13J are diagrams (cross-sectional and plan views) that illustrate a semiconductor manufacturing process for producing IGBT devices, such as the IGBT devices of FIGS. 9, 10A-10C and 12A-12C.

Figure 3A:
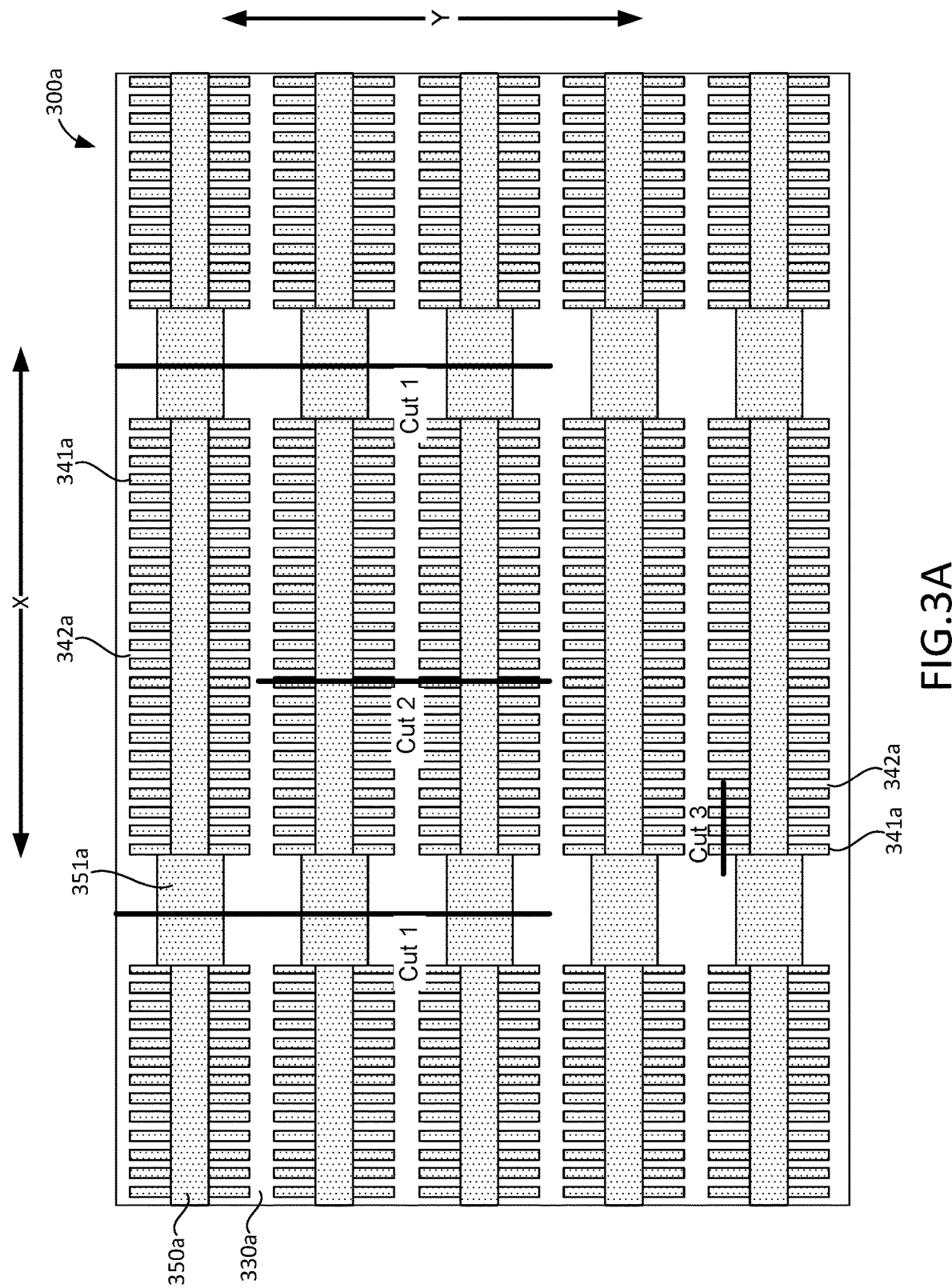
FIG. 3A is a diagram that illustrates a plan view of a masking layout for defining trenches in a trench-gate IGBT device, such as the trench-gate IGBT device of FIGS. 2A and 2B.

Like reference symbols in the various drawings indicate like and/or similar elements. Elements shown in the various drawings are shown by way of illustration and may not necessarily be to scale. Further, scales of the various drawings may differ from one to another depending, at least in part, on the particular view being shown.

The reference characters in the various drawings are provided for purposes of illustration and discussion. Reference characters for like elements may not be repeated for similar elements in the same view. Also, reference characters shown in one view for a given element may be omitted for that element in related views. Also, reference characters for a given element that is shown in different views may not necessarily be discussed with respect to each of those views.

DETAILED DESCRIPTION

Insulated-gate bipolar transistor (IGBT) devices, IGBTs, are used in a number of commercial and industrial applications. For example, IGBTs are used in automotive, telecommunication and power factor correction (PFC) implementations, as some examples. The particular device performance parameters for a given IGBT application can vary. However, in general, faster switching IGBTs with short circuit robustness (e.g., specific short circuit withstand times) and low input (Miller) capacitance are desirable. In general, device performance improvements can be achieved by reducing collector-to-emitter saturation voltage (Vce,sat); turn-off energy (e.g., switching) loss (Eoff); reducing an emitter implant fraction (e.g., a fraction of n+ active emitter area to overall die area, which can reduce saturation current and improve short circuit withstand time), etc. However, improving one device parameter can adversely affect another parameter, resulting in design trade-off decisions when improving one aspect of device performance is at the expense degrading another aspect of device performance.

Current approaches for improving IGBT performance parameters are generally directed at modifying a design of a given IGBT based on a two-dimensional cross section of an IGBT gate trench, where that gate trench is homogenous in structure along its length. As one example, improvement of IGBT device performance can be achieved by increasing front-side carrier injection efficiency. However, the traditional approach of improving front-side ejection efficiency by shrinking widths of active semiconductor mesas (e.g., a width of active emitter/source semiconductor mesas from one gate trench to an adjacent, or neighboring gate trench) to improve front-side injection has limited efficiency, and can affect other device performance parameters, such as switching times and/or on resistance. Further, current approaches for controlling front-side injection also rely on a partial gate fraction of active trench length to achieve short-circuit robustness (e.g., by masking out a source implant). Such techniques are reaching their limit of saturation performance (e.g., collector to emitter voltage and saturation current) without adequately addressing short-circuit withstand time considerations.

The approaches described herein can improve short circuit withstand times by defining active and inactive trench segments and/or increasing pitch (distance) between active gate segments, which can reducing effective mesa widths due to the three-dimensional structure of such an IGBT. For instance, while current approaches can achieve emitter fractions on the order of ⅛ with acceptable Vce,sat and switching times, using the approaches describe herein, IGBT devices with emitter fractions on the order 1/16 or less can be achieved with significantly impacting other IGBT performance parameters.

In the approaches described herein, inactive trench segments can be defined by increasing dielectric thickness on segments of an IGBT gate, replacing segments of a semiconductor mesa with a dielectric, and/or isolating active mesas (segments) of an IGBT from other active mesas with a dielectric isolation and termination to increase pitch between active IGBT trench gate segments.

These approaches can be used to achieve desired improvements in IGBT operation by using three dimensional IGBT device configurations to define such active and inactive segments. Such configurations can improve IGBT performance by, for instance, achieving desired short circuit withstand times without significantly impacting other device performance parameters, such as collector to emitter saturation current (Ice,sat), collector to emitter saturation voltage (Vce,sat), etc. For example, in the approaches described herein, the entire length of an IGBT gate trench may be inhomogeneous in its structure, either along a length of the gate trench and/or on opposing sides of the gate trench. Also, by incorporating P-shield (e.g., boron) implants (such as those illustrated in the process of FIGS. 13A-13P) a desired breakdown (blocking) voltage of an IGBT device can be maintained (achieved) even with relatively narrow passive trench dimensions (e.g., where carrier accumulation can occur). While not specifically illustrated for each of the various IGBT implementations described, such shield (blocking) implants can also be included in those implementations.

Using such three dimensional approaches for designing IGBTs, where active and inactive gate segments are defined, can allow for flexible design refinement and control, while limiting negative design trade-offs. Briefly, such approaches can include defining active and inactive segments along an IGBT gate trench, where the inactive segments can be defined by forming a thick dielectric (e.g., oxide) on or adjacent to a sidewall of the gate trench (effectively narrowing, or effectively removing an associated portion of semiconductor mesa), or by physically removing (e.g., etching) at least a portion of a semiconductor mesa and replacing the removed portion with a dielectric (e.g., a thermal oxide, a deposited dielectric and/or an air gap). Such approaches can also include defining active and inactive IGBT segments by increasing gate pitch between active gate segments, where the active gate segments are isolated from each other using dielectric isolation. In such approaches, the dielectric isolation between active gate segments (e.g., active mesas) can also act as termination for the associated IGBT, eliminating the need for implanted termination structures.

Using the approaches illustrated and described herein, IGBTs with the following beneficial aspects and/or features can be designed and produced. First, IGBTs can be designed (and produced), where front side injection (e.g., excess carrier injection) is adjustable. Second, gate capacitance of IGBTs, such as those described herein, can be reduced as compared to current trench gate IGBTs, such that the active mesa width (emitter) can be increased without significant performance penalty, which can result in IGBT devices with improved latch-up immunity. IGBTs with short circuit capability can be designed and produced using the disclosed approaches by omitting heavily doped source implants (e.g., n-source implants) in the inactive segments, e.g., where trench oxide is thicker, or interrupts an active mesa (e.g., as a result of oxidation of trench sidewall features, removal and replacement of semiconductor mesa material with a dielectric, and/or isolation of one active IGBT gate trench from another active IGBT gate trench with dielectric isolation and termination). For instance, a source implant can be omitted in active areas (e.g., inactive segments) of the IGBT by a photolithography masking operation, or by self-alignment, where the implant is blocked by a dielectric used to define the inactive segments, or by a dielectric used for isolation and termination of active IGBT segments.

For instance, omitting the heavily doped source implant from inactive segments of the IGBT (e.g., where the dielectric is thicker or has been used to replace (part or all) of a semiconductor mesa) can reduce gate charge of the IGBT (e.g., in the inactive segments, where there is no need to form a conduction channel). In the approaches disclosed herein in which gate pitch is increased using dielectric termination and isolation, such as in the approaches illustrated in FIGS. 10A-10C for example, the active area around active gate segments is reduced, which also reduces the saturation current of the IGBT, enhances the injection efficiency and, accordingly, reduces Vce,sat.

In the various drawings, certain features of IGBT devices may be shown for purposes of discussion and illustration. In implementations, additional elements may be included in such IGBT devices, such as additional implants, metal interconnect layers, passivation, packaging, etc. For purposes of clarity and illustration, such elements are not shown, so as not to obscure the specific aspects of the IGBT devices being discussed and illustrated.

FIGS. 1A-1F are diagrams that schematically illustrate various trench-gate insulated-gate bipolar transistor (IGBT) device or IGBT implementations. The views shown in FIGS. 1A-1F are illustrated as plan (e.g., top-down) views of various IGBTs (or portions of IGBTs) that can be implemented in a semiconductor substrate, such as in a silicon substrate, a silicon-carbide substrate, etc.

FIG. 1A is a diagram that schematically illustrates an implementation of an IGBT 100. As shown in FIG. 1A, the IGBT 100 includes a termination region 110 and an active region 120. As described herein, the active region 120 can include active and inactive IGBT segments of the IGBT 100. Also, while the termination region 110 of the IGBT 100 in FIG. 1A is shown as fully surrounding the active region 120, in some implementations, the termination region 100 may partially surround the active region 120. In other implementations, the termination region 110 can be implemented using multiple, non-contiguous termination regions that are disposed around the active region 120.

FIG. 1B is a diagram that schematically illustrates an implementation of an active region 120b that can be implemented in an IGBT, such as the IGBT 100 of FIG. 1A. The active region 120b of FIG. 1B (which may illustrate only a portion of the active region 120 of the IGBT 100) includes semiconductor mesas 130b, which can operate as emitter mesas, in this example. The active region 120b also includes dielectric portions 140b, which can include oxide, air gaps, polysilicon, and/or other appropriate materials. The dielectric portions 140b can define inactive segments of an IGBT including the active region 120b. As described herein, in some implementations, the dielectric portions 140b of the active region 120b can be formed by oxidizing features (semiconductor features) defined on a sidewall of a trench of the IGBT (e.g., such as those illustrated in FIG. 3A).

The active region 120b can also include conductive trench electrodes 150b, which can be doped polysilicon electrodes disposed in respective trenches, where the trenches are formed by an etch process. The trenches of the electrodes 150b can extend along a longitudinal axis L. For purposes illustration, the longitudinal axis L is shown in each of FIGS. 1B-1F. While not explicitly shown in other drawings, trenches in those drawings can still be described as extending along a longitudinal axis, such as the axis L. The trench electrodes 150b, depending on the implementation, can be gate electrodes, emitter electrodes, or a combination of gate and emitter electrodes. The trenches in which the electrodes 150b are disposed can be lined with a gate dielectric 160b, such as silicon dioxide. In some implementations, the gate dielectric 160b can be included in the dielectric portions 140b of the active portion 120b.

As shown in FIG. 1B, the active region 120b can also include heavily doped source implants 170b, which can define the active IGBT segments of the active region 120b. In some implementations, the source implants 170b can extend between dielectric portions 140b. Further, additional source implants 170b could be included in the mesas 130b outside the inactive IGBT segments defined by the dielectric portions 140b. The specific arrangement of the various elements of the active region 120b will depend on the particular IGBT implementation.

FIG. 1C is a diagram that schematically illustrates an implementation of a portion of an active region (active region) 120c that can be implemented in an IGBT, such as the IGBT 100 of FIG. 1A. The active region 120c of FIG. 1C (which may illustrate only a portion of the active region 120 of the IGBT 100) includes semiconductor mesas 130c, which can operate as emitter mesas, in this example. The active region 120c also includes dielectric portions 140c. The dielectric portions 140c, which interrupt the mesas 130c, can define inactive segments of an IGBT that includes the active region 120c. As described herein, the dielectric portions 140c can be formed by oxidizing features (semiconductor features) defined on a sidewall of a trench of the IGBT (e.g., such as those illustrated in FIG. 3B), or can be formed by physically removing semiconductor material of the mesas 130 and replacing that removed semiconductor material with one or more dielectric materials (e.g., a thermally grown dielectric and/or a deposited dielectric) to create oxide-filled mesas, or oxide-filled mesa segments. In some implementations, the dielectric portions 140c can also include an air gap (e.g., an enclosed air gap), polysilicon (e.g., undoped polysilicon), and/or any number of other appropriate materials.

The active region 120c can also include conductive trench electrodes 150c, which can be doped polysilicon electrodes disposed in respective trenches, where the trenches are formed by an etch process. As with the electrodes 150b of the active region 120b, the trench electrodes 150c of the active region 120c, depending on the particular implementation, can be gate electrodes, emitter electrodes, or a combination of gate and emitter electrodes. The trenches in which the electrodes 150c are disposed can be lined with a gate dielectric 160c, such as silicon dioxide. In some implementations, the gate dielectric 160c can be included in the dielectric portions 140c of the active portion 120c.

As shown in FIG. 1C, the active region 120c can also include heavily doped source implants 170c, which can define the active IGBT segments of the active region 120c.

In some implementations, the source implants 170c can extend between the dielectric portions 140c. Further, additional source implants 170c can be included in the mesas 130c outside the inactive segments defined by the dielectric portions 140c interrupting the semiconductor material of the mesas 130c. As with the active region 120b, the specific arrangement of the elements of the active region 120c will depend on the particular IGBT implementation.

FIG. 1D is a diagram that schematically illustrates an implementation of a portion of an active region 120d that can be implemented in an IGBT, such as the IGBT 100 of FIG. 1A. In some implementations, the active region 120d could also be implemented in the IGBT 900 of FIG. 9.

As shown in FIG. 1D, the active region 120d (which may illustrate only a portion of the active region 120 of the IGBT 100) includes a semiconductor mesa 130d, which can operate as an emitter mesa, in this example. The active region 120d also includes dielectric portions 140d that either replace semiconductor mesas or defining termination and isolation for active segments of an IGBT including the active region 120d. In other words, the dielectric portions 140d define inactive segments of an IGBT that includes the active region 120d. As described herein, the dielectric portions 140d can be formed by oxidizing features (semiconductor features) defined in a semiconductor substrate (e.g., such as those illustrated in FIGS. 11A-11C), or can be formed by physically removing semiconductor material, and replacing that removed semiconductor material with one or more dielectric materials (e.g., a thermally grown dielectric and/or a deposited dielectric). In some implementations, the dielectric portions 140d can also include an air gap (e.g., an enclosed air gap), polysilicon (e.g., undoped polysilicon), and/or any number of other appropriate materials.

The active region 120d can also include conductive trench electrodes 150d, which can be doped polysilicon electrodes disposed in respective trenches, where the trenches are formed by an etch process. The trench electrodes 150d of the active region 120d, depending on the particular implementation, can be gate electrodes, emitter electrodes, or a combination of gate and emitter electrodes. The trenches in which the electrodes 150d are disposed can be lined with a gate dielectric 160d, such as silicon dioxide. In some implementations, gate dielectric 160d can also be included in the dielectric portions 140d of the active portion 120d.

As shown in FIG. 1D, the active region 120d can also include heavily doped source implants 170d in the mesa 130d (e.g., along each of the gate dielectrics 160d), which can define the active IGBT segments of the active region 120d.

FIG. 1E is a diagram that schematically illustrates an implementation of a portion of an active region 120e that can be implemented in an IGBT, such as the IGBT 100 of FIG. 1A. The active region 120e includes elements that are similar to those shown in FIGS. 1B and 1C, but in a different of active and inactive IGBT segments. For instance, the active region 120e includes mesas 130e, dielectric portions 140e (e.g., defining inactive segments), conductive electrodes 150e, gate dielectric 160e and heavily doped source implants 170e (e.g., defining active segments). As with the active regions 120b and 120c, in some implementations, the source implants 170e can extend between dielectric portions 140e. Further, additional (or extended) source implants 170e can be included in the mesas 130e outside the inactive segments defined by the dielectric portions 140e that interrupt the semiconductor material of the mesas 130e. As with the active region 120e, the specific arrangement of the elements of the active region 120e will depend on the particular IGBT implementation.

FIG. 1F is a diagram that schematically illustrates an implementation of a portion of an active region (active region) 120f that can be implemented in an IGBT, such as the IGBT 100 of FIG. 1A. The active region 120f of FIG. 1F (which may illustrate only a portion of the active region 120 of the IGBT 100) includes semiconductor mesas 130f, which can operate as emitter mesas, in this example. The active region 120f also includes dielectric portions 140f, which can include oxide, air gaps and/or polysilicon (doped or undoped polysilicon). The dielectric portions 140f can define inactive segments of an IGBT including the active region 120f. As described herein, the dielectric portions 140f of the active region 120f can be formed by oxidizing features (semiconductor features) defined on a sidewall of a trench of the IGBT (e.g., such as those illustrated in FIG. 3A), defining air gaps and/or filling oxidized dielectric material with polysilicon.

The active region 120f can also include conductive trench electrodes 150f, which can be doped polysilicon electrodes disposed in respective trenches, where the trenches are formed by an etch process. The trench electrodes 150f, depending on the implementation, can be gate electrodes, emitter electrodes, or a combination of gate and emitter electrodes. The trenches in which the electrodes 150f are disposed can be lined with a gate dielectric 160f, such as silicon dioxide. In some implementations, the gate dielectric 160f can be included in the dielectric portions 140f of the active portion 120f.

As shown in FIG. 1F, the active region 120f can also include heavily doped source implants 170f, which can define the active IGBT segments of the active region 120f. In some implementations, the source implants 170f can extend between dielectric portions 140f. Further, additional (or extended) source implants 170f could be included in the mesas 130f outside the inactive segments defined by the dielectric portions 140f. The specific arrangement of the elements of the active region 120f will depend on the particular IGBT implementation.

FIG. 2A is an isometric diagram that illustrates a portion of a trench-gate IGBT 200 with active and inactive segments, such as discussed above with respect to FIG. 1B, for example. FIG. 2B is a diagram that illustrates a plan (top-down) view of a portion of a trench-gate IGBT device corresponding with the trench-gate IBGT 200 of FIG. 2A. As shown in FIGS. 2A and 2B, the IGBT 200 can include mesas 230, dielectric portions 240 (defining inactive segments of the IGBT 200), conductive electrodes 250 and gate dielectrics 260. In some implementations, the gate dielectrics 260 can also be included in the dielectric portions 240.

While not specifically shown in FIG. 2B, as illustrated in FIG. 2A, the IGBT 200 can also include a heavily doped source implant 270 (defining active segments of the IGBT 200). FIG. 2A also illustrates masking features 242, which are representative of photolithography masking features that can be used to define semiconductor structures, which can then be oxidized to define the dielectric portions 240. Examples of such masking features are shown in FIGS. 3A-3C, with an implementation of a manufacturing process that can be used to produce the IGBT 200 being illustrated in FIGS. 4A-4G.

In the IGBT 200, the mesas 230 can be emitter mesas (e.g., a combination of active and passive mesas). The mesas 230 can include a p-well and/or a heavily doped p-type implant (e.g., such as a heavy body implant). In implementations including passive mesas, the mesa 230 may omit (not include) the source implant 270 (e.g., can be a passive mesa). In certain implementations, such passive mesas can improve removal of excess carriers from inactive segments during turn off of the IGBT 200 and, accordingly, can improve IGBT turn-off speed. Also in FIG. 2A, the open areas of the IGBT 200 can be semiconductor substrate material, such as intrinsic semiconductor substrate material, doped semiconductor substrate material, an implanted junction field effect transistor (JFET) layer, a doped epitaxial layer, etc. The semiconductor substrate material is not shown in FIG. 2A, so not to obscure the elements of the IGBT 200.

Depending on the particular implementation, the width of the conductive electrode 250 can be constant (as shown in FIG. 2A) or can vary between the active segments and the inactive segments (as shown in FIG. 2B). Also, as shown in FIG. 2A, a central portion of the trench (e.g., the portion in which the conductive electrode 250 is formed) can be deeper than outer portions of the trench (e.g., the portions in which the dielectric portions 240 defining the inactive segments of the IGBT 200 are formed).

Figure 3B:
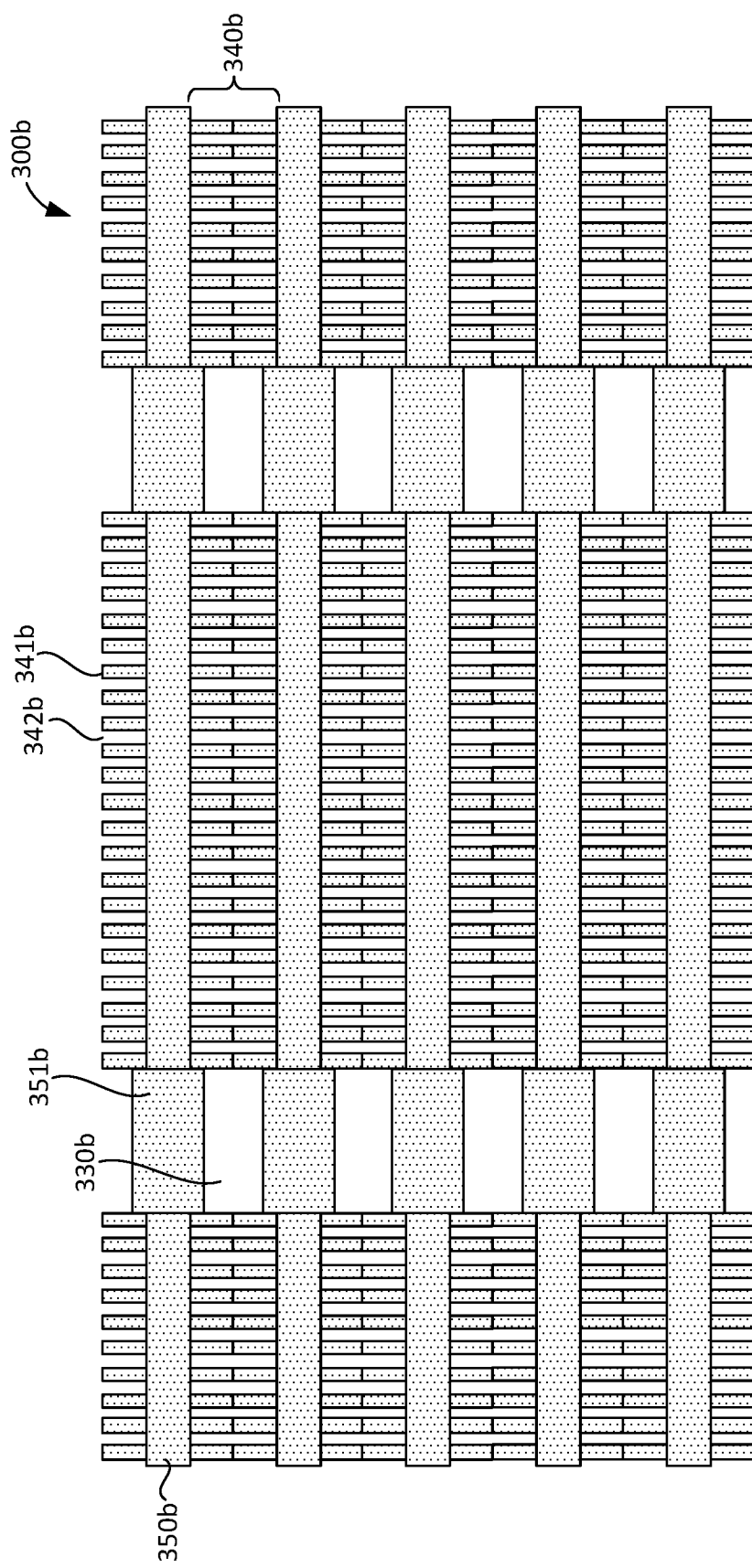
FIGS. 3B and 3C are diagrams that illustrate respective plan views of masking layouts for defining trenches in a trench-gate IGBT device that could be used in place of the masking layout of FIG. 3A.
Figure 3C:
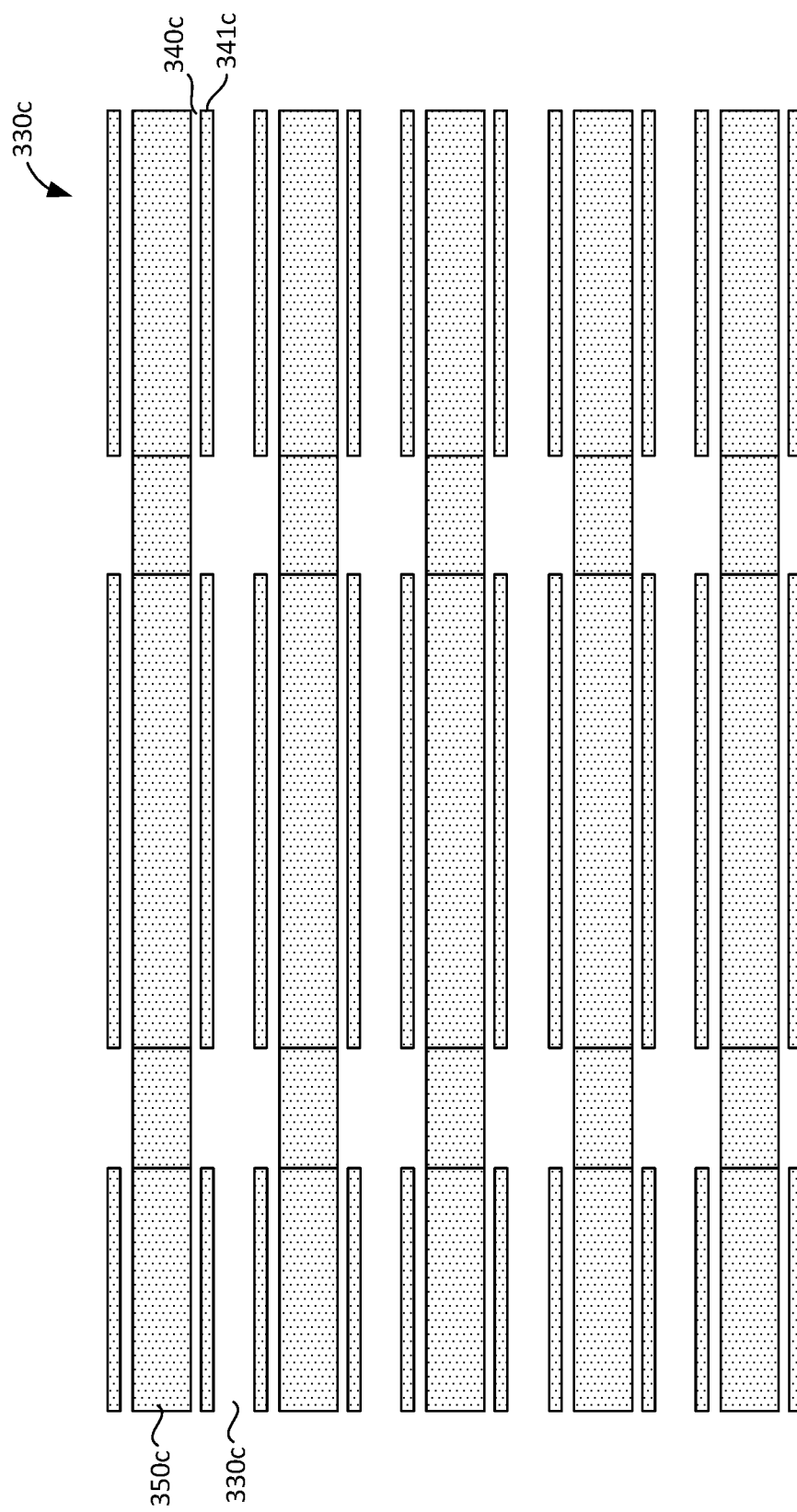

FIG. 3A is a diagram that illustrates a plan view of a masking layout 300a for defining trenches in a trench-gate IGBT device, such as the trench-gate IGBT device 200 of FIGS. 2A and 2B. In FIG. 3, the pattern shown for masking layout 300a represents a photolithography masking pattern that can be used to define areas of semiconductor material to be removed by a subsequent etch process. This etch process can be used to define trenches and, as a result, also define semiconductor material features (with semiconductor material not removed) that can be used define inactive and/or inactive segments of an IGBT.

Further, the masking layout 300a of FIG. 3A is shown with lines defining a Cut 1 (shown twice), a Cut 2 and a Cut 3. These cut lines correspond to associated cross sectional views in FIGS. 4B-4H, which illustrate a semiconductor manufacturing process that can be used to produce a trench-gate IGBT, such as the trench-gate IGBT 200 of FIGS. 2A and 2B. FIG. 3A also includes an axis X (which may correspond with the axis L in FIGS. 1B-1E) and an axis Y, which will be referenced with respect to example dimensions of the features defined by the masking layout 300a.

As shown in FIG. 3A, the masking layer 300a, by defining portions of semiconductor material to be removed, also defines portions of semiconductor material (e.g., mesas 330a) that are to remain once the trench features of the active and inactive segments are removed, such as by an anisotropic etch process. For instance, the masking layer 330a defines central trench portions 350a of the inactive segments of a corresponding IGBT, such as the deeper trench portions including the conductive electrodes 250 shown in FIG. 2A. The masking layer 300a also defines a comb-like structure including fingers 341a of semiconductor material that are to be removed by the trench etch, and fingers 342a of semiconductor material that are to remain after the trench etch. In implementations, the fingers 342a can be used (e.g., oxidized, filled, etc.) to form (define, etc.) dielectric portions (e.g., such as dielectric portions 240) that define inactive segments of an IGBT device, such as the IGBT device 200, for example.

The masking layer 300a can also define active segment trenches 351a, which can be lined with a gate dielectric and filled with conductive electrodes, such as gate electrodes and/or emitter electrodes, such as described herein. While the specific dimensions of the features defined by the masking layer 300a will depend on the particular implementation, the following are example dimensions for various features of the masking layout 300a. In implementations, the distance from Cut 1 to Cut 1 along the axis X can be in a range of 1-100 microns (µm), the length of each of the fingers 341a and 342a along the axis Y, depending on width of the mesas 330a in the inactive segments, can be in a range of 0.1-0.5 µm, and the width of each of the fingers 341a and 342a along the axis X can also be in a range of 0.1-0.5 µm. The width of the active segment mesa along the axis Y (e.g., between active segment trenches 351a) can be greater than or equal to 0.5 µm. The distances, sizes and spacings can be varied based on the specific implementation and the desired operating parameters of an associated trench gate IGBT.

In some implementations, in an IGBT device produced using the masking layer 300a (such as the IGBT device 200, the dielectric portions formed from the fingers 342a may not merge across the mesas 330a (e.g., may not contact a dielectric portion from an adjacent trench). In such implementations, the dielectric portions formed from the fingers 342a may not block hole current, and can, therefore achieve faster turn-off speed, even though an injection enhanced (IE) effect may not be as strong as in other implementations (e.g., using the masking layer 300b). For example, in implementations where the dielectric portions are not merged across mesa, a threshold voltage of will be higher in those regions (e.g., in the inactive segments), which can significantly reduce an associated saturation current in the inactive segments, and achieve better short circuit capability. Furthermore, while the inactive segments can have a high threshold voltage, those regions can still provide some inversion during conduction that can allow current to spread. Accordingly, trade-off among Vce,sat, Ice,sat and Eoff can be easily achieved for a given implementation.

FIGS. 3B and 3C are diagrams that illustrate respective plan views of masking layouts 300b and 300c for defining trenches in a trench-gate IGBT device. In certain implementations, the masking layouts 300b or 300c could be used in place of the masking layout 300a of FIG. 3A. As the masking layouts 300b and 300c are similar to that of the masking layout 300a, the details discussed above with respect to the masking layer 300a of FIG. 3A will not be repeated here.

As shown in FIG. 3B, the masking layout 300b defines semiconductor mesas 330b, which, in this implementation, are active mesas. That is, as can be seen in FIG. 3B, the lengths of the fingers 341a and 342a in the inactive segment area, e.g., in the area 340b between the central trench portions 350b, are such that the fingers 341b (removed semiconductor material) and 342b (remaining semiconductor material) abut one another. Such a structure, when the fingers 342a of remaining semiconductor material are oxidized, filled, etc. can result dielectric portions, such as the dielectric portions 140c in FIG. 1C, which interrupt the mesa 330b. That is, in such implementations, the semiconductor material of the mesas 330b is not continuous (e.g., from left to right in FIG. 3B) but is interrupted (intersected, etc.) by the dielectric portions formed from the fingers 342b. In such implementations, solid dielectric portions can be formed in the inactive segments of an associated IGBT. While, carriers stored (located, present, etc.) under such solid dielectric structures can reduce on resistance of a corresponding IGBT, but lateral conduction distance (under the dielectric structures) can increase turn-off speed (e.g., can increase turn-off loss Eoff).

As shown in FIG. 3C, the masking layout 300c defines mesas 330c, which, in this implementation, can include inactive segments where portions of semiconductor material 341c can be removed and corresponding portions of remaining semiconductor material 340c (e.g., after a trench etch) can be used (e.g., oxidized) to form dielectric portions that define the inactive segments of the mesas 330c. In such implementations, active segments of the mesa 330c can be disposed between the dielectric portions (formed from semiconductor portions 340c) that define the inactive IGBT segments, in similar manner as for the masking layout 300a.

FIGS. 4A-4G are cross-sectional diagrams that illustrate a semiconductor manufacturing process for producing a trench-gate IGBT 400 with trenches defined using the making layout 300a of FIG. 3A. For purposes of brevity and clarity, each processing step of the process flow shown in FIGS. 4A-4G is not specifically illustrated or described in detail in the following discussion. Accordingly, each drawing of FIGS. 4A-4G can be representative of multiple semiconductor processing operations. The specific semiconductor processing operations (and associated processing parameters) that are performed to produce an IGBT device, such as the IGBT device 400, will depend on the particular implementation, such as an IGBT device's desired operating parameters (e.g., short circuit withstand time, breakdown voltage, Vce,sat, input capacitance, etc.).

Further, in FIGS. 4B-4G, cross-sectional views corresponding with respective sectional views along each of the lines Cut 1, Cut2 and Cut 3 of FIG. 3A are shown to illustrate the structure of the IGBT 400, which may, in some implementations, correspond with the structure of the IGBT 200 of FIGS. 2A and 2B. The respective cut line corresponding with each of these sectional views is indicated in each of FIGS. 4B-4G.

Figure 4A:
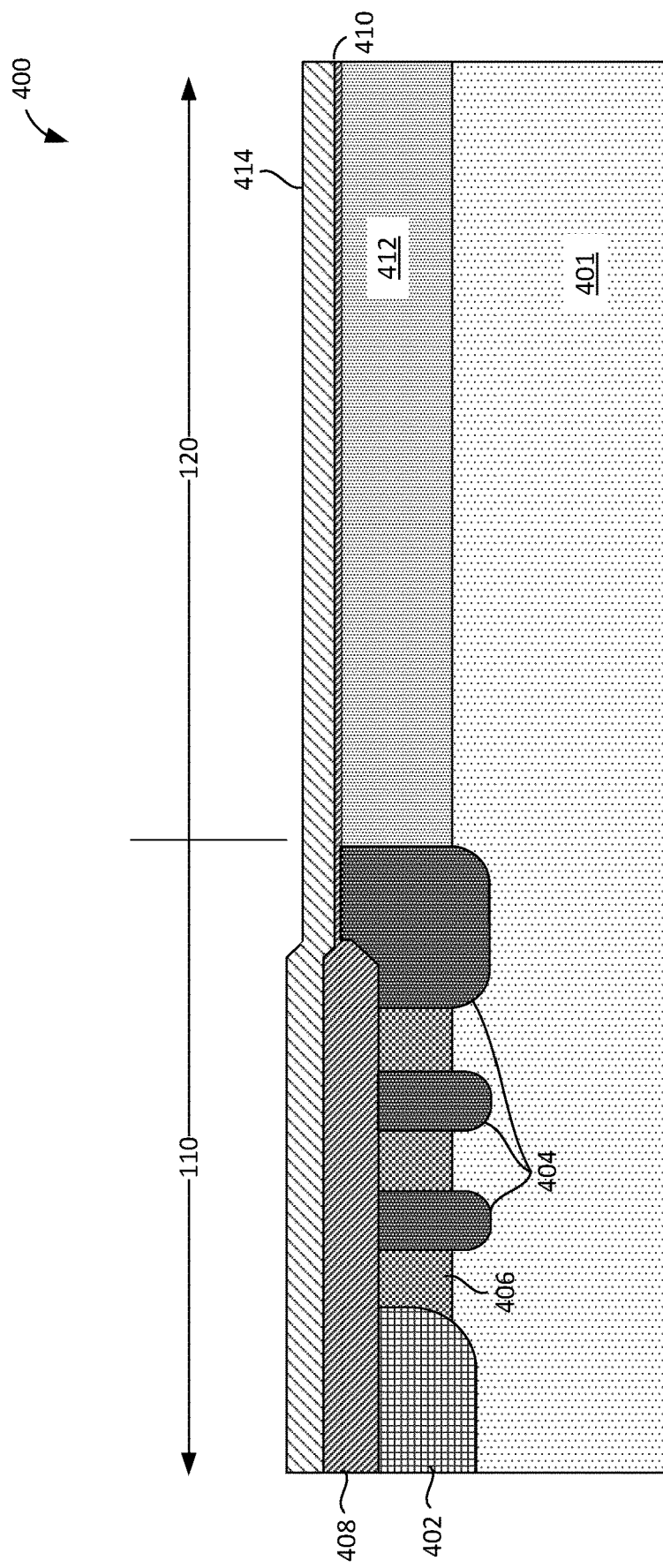
FIGS. 4A-4G are cross-sectional diagrams that illustrate a semiconductor manufacturing process for producing trench-gate IGBT devices with trenches defined using the making layout of FIG. 3A.

Referring to FIG. 4A, a semiconductor (e.g., n-type) substrate 401 can be used to produce the IGBT device 400. As with the IGBT 100 of FIG. 1A, the IGBT device 400 can include a termination region 110 and an active region 120. The termination region of the IGBT 400 is illustrated only in FIG. 4A, as FIGS. 4B-4G illustrate cross-sectional views of the active region 120 along the cut lines shown in FIG. 3A, as discussed above.

As shown in FIG. 4A, the termination region 110 of the IGBT 400 can include an N+ termination region 402 (e.g., arsenic and/or phosphorous doped), P+ termination rings 404 (e.g., boron doped) and an n-type enhancement layer 406 (which can have a higher n-type doping concentration than the substrate 401). The termination region 110 of the IGBT 400 can also include a local-oxidation of silicon (LOCOS) layer 408. In the active region 120 of the IGBT 400, as illustrated in FIG. 4A, an n-type JFET layer 412 can be formed in the substrate 401, a pad oxide layer 410, which can control a shape of the LOCOS layer 408 (e.g., a bird's beak), can be formed over the active region 120 (and a portion of the termination region 110 adjacent the LOCOS layer 408), and a tetraethyl orthosilicate (TEOS) layer 414 can be formed over both the termination region 110 and the active region 120. The TEOS layer 414 can act as a hard mask layer for use in defining trench features, such as trench features of the masking layer 300a of FIG. 3A.

Figure 4B:
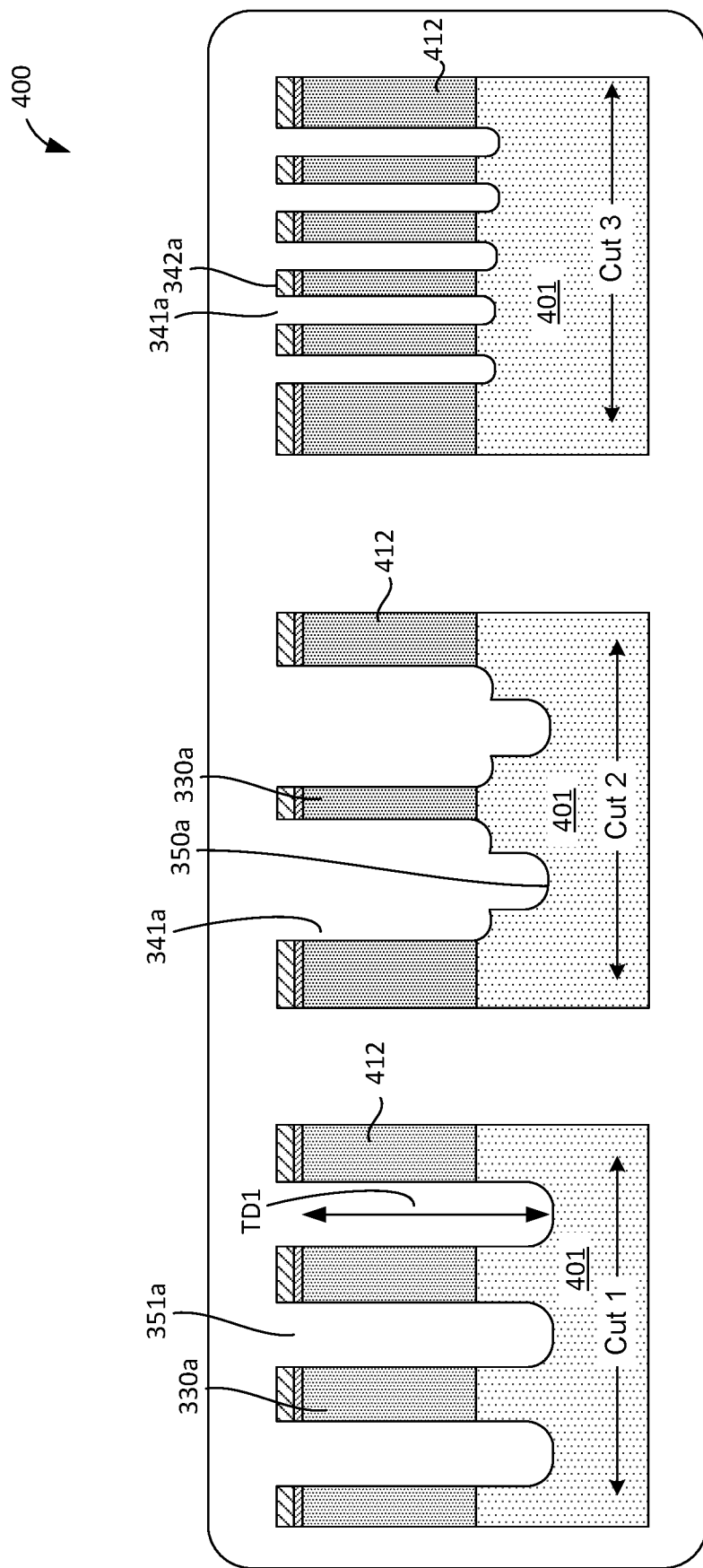

Referring to FIG. 4B, which shows cross sectional views in the active region 120 of the IGBT 400, where, as is indicated in FIG. 4B, those cross-sectional view respectively correspond with the cut lines Cut 1, Cut 2 and Cut 3 of FIG. 3A. In FIG. 4B, photolithography and etch operations have been performed to pattern the TEOS 414 hard mask layer, remove photo resist and etch the trench features of the masking layer 300a using, e.g., an isotropic plasma etch. In certain implementations, the trench features can be etched with a target depth TD1 in a range of 5-7 µm. Reference characters corresponding to the various masking features (trench features) of the masking layer 300a are used in FIG. 4B (as well as FIG. 4C) to indicate the location of those various trench features in the cross-sectional views along the cut lines. For example, FIG. 4B indicates mesas 330a, the central trenches of 350a of the inactive IGBT segments, removed trench fingers 341a, the remaining trench fingers 342a and the active segment trenches 351a.

Figure 4C:
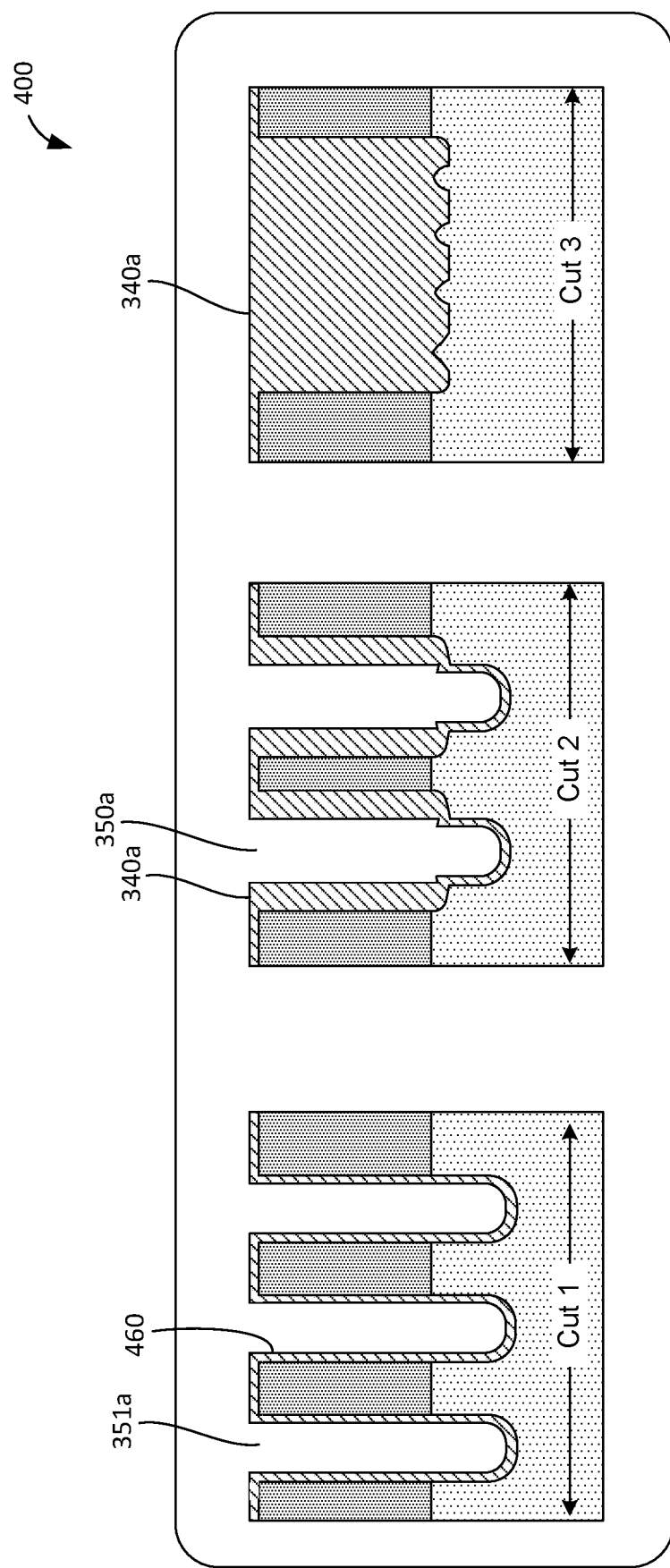

Referring now to FIG. 4C, a sacrificial oxide (SacOX) can be grown and removed, which can help to remove any damage to the semiconductor substrate 401 (and JFET layer 412) caused by the trench etch process of FIG. 4B. After removal of the SacOX layer, a gate oxidation process can be performed, which can form the gate oxide 460 on the sidewalls of the active segment trenches 351a (such as illustrated for Cut 1 in FIG. 4C), as well as form the dielectric portions 340a of the inactive segments (such as illustrated for Cuts 2 and 3 of FIG. 4C. As shown for Cut 2 in FIG. 4C, the central trenches 350a of the inactive segments remain open, while oxidation of the semiconductor fingers 342a (from the gate oxidation and/or SacOX operations) can, as a result of volume expansion of the semiconductor fingers 342a as they oxidize, create a contiguous block of dielectric 340a along Cut 3 (and the outer portions of the inactive trench segments, where the removed trench fingers 341a and remaining semiconductor fingers 342a were formed).

Figure 4D:
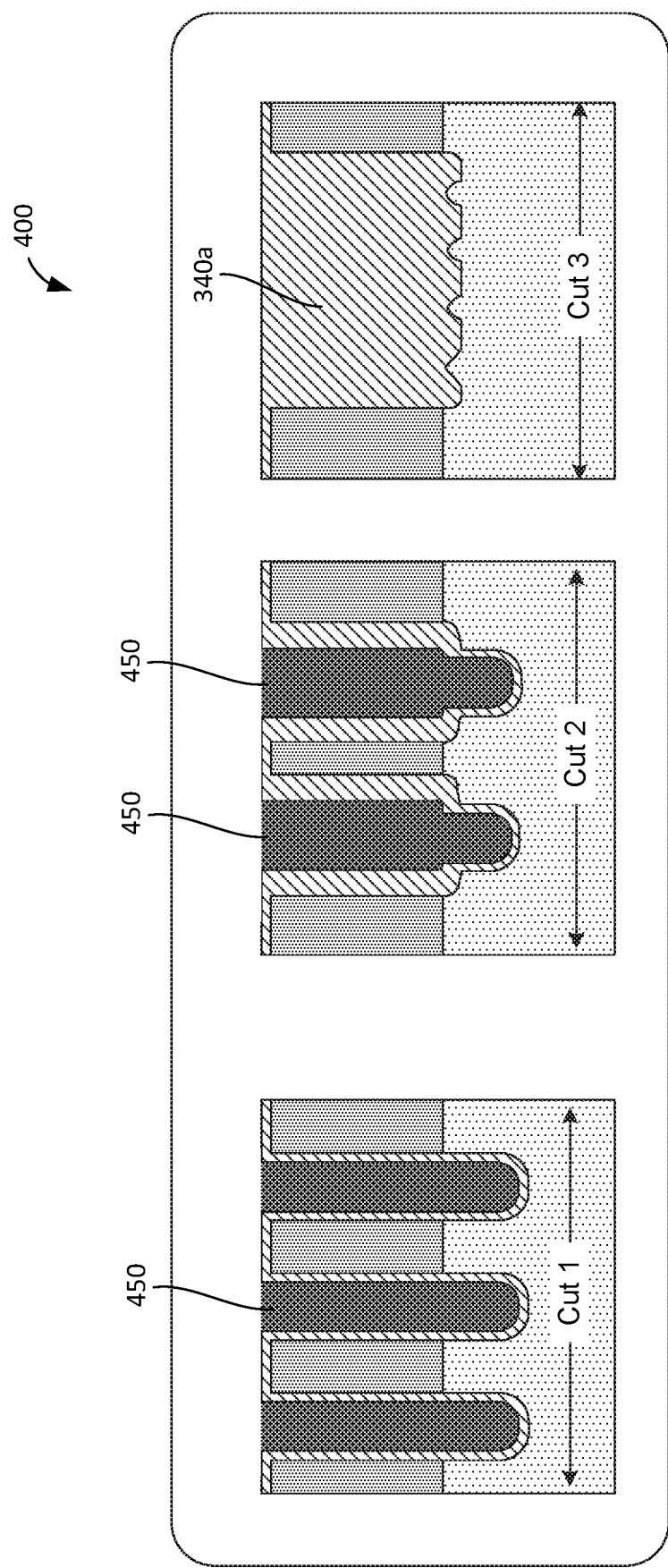
Figure 4E:
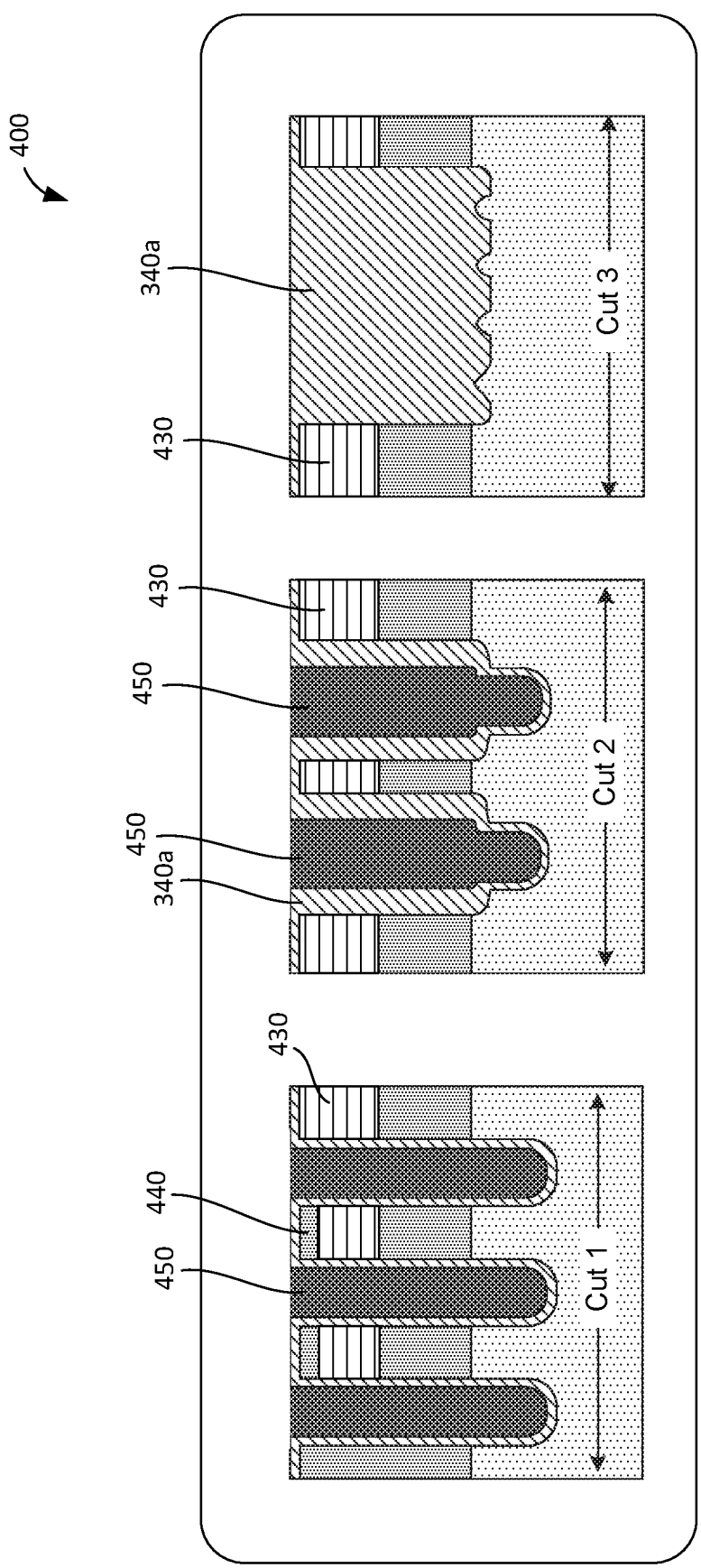

Referring now to FIG. 4D, conductive electrodes 450 (e.g., doped polysilicon) can be formed in the active segment trenches 351a and the inactive segment central trenches 350a. As shown in FIG. 4E, dopant implant and thermal drive operations can be performed to form p-wells 430 and n-type source implants 440 in the mesas 330a, where p-wells 430 are formed in the active (Cut 1) and inactive segments (Cuts 2 and 3), while source implants 440 are formed only in the active segments (Cut 1). In certain implementations, the source implant process can be performed using a photolithography mask, while in other implementations (such as those using the masking layer 330b of FIG. 3B), the source implants 440 can be self-aligned (e.g., where the source implant is blocked by the dielectric portions of the inactive segments continuously extending between inactive trench segments).

Figure 4F:
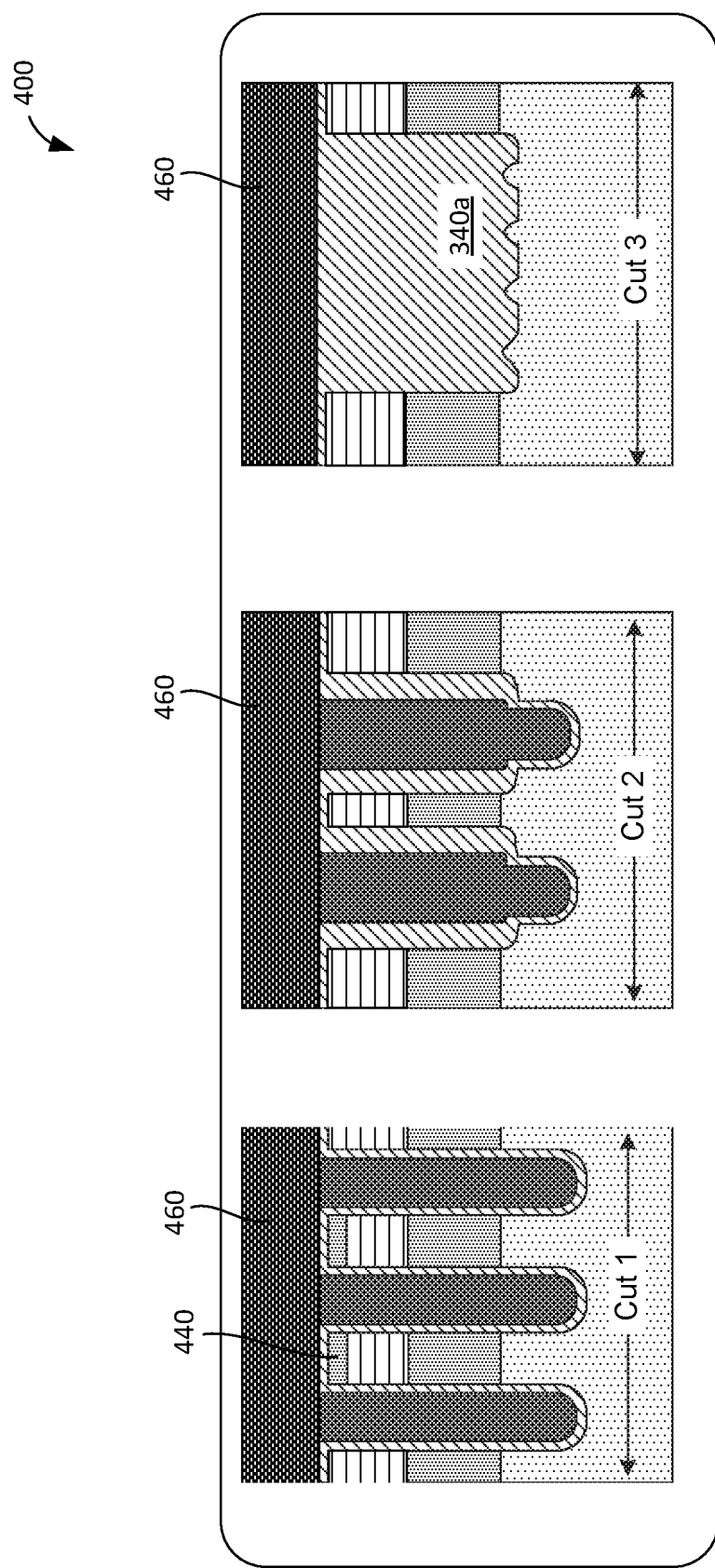
Figure 4G:
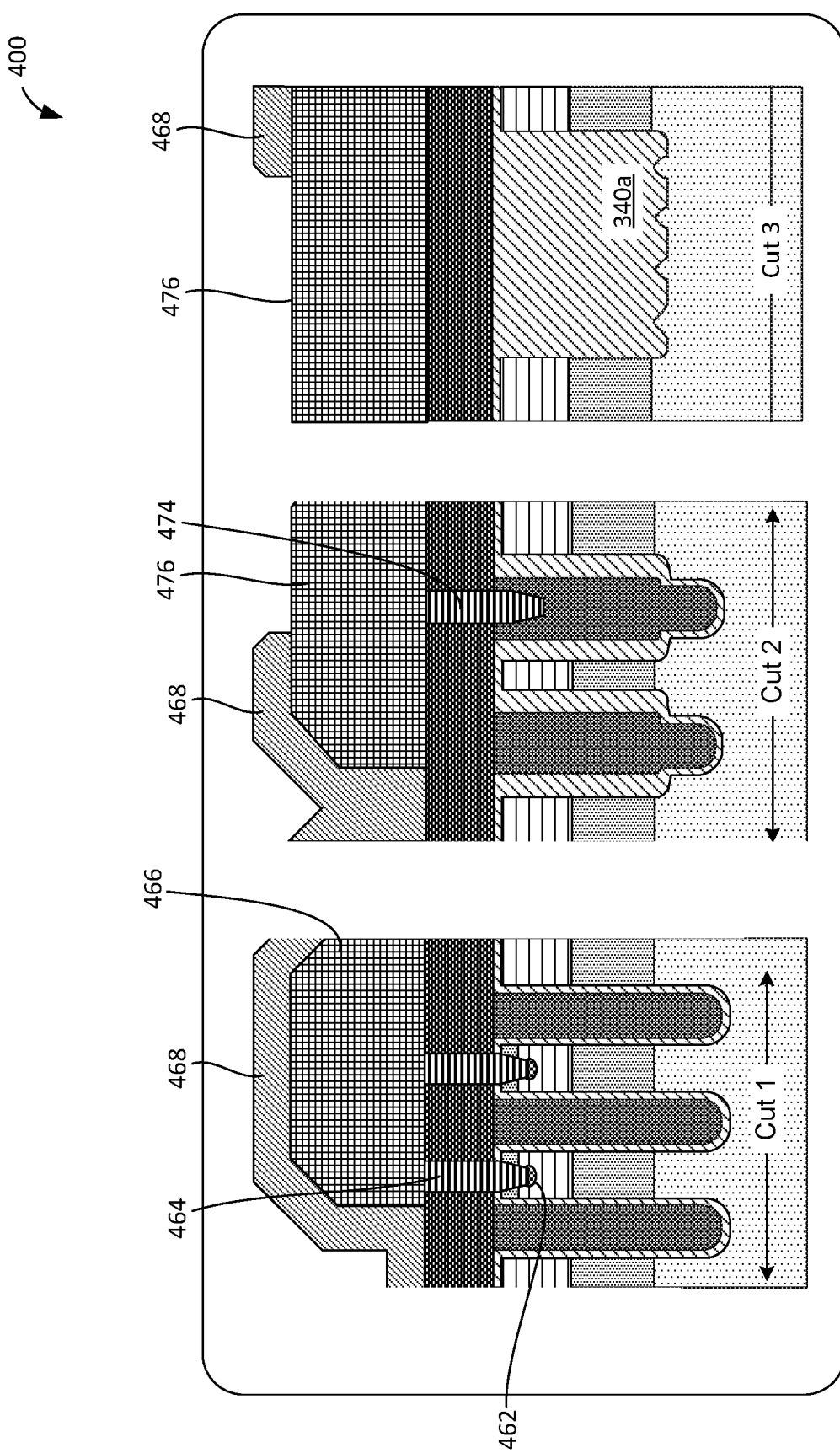

As shown in FIG. 4F, a pre-metal dielectric layer 460, such as a phosphosilicate glass (PSG) and/or TEOS dielectric layer can be formed. Referring now to FIG. 4G, metal interconnects to the various elements of the IGBT 400, as well as other features of the IGBT 400 can be formed. These features can include, for example, p-type enhancement implants 462, source contacts 464, metallization layers 466 and 476, a passivation layer 468, and conductive electrode contacts 474 (e.g., gate and/or emitter contacts). Depending on the implementation, additional features can be formed and/or one or more of the illustrated features of the IGBT 400 could be eliminated.

Figure 5:
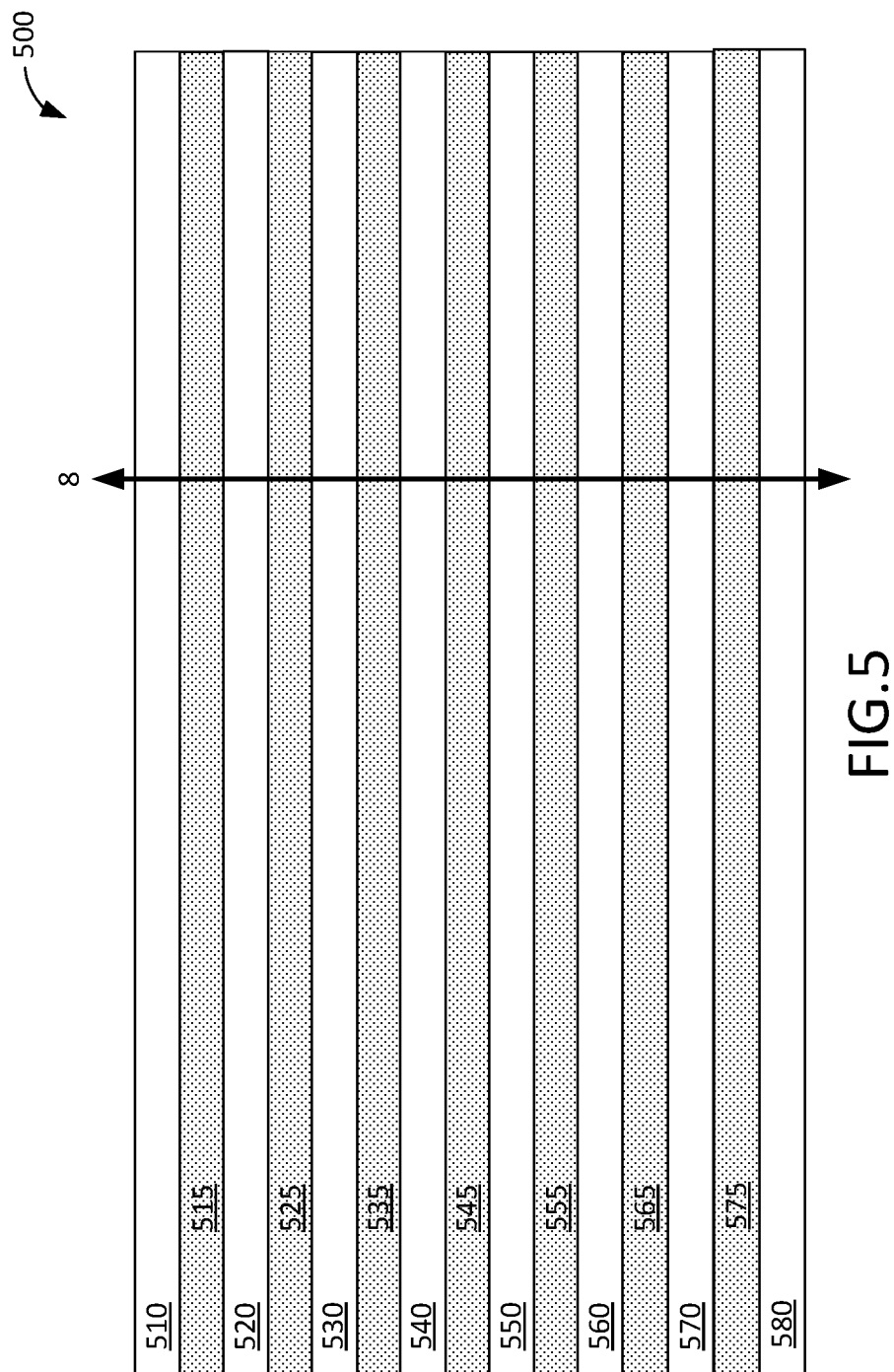
FIG. 5 is a diagram that schematically illustrates a portion of a trench-gate IGBT device that can include one or more oxide-filled mesas.

FIG. 5 is a diagram that schematically illustrates a portion of a trench-gate IGBT 500 that can include one or more oxide-filled mesas. The IGBT 500 of FIG. 5 includes a plurality of trenches 510, 520, 530, 540, 550, 560, 570 and 580. The IGBT 500 also includes a plurality of mesas 515, 525, 535, 545, 555, 565 and 575 where each of the mesas 515-575 is respectively disposed between two of the trenches 510-580. In certain implementations, the IGBT 500 can be produced using the semiconductor manufacturing process illustrated in FIGS. 8A-8H, which is described below.

In the IGBT 500, the trenches 510-580 can each be lined with a dielectric (e.g., a gate oxide) and include a respective conductive electrode (e.g., doped polysilicon) disposed therein. Depending on the particular implementation, the conductive electrodes in the trenches 510-580 of the IGBT 500 can be gate electrodes, emitter electrodes, or a combination of gate electrodes and emitter electrodes. The mesas 515-575 can be active emitter mesas, passive emitter mesas, oxide filled mesas, floating passive mesas, or a combination of active emitter mesas, passive emitter mesas, oxide filled mesas and floating passive mesas. As discussed above, oxide-filled mesas (or oxide-filled mesa segments) can be used to define inactive segments of the IGBT 500. Depending on the particular implementation, these inactive segments (e.g., inactive portions) of the IGBT 500 can also include passive emitter mesas and/or floating passive mesas, which can be used to achieve specific performance characteristics of the IGBT 500, such as on resistance, switching time, input capacitance, etc.

Table 1 below illustrates various example implementations (e.g., arrangements) of the IGBT 500, where the following abbreviations are used in the table: OFM indicates an oxide-filled mesa (e.g., defining an inactive segment of the IGBT 500); AEM indicates an active emitter mesa (e.g., that includes a source implant and is disposed adjacent to a gate electrode trench in an active segment of the IGBT 500), PEM indicates a passive emitter mesa that includes a P+ implant in a contact but does not include an n+ implant (e.g., which can be disposed in inactive segments, or portions of the IGBT 500 and can improve removal of stored charge to improve turn-off speed); FPM indicates a floating passive mesa that includes a p-well implant but omits both a P+ implant and an n+ source implant; GT indicates a gate electrode trench; and ET indicates an emitter electrode trench. Gate electrode trenches (GT) disposed in inactive segments of the IGBT 500 can improve carrier accumulation in the inactive segments, such as under an oxide-filled mesa (e.g., which can reduce on resistance of the IGBT 500 by enhancing lateral conduction under below the inactive segments). Emitter electrode trenches (ET) can provide shielding and noise snubbing, such as for adjacent (neighboring) gate electrode trenches, and can also reduce negative gate capacitance of corresponding IGBT device.

In some of the examples (indicated as Ex. 1-8) in Table 1, specific mesa and trench types (using the abbreviations above) are shown only for a subset of the trenches and mesas illustrated in FIG. 5. In those examples, the trenches and mesas of FIG. 5 that are not specified are indicated as N/A in Table 1, and those trenches and mesas (indicated as N/A) may not be included as part of the respective trench and mesa arrangement of a corresponding IGBT. In other words, each example in Table 1 indicates an arrangement of trench and mesa types that could be implement in the IGBT 500. In certain implementations, these example patterns of trenches and mesas can be repeated within an active region of the IGBT 500. For instance, in Ex. 1, the pattern shown could be repeated below the active emitter mesa 565 starting with a with a gate trench electrode in trench 570 (as with the trench 510), with arrangement of mesas 515-565 and trenches 520-560 of Ex. 1 being continued below the gate electrode in the trench 570. In other implementations, different arrangements (e.g. patterns) of trenches and mesas can be used in combination with each other in the IGBT 500. For instance, the example arrangements of Ex. 1 and Ex. 2 could be alternated to form an active region of the IGBT 500. Other combinations, including combinations not specifically shown in Table 1, are also possible.

TABLE 1

| Trench/Mesa | Ex. 1 | Ex. 2 | Ex. 3 | Ex. 4 | Ex. 5 | Ex. 6 | Ex. 7 | Ex. 8 |
|---|---|---|---|---|---|---|---|---|
| 510 | GT | GT | GT | GT | GT | GT | GT | ET |
| 515 | OFM | OFM | OFM | OFM | OFM | OFM | OFM | OFM |
| 520 | ET | GT | GT | ET | ET | ET | GT | ET |
| 525 | OFM | OFM | OFM | OFM | PEM | OFM | OFM | OFM |
| 530 | ET | ET | ET | ET | ET | ET | ET | ET |
| 535 | OFM | OFM | PFM | OFM | OFM | OFM | OFM | OFM |
| 540 | ET | ET | ET | GT | GT | ET | ET | ET |
| 545 | OFM | OFM | OFM | AEM | AEM | OFM | OFM | OFM |
| 550 | ET | GT | GT | N/A | N/A | ET | GT | ET |
| 555 | OFM | OFM | OFM | N/A | N/A | OFM | OFM | OFM |
| 560 | GT | GT | GT | N/A | N/A | GT | GT | ET |
| 565 | AEM | AEM | AEM | N/A | N/A | AEM | AEM | AEM |
| 570 | N/A | N/A | N/A | N/A | N/A | ET | ET | GT |
| 575 | N/A | N/A | N/A | N/A | N/A | AEM | AEM | AEM |
| 580 | N/A | N/A | N/A | N/A | N/A | GT | GT | N/A |

Figure 6A:
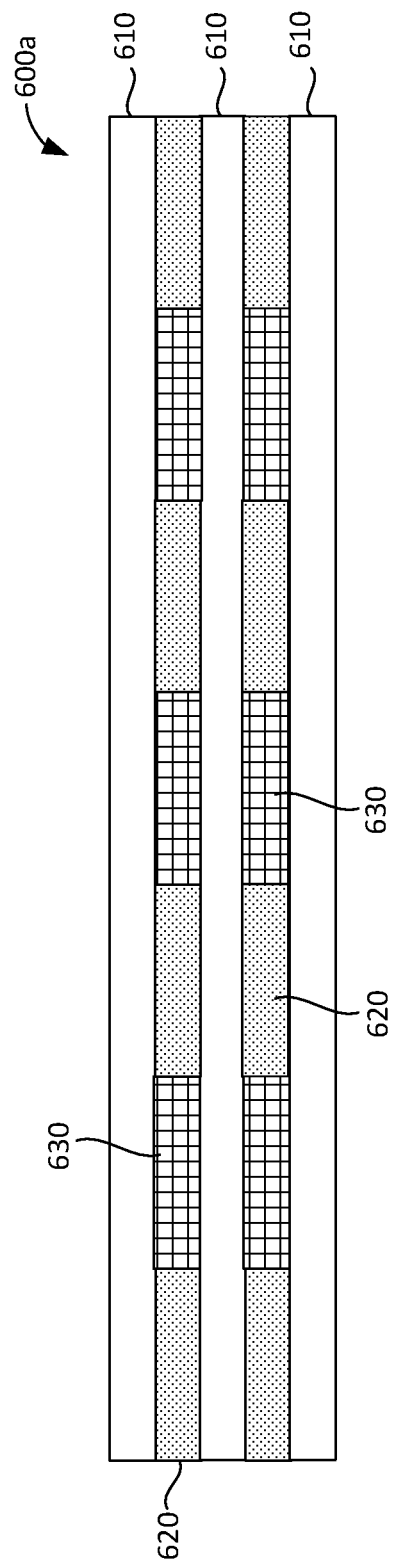
FIGS. 6A and 6B are diagrams that schematically illustrate portions of trench-gate IGBT devices that can include one or more oxide-filled mesa segments.
Figure 6B:
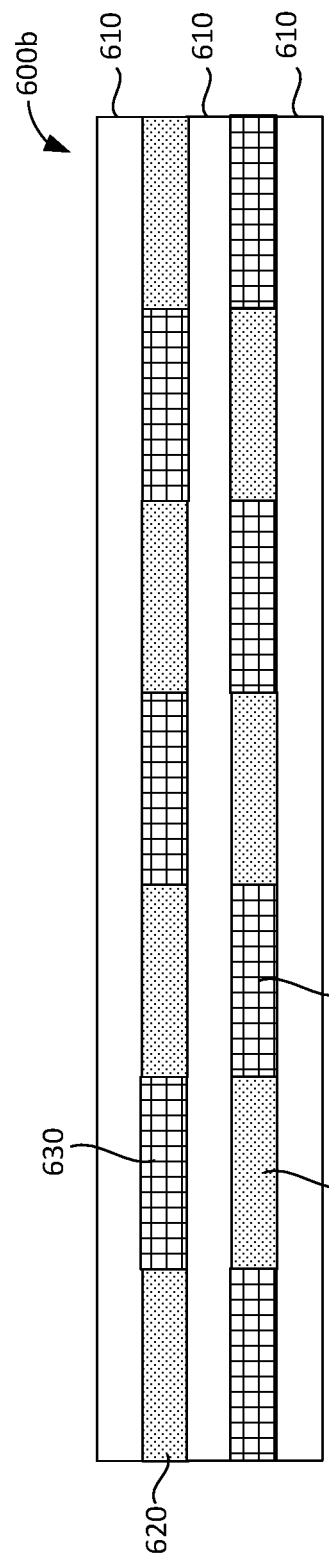

FIGS. 6A and 6B are diagrams that schematically illustrate plan views of portions of trench-gate IGBT devices 600a and 600b that can include one or more oxide-filled mesa segments 630. The arrangement of the IGBT devices 600a and 600b can be included, for example, in the active region 120 of the IGBT 100 shown in FIG. 1A.

The IGBT devices 600a and 600b also include trenches 610, which can be gate electrode trenches, emitter electrode trenches, or a combination of gate electrode trenches and emitter electrode trenches, depending on the particular implementation. The IGBT devices 600a and 600b further include active emitter segments. As shown in FIG. 6A, active emitter mesa segments 620 of the IGBT 600a can, as illustrated in the plan view, be vertically aligned with each other. Likewise in the IGBT 600a of FIG. 6A, the oxide-filled (inactive) mesa segments 630 can, in the plan view, be vertically aligned with each other.

In comparison, as shown in FIG. 6B, each of the active emitter mesa segments 630 of the IGBT 600b can, as illustrated in the plan view, be vertically aligned with an adjacent (neighboring) oxide-filled (inactive) mesa segment 630. As with the IGBT 500 of FIG. 5, in some implementations, the IGBTs 600a and 600b can be produced using the semiconductor manufacturing process illustrated in FIGS. 8A-8H, which is discussed below.

FIGS. 7A and 7B are diagrams that schematically illustrate portions of trench-gate IGBT devices 700a and 700b that can include one or more oxide-filled mesa segments. The arrangement of the IGBT devices 700a and 700b can be included, for example, in the active region 120 of the IGBT 100 shown in FIG. 1A.

In the IGBT devices 700a and 700b, the trench electrodes (e.g., gate trench electrodes) can be implemented as matrices with active emitter mesa segments 720 and oxide-filled mesa segments 730 being disposed within the trench electrodes 710 as islands, or in a brick-wall type configuration. Other arrangements than those shown in FIGS. 7A and 7B are possible. For example the active emitter mesa segments 720 and the oxide-filled mesa segments 730 of the IGBT 700a could be offset in a similar arrangement as shown for the active emitter segments 620 an oxide-filled (inactive) mesa segments 630 in FIG. 6B, where a given active emitter segment 720 is, in the plan view of FIG. 7A, vertically aligned with an adjacent (neighboring) oxide filled mesa segment 730. As with the IGBT 500 of FIG. 5 and the IGBTs 600a and 600b of FIGS. 6A and 6B, in certain implementations, the IGBTs 700a and 700b can be produced using the semiconductor manufacturing process illustrated in FIGS. 8A-8H, which is discussed below.

FIGS. 8A-8H are cross-sectional diagrams that illustrate a semiconductor manufacturing process for producing a trench-gate IGBT 800 that includes oxide-filled mesas to define inactive segments of the IGBT 800. The semiconductor process illustrated in FIGS. 8A-8H can be used to produce IGBTs having configurations such as those illustrated in FIG. 5 (and Table 1 above), FIGS. 6A-6B and FIGS. 7A-7B, as well as other implementations, such as those disclosed herein.

As with the semiconductor manufacturing process of FIGS. 4A-4G, for purposes of brevity and clarity, each processing step of the process flow shown in FIGS. 8A-8H is not specifically illustrated or described in detail in the following discussion. Accordingly, each drawing of FIGS. 8A-8H can be representative of multiple semiconductor processing operations. The specific semiconductor processing operations (and associated processing parameters) that are performed to produce an IGBT device, such as the IGBT device 800, will depend on the particular implementation, such as an IGBT device's desired operating parameters (e.g., short circuit withstand time, breakdown voltage, Vce,sat, input capacitance, etc.).

Further, in FIGS. 8A-8G, a termination region 110 and an active region 120 (such as in FIG. 1A) are indicated in each cross-sectional view. In certain implementations, the cross-sectional views of the active region 120 in FIGS. 8B-8H can correspond with a view along line 8 in FIG. 5, as an example, though the numbers of trenches and mesas shown in FIGS. 8B-8H, in at least some instances, differ from the numbers of trenches and mesas shown in FIG. 5. In implementations, similar section lines could be included in any of FIGS. 6A-7B, and the cross-sectional views of the active region 120 of FIGS. 8A-8H could further correspond with such section lines.

Figure 8A:
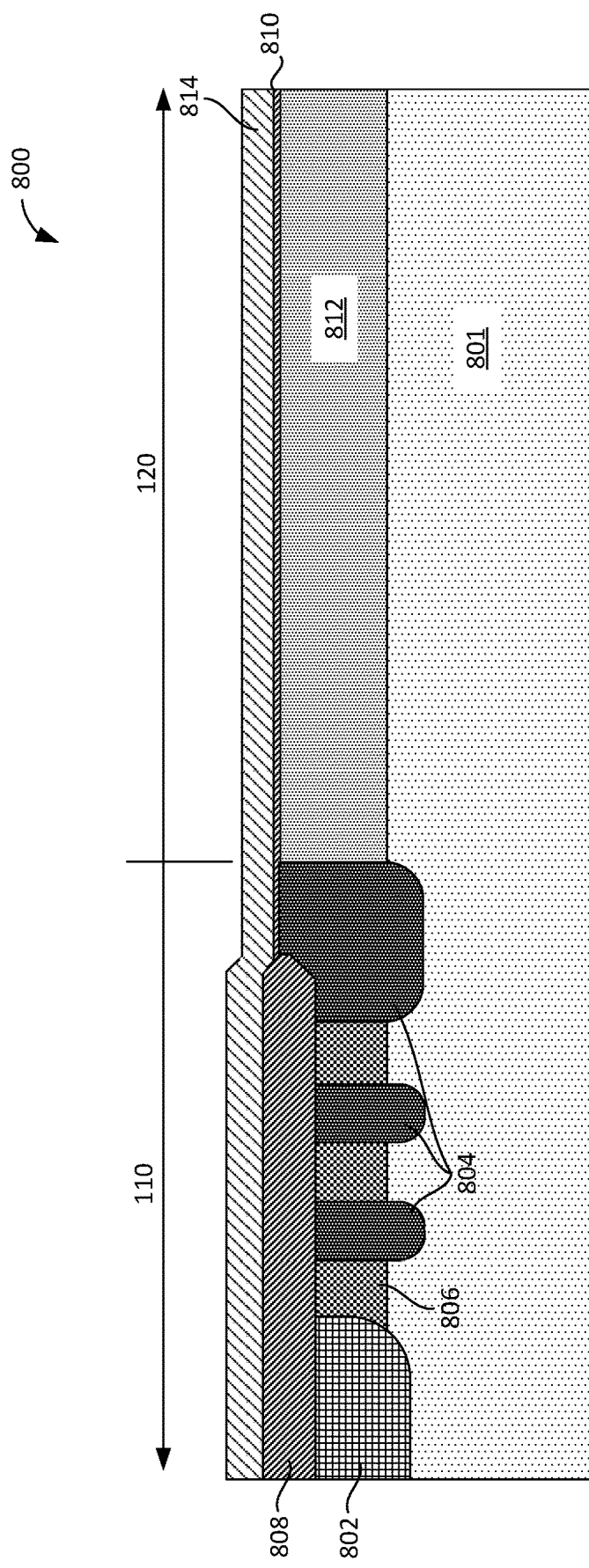
FIGS. 8A-8H are cross-sectional diagrams that illustrate a semiconductor manufacturing process for producing trench-gate IGBT devices, such as the trench-gate IGBT devices of FIGS. 5, 6A, 6B, 7A and 7B.

Referring to FIG. 8A, which has a same configuration as FIG. 4A, a semiconductor (e.g., n-type) substrate 801 can be used to produce the IGBT device 800. As noted above, the IGBT device 800 can include a termination region 110 and an active region 120. As shown in FIG. 8A, the termination region 110 of the IGBT 800 can include an N+ termination region 802 (e.g., arsenic and/or phosphorous doped), P+ termination rings 804 (e.g., boron doped) and an n-type enhancement layer 806 (which can have a higher n-type doping concentration than the substrate 801). The termination region 110 of the IGBT 800 can also include a local-oxidation of silicon (LOCOS) layer 808. In the active region 120 of the IGBT 800, as illustrated in FIG. 8A, an n-type JFET layer 812 can be formed in the substrate 801, a pad oxide layer 810 can be formed over the active region 120 (and a portion of the termination region 110 adjacent the LOCOS layer 808), and a tetraethyl orthosilicate (TEOS) layer 814 can be formed over both the termination region 110 and the active region 120. As with TEOS layer 414 of FIG. 4A, the TEOS layer 814 can act as a hard mask layer for use in defining trenches for the IGBT 800.

Figure 8B:
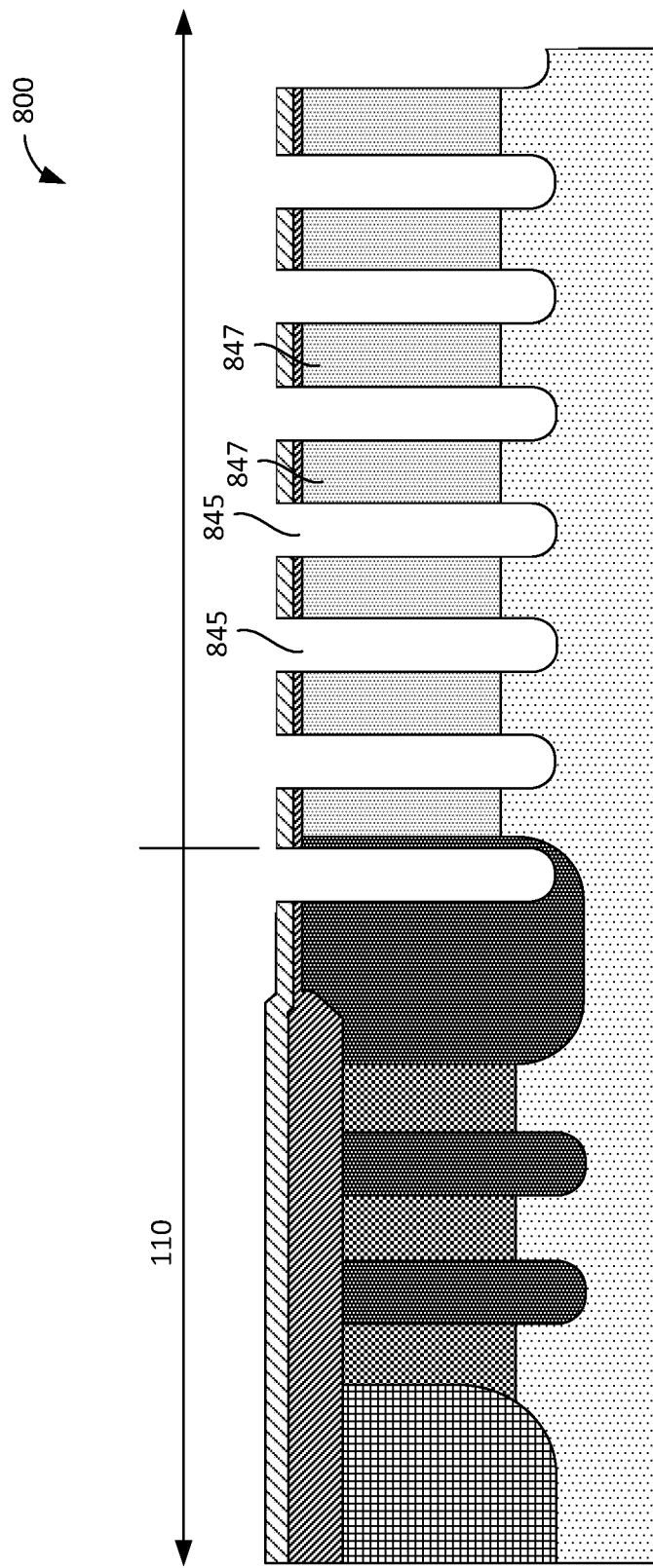

Referring to FIG. 8B, photolithography and etch operations can be performed to pattern the TEOS 814 hard mask layer for use in removing photo resist and etching trenches 845 (e.g., using an isotropic trench etch), where forming the trenches 845, also defines mesas 847 in the active region 120 (and the termination region 120 in this example). In certain implementations, the trenches 845 of the IGBT 800 can correspond with the trenches 510-580 of FIG. 5, while the mesas 847 of the IGBT 800 can correspond with the mesas 515-575 of FIG. 5. As with the trench features of FIG. 4B, the trenches 845 of FIG. 8B can also be etched with a target depth in a range of 5-7 µm.

Figure 8C:
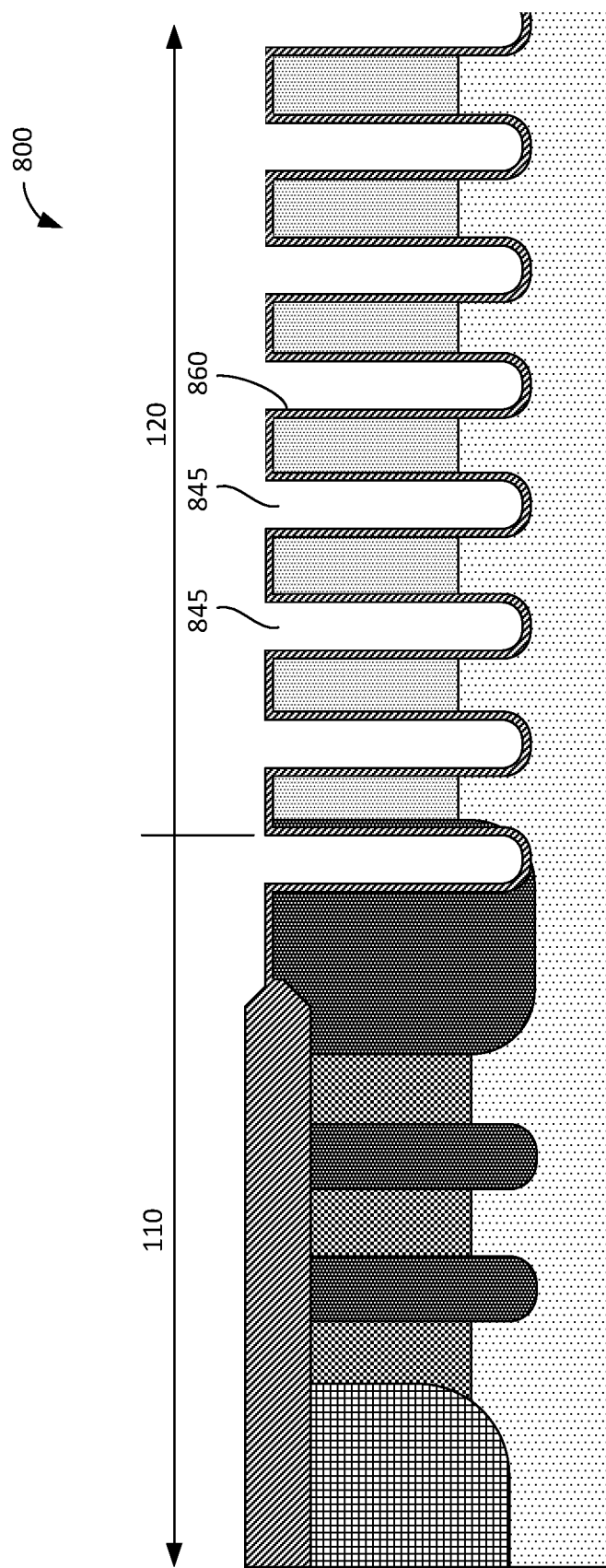

Referring now to FIG. 8C, a sacrificial oxide (SacOX) can be grown and removed, which can help to remove any damage to the semiconductor substrate 801 (and the JFET layer 812) caused by the trench etch process of FIG. 8B. After removal of the SacOX layer, a gate oxidation process can be performed, which can form gate oxide 860 on the sidewalls of the trenches 845.

Figure 8D:
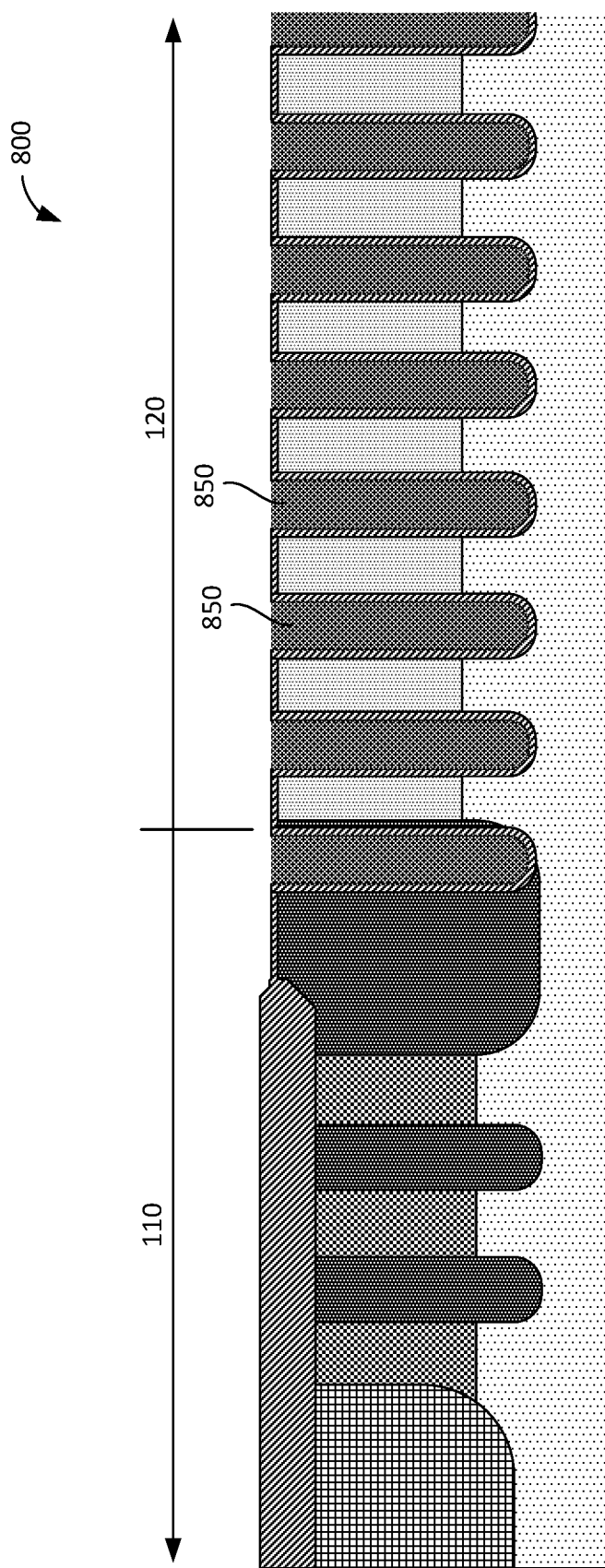
Figure 8E:
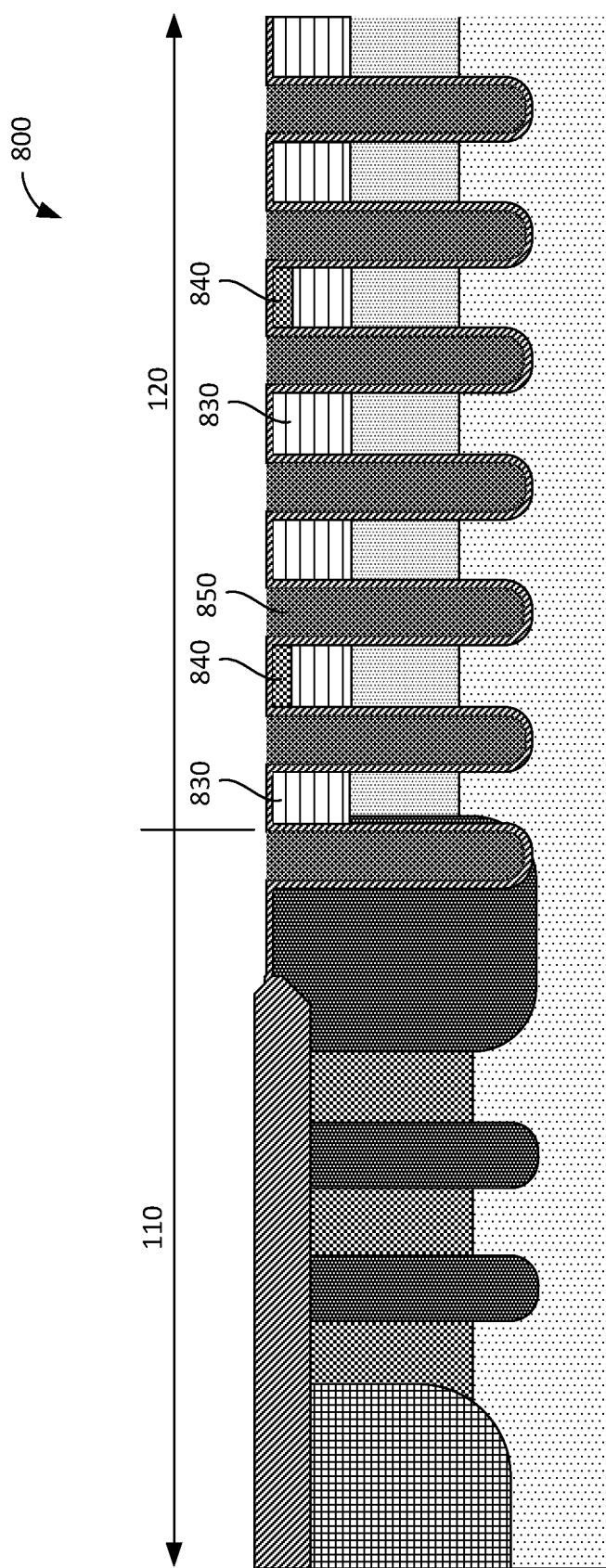

Referring now to FIG. 8D, conductive electrodes 850 (e.g., including doped polysilicon) can be formed in the trenches 845. As shown in FIG. 8E, dopant implant and thermal drive operations can be performed to form p-wells 830 and n-type source implants 840 in the mesas 847 (e.g., such as shown for an example implementation in FIG. 8E). In certain implementations, the source implant process can be performed using a photolithography mask, while in other implementations, the source implants 840 can be formed after the process operations of FIGS. 8F and 8G (e.g., forming oxide-filled mesas and/or oxide filled mesa segments). In such implementations, the source implants 840 can be self-aligned, e.g., where the source implant is blocked by oxide-filled mesas, or oxide-filled mesa segments that define inactive segments of the IGBT 800. In such implementations, the source implants 840 would, as a result, be self-aligned in the active segments of the IGBT 800.

Figure 8F:
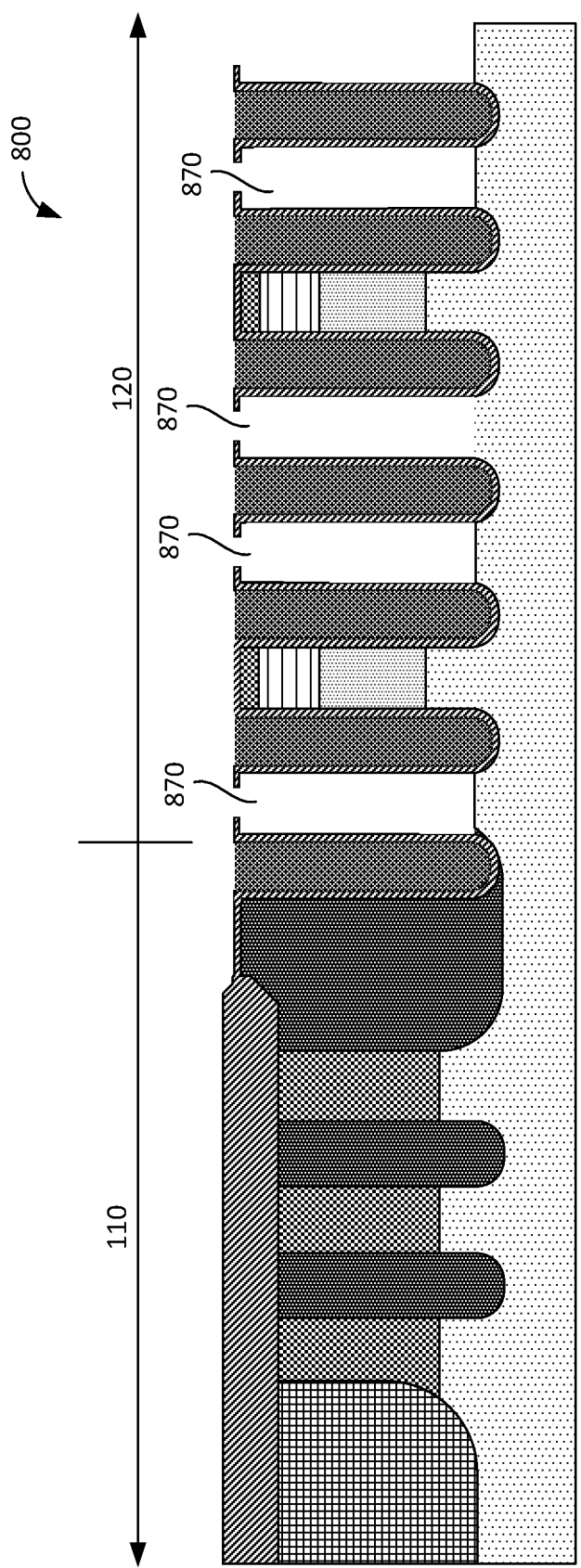

Referring now to FIG. 8F, photolithography operations can be performed to form a masking layer, such as a photoresist masking layer. A gate oxide etch can then be performed to remove gate oxide over portions or segments of silicon mesas 847 that are to be removed to define oxide-filled mesas. After removing gate oxide in correspondence with the masking layer, an isotropic or anisotropic semiconductor (e.g., silicon) etch (which can be similar to an etch used to form the trenches 845) can be performed to remove semiconductor material to create voids 874 in portions or segments of the semiconductor mesas 847 in which oxide-filled mesas are to be formed (e.g., to define inactive segments of the IGBT 800).

Figure 8G:
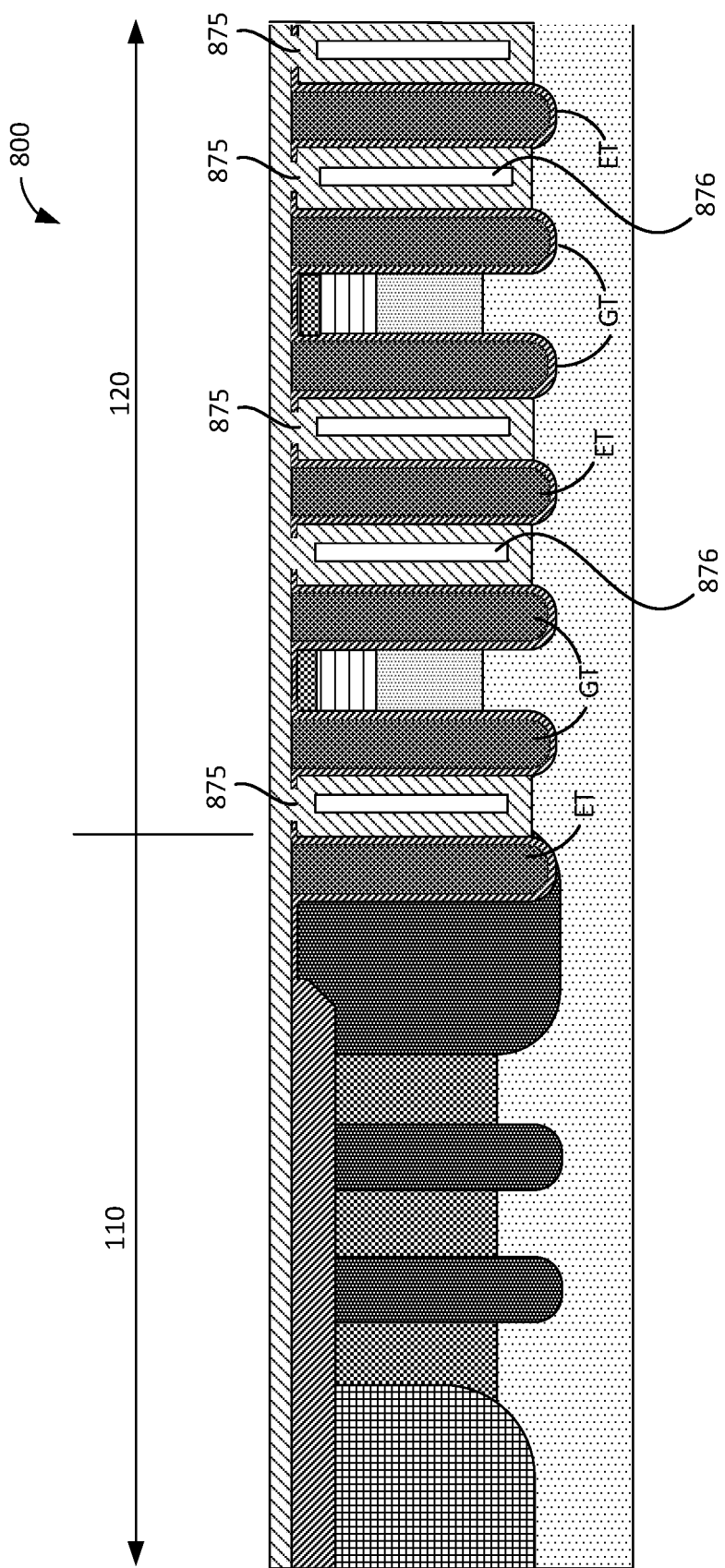
Figure 8H:
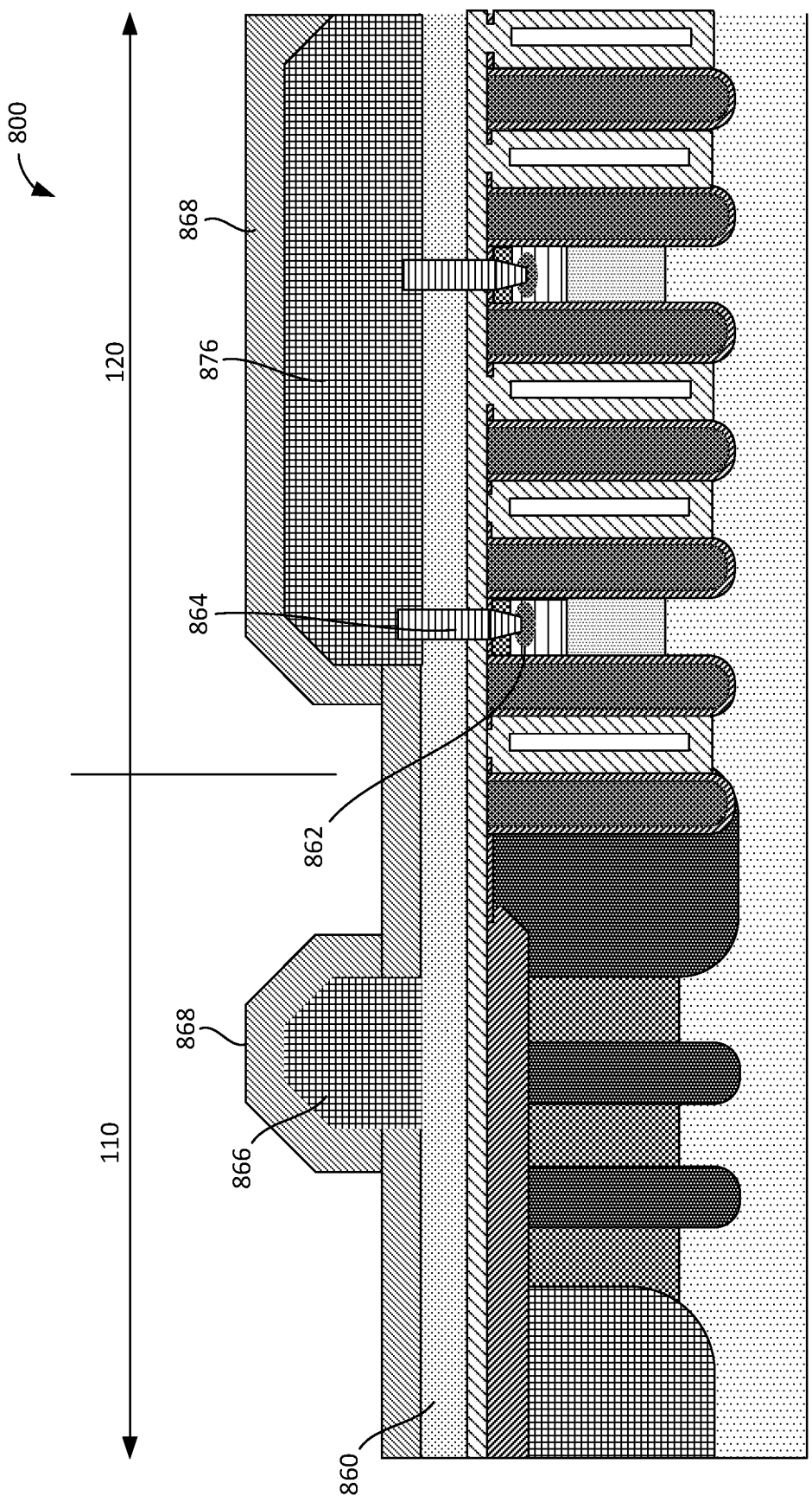

Referring to FIG. 8G, a thermal oxidation and/or a chemical vapor deposition (CVD) of a dielectric can be performed (e.g., a CVD TEOS) to define (form, produce, etc.) oxide-filled mesa segments 875. As shown in FIG. 8H, the oxide-filled mesa segments 875 can include dielectric enclosed air gaps 876. These air gaps 876 can reduce overall stress on the semiconductor substrate 801 and reduce any bow in the semiconductor substrate 801, such as stressing or bowing that may be induced by, or result from the oxidation processes used to form the oxide-filled mesas 875. Reduction of stress or bow may be as compared with an implementation in which the voids 874 in the mesas 847 of FIG. 8F were to be completely filled, or nearly completely filled with dielectric (e.g., oxide).

As is further illustrated in FIG. 8G, the conductive electrodes 850 can be connected to the emitter terminal or the gate terminal of the IGBT 800, as is appropriate for the particular implementation. In FIG. 8, using the same acronyms as used in Table 1 above, conductive electrodes connected to the emitter terminal of the IGBT 800 are indicated as ET, while conductive electrodes connected to (e.g., that define) the gate terminal of the IGBT 800 are indicated as GT.

As shown in FIG. 8H, a pre-metal dielectric layer 860, such as a phosphosilicate glass (PSG) and/or TEOS dielectric layer can be formed. As further shown in FIG. 8H, metal interconnects to the various elements of the IGBT 800, as well as other features of the IGBT 800 can be formed. These features can include, for example, p-type enhancement implants 862, source contacts 864, metallization layers 866 and 876, and a passivation layer 868. Though not shown in FIG. 8H, contacts to the conductive electrodes 850 can also be formed (e.g., gate and/or emitter contacts). Depending on the particular implementation, additional features can be formed and/or one or more of the illustrated features of the IGBT 800 could be eliminated.

Figure 9:
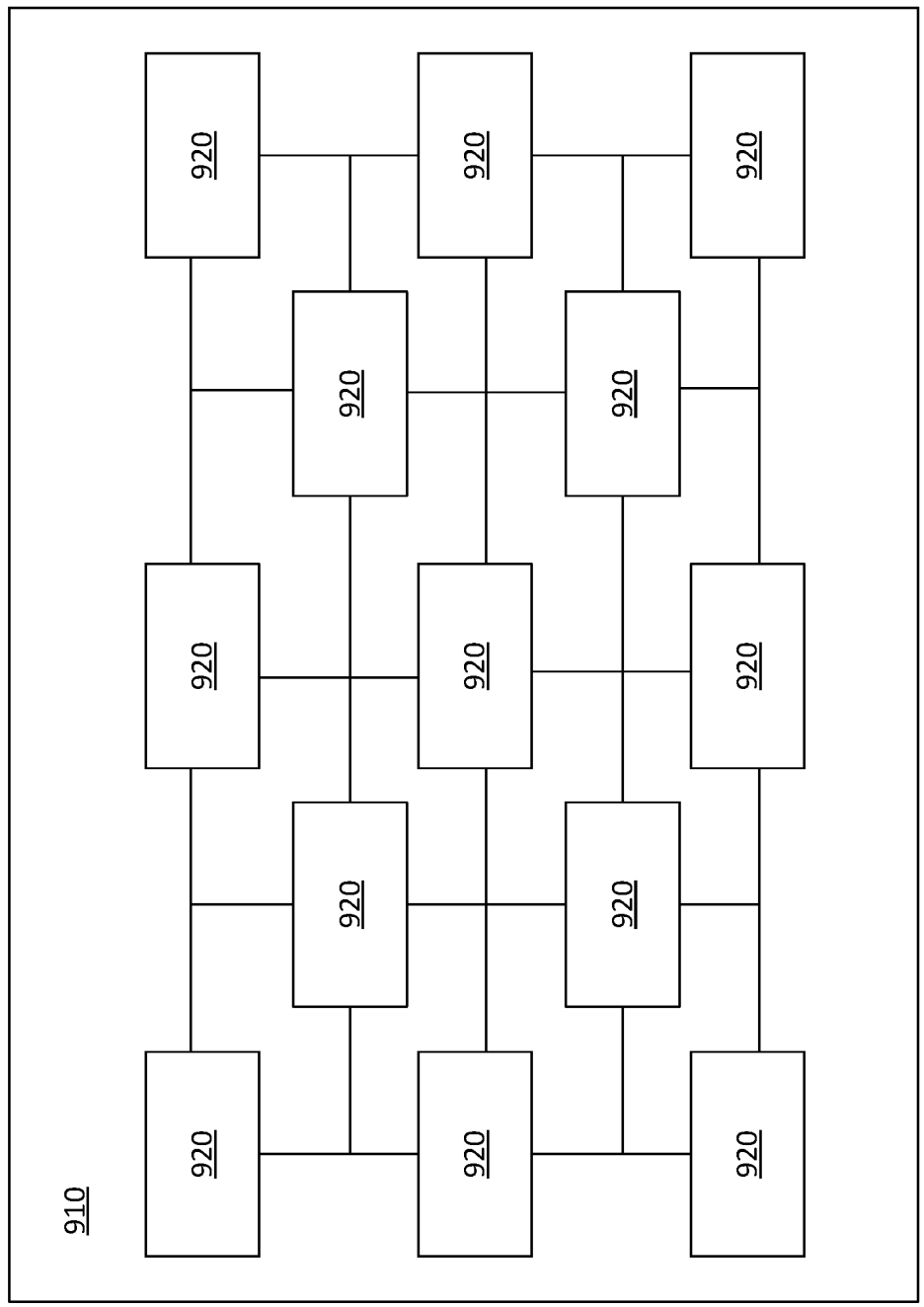
FIG. 9 is a diagram that schematically illustrates a trench-gate IGBT device that includes active mesas (e.g., active islands) with dielectric (e.g., oxide) termination and isolation between the active mesas.

FIG. 9 is a diagram that schematically illustrates a trench-gate IGBT 900 that includes active mesas 920 (e.g., active mesa islands) with a dielectric (e.g., oxide) termination and isolation (dielectric termination) region 910 that is disposed between (and surrounds) the active mesas 920. As shown in FIG. 9 the active mesas 920 of the IGBT 900 can be interconnected, such as using conductive metal layers and/or doped polysilicon connectors (e.g., for emitter terminal connections and gate terminal connections). In the IGBT 900, the active mesas 920 can be active emitter mesas. In certain implementations, using the approaches described herein, an entire semiconductor substrate (e.g., wafer), other than the areas in which active mesas 920 are to be defined, can be oxidized to form the dielectric termination region 910 of the IGBT 900. In such approaches, because the dielectric termination region 910 can electrically isolate the active mesas 920 from each other, the IGBT 900 can be produced without any implanted termination structures, such as N+ and/or P+ guard rings, or enhancement implants.

Using the approaches described herein, such as those illustrated in FIGS. 10A-10C, 11A-11C, 12A-12C and 13A-13P, implementations of the IGBT 900 can be produced, where flexibility in active emitter mesa 920 design (e.g., by varying gate and trench emitter mesa dimensions) provided by these disclosed implementations can improve carrier injection efficiency, reduce Vce,sat (and saturation current), reduce input (Miller) capacitance, reduce switching loss and also improve short circuit withstand capability by reducing an emitter fraction of the IGBT 900, as compared to current IGBT implementations. Improvement in such IGBT performance characteristics can be achieved, at least in part, by increasing a gate pitch (e.g. average distance between active gate segments), which, as a result, can reduce active device area around the gate trenches, lower saturation current, improve carrier injection efficiency and reduce Vce,sat of an associated IGBT, such as the IGBT 900. In some implementations, gate pitch can be in a range from 4 µm to 50 µm.

FIGS. 10A-10C are cross-sectional diagrams that schematically illustrate active mesas and dielectric (isolation) termination of IGBTs 1000a, 1000b and 1000c that can be included in a trench-gate IGBT, such as the trench-gate IGBT 900 of FIG. 9. In certain implementations, the IGBTs 1000a, 1000b and 1000c can be produced using the semiconductor manufacturing process illustrated in FIGS. 13A-13P, which is described below.

Referring to FIG. 10A, a portion of an IGBT 1000a that can be included in, for example, the IGBT 900 is illustrated. The IGBT 1000a is shown as being implemented in a semiconductor substrate 1001a and including dielectric termination 1010a (e.g., defining an inactive area of the IGBT 1000a). Also shown in FIG. 10A are portions of two active mesas 1020a, which include p-wells 1030a and source implants 1040a. The IGBT 1000a also includes conductive gate electrodes 1050a, which are isolated from the active mesas 1020a by gate dielectric layers 1060a. In the example of FIG. 10A, active segments (active emitter segments) are defined along the gate electrodes 1050a by the active mesas 1020a, while the dielectric termination 1010a defines inactive IGBT segments along the gate electrodes 1050a (opposite from the active segments of the gate dielectrics 1050a).

Referring now to FIG. 10B, a portion of an IGBT 1000b that can be included in, for example, the IGBT 900 is illustrated. The IGBT 1000b, which is similar to the IGBT 1000a of FIG. 10A, includes a semiconductor substrate 1001b; dielectric termination 1010b (e.g., defining an inactive area of the IGBT 1000b); active mesas 1020b, which include p-wells 1030b and source implants 1040b; and a conductive gate electrode 1050b, which is isolated from the active mesas 1020b by gate dielectric layers 1060b. In the example of FIG. 10B, active IGBT segments of the of the IGBT 1000b are defined along the gate electrode 1050b by the active mesas 1020b, while the dielectric termination 1010b defines inactive IGBT segments along the gate electrode 1050b (opposite from the active segments of the gate dielectric 1050b).

The IGBT 1000b differs from the IGBT 1000a in that the conductive gate electrode 1050b extends over the dielectric termination region 1010b, forming a single gate electrode 1050b (rather than two separate gate electrodes 1050a) with vertical portions 1054b extending along a vertical axis V. Such an approach can be used to vary an input (Miller) capacitance of the IGBT 1000b.

Referring now to FIG. 10C, a portion of an IGBT 1000c that can be included in, for example, the IGBT 900 is illustrated. The IGBT 1000c, which is similar to the IGBTs 1000a and 1000b, includes a semiconductor substrate 1001c; dielectric termination 1010c (e.g., defining an inactive area of the IGBT 1000c); active mesas 1020c, which include p-wells 1030c and source implants 1404c; and a conductive gate electrode 1050c, which is isolated from the active mesas 1020c by gate dielectric layers 1060c. In the example of FIG. 10C, active IGBT segments of the IGBT 1000c are defined along the gate electrode 1050c by the active mesas 1020b, while the dielectric termination 1010b defines inactive IGBT segments along the gate electrode 1050c (opposite from the active segments of the gate dielectric 1050c).

The IGBT 1000c differs from the IGBT 1000b in that the conductive gate electrode 1050c includes a column 1052c that extends vertically, along the axis V, in the dielectric termination region 1010b (terminating before a bottom surface of the dielectric termination region 1010c). Such an approach, as with the conductive gate electrode 1050b, can be used to vary an input (Miller) capacitance of the IGBT 1000c. The IGBT 1000c differs from the IGBT 1000b in that the conductive gate electrode 1050c includes vertical portions 1054c that extend vertically, along the axis V, to a depth that is less than a depth of the column 1052c of the IGBT 1000c, and is also less than depth of vertical portions 1054b of the IGBT 1000b.

Figure 11B:
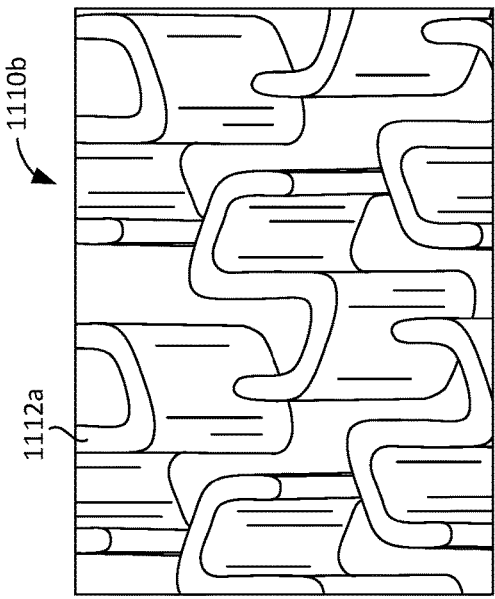
FIGS. 11A-11C are diagrams that illustrate various pillars that can be used to form the oxide termination and isolation of an IGBT device, such as the IGBT 900 of FIG. 9.
Figure 11C:
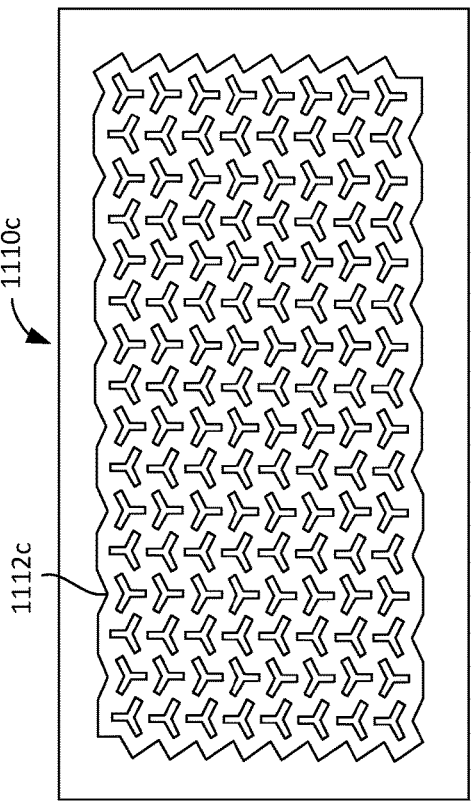
Figure 11A:
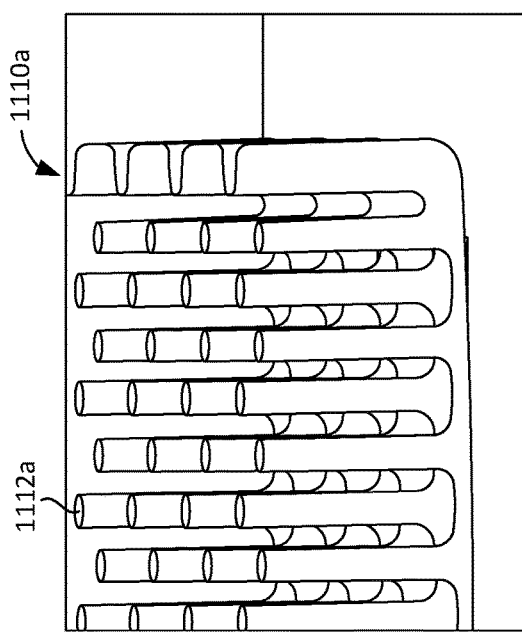

FIGS. 11A-11C are diagrams that illustrate various pillars that can be used to form the oxide termination and isolation regions of a trench-gate IGBT device, such as the oxide termination regions of the IGBT devices of FIGS. 9-10C. Depending on the particular implementation, trenches defining the pillars in the dielectric termination regions of FIGS. 11A-11C can be formed using a same semiconductor etch process that is used to form trenches in an active mesa of an associated IGBT device. In some implementations, the trenches defining the pillars in the dielectric termination regions of FIGS. 11A-11C can be formed using a different semiconductor etch process than the semiconductor process that is used to form trenches in an active mesa of an associated IGBT device. In implementations using different trench etch processes (in the active region and the inactive, or dielectric termination region), different trench depths can be achieved in the active mesas and the dielectric (isolation)

termination regions, which can allow for dielectric termination structures that are deeper than the active mesas, which can further improve isolation and termination between active mesas.

The pillars formed in the dielectric termination regions of FIGS. 11A-11C (or other dielectric termination regions) can be oxidized, filled with dielectric material, filled with polysilicon and or used to define air gaps in the dielectric termination regions. As discussed herein, such dielectric termination regions can provide electric isolation and electrical termination for active emitter mesas of an IGBT, such as the active mesas 920 of the IGBT 900, for example.

FIG. 11A illustrates a dielectric isolation region 1110a that includes circular semiconductor pillars 1112a. In example implementations, each of the pillars 1112a can be approximately 0.6 µm wide, be spaced approximately 0.4 µm apart, and approximately 5 µm tall (e.g., the trenches defining the pillars 1112a can be approximately 5 µm deep). FIG. 11B illustrates a dielectric isolation region 1110b that includes serpentine-shaped semiconductor pillars 1112b, while FIG. 11C illustrates a dielectric isolation region 1110c that includes Y-shaped semiconductor pillars 1112c. In example implementations, each of the pillars 1112b and 1112c can have an overall width of approximately 0.6 µm wide, be spaced approximately 0.8 µm apart and, because they are more structurally sound than the circular pillars 1112a, can be 16 µm tall, or taller (e.g., the trenches defining the pillars 1112b and 1112c can be approximately 16 µm deep, or deeper). Other pillar configurations are possible, such as chevron-shaped pillars, I-shaped pillars, etc.

In the approaches of FIGS. 11A-11C, after forming the pillars, the pillars can be oxidized, which will increase their volume, resulting in their outer dimensions increasing as result of the oxidation. However, due to the spacing between the pillars, which spacing depends on the particular implementation, oxidation of the pillars does not result in significant stress or bowing of a semiconductor wafer used to form an associated IBGT. As described herein, the oxidized pillars of the dielectric termination regions can be further process to fill gaps with polysilicon and/or form dielectric enclosed air gaps with relatively small deposition thickness due to the narrow gaps between pillars.

Figure 12A:
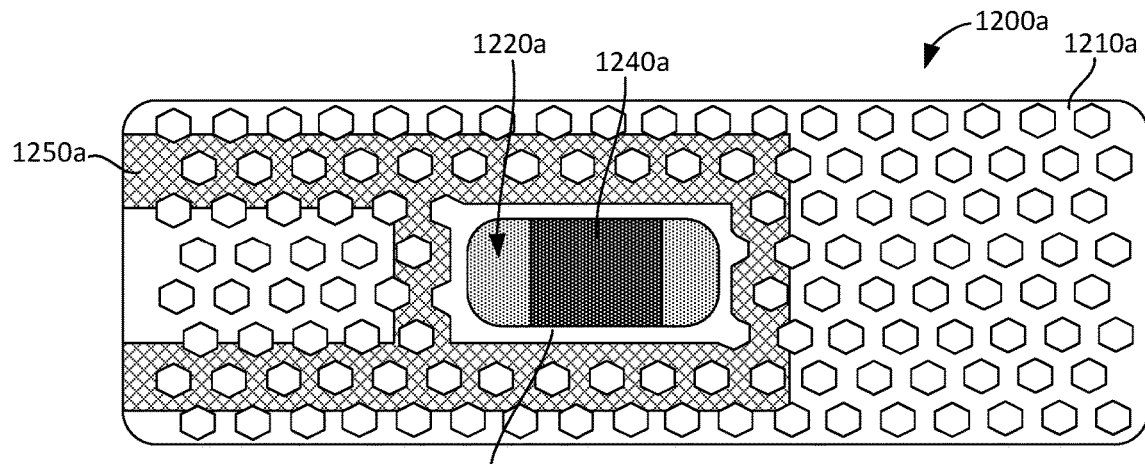
FIGS. 12A-12C are diagrams that schematically illustrate portions of IGBT devices that can be included in an IGBT device, such as the IGBT 900 of FIG. 9.
Figure 12B:
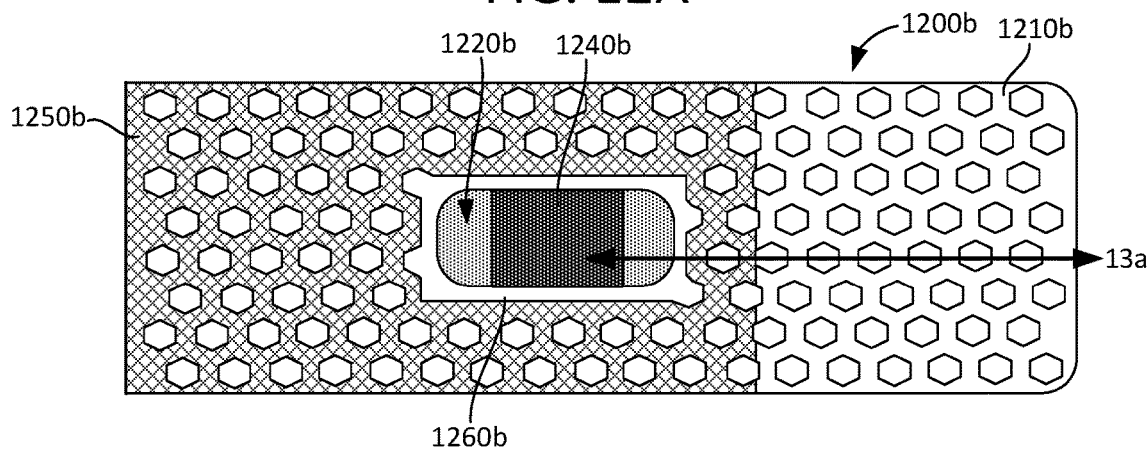
Figure 12C:
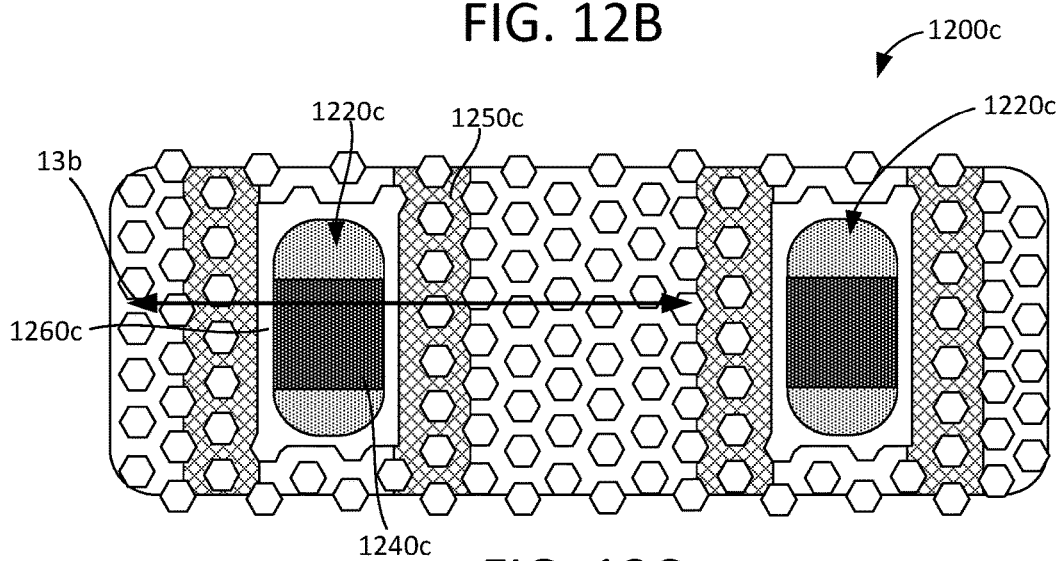

FIGS. 12A-12C are diagrams that schematically illustrate portions of IGBT devices that can be included in an IGBT, such as the IGBT 900 of FIG. 9. In each of FIGS. 12A-12C, various arrangements of active mesas, IGBT gate configurations and dielectric termination regions are illustrated.

Referring to FIG. 12A, a portion of an IGBT device 1200a that can be included, for example, in the IGBT 900 of FIG. 9 is illustrated. The IGBT 1200a includes a dielectric termination region 1210a, an active emitter mesa 1220a, and a source implant 1240a that is disposed in the active emitter mesa 1220a. The IGBT device 1200a also includes a patterned conductive gate electrode 1250b, which can connect to trench gate electrodes that are adjacent to the active mesa 1220a (e.g., such as the conductive electrodes 1050a illustrated in FIG. 10A). As shown in FIG. 12A, the gate electrode 1250a is isolated from the active emitter mesa 1220a by a gate dielectric 1260a.

Referring now to FIG. 12B, a portion of an IGBT device 1200b that can be included, for example, in the IGBT 900 of FIG. 9 is illustrated. The IGBT 1200b includes a dielectric termination region 1210b, an active emitter mesa 1220b, and a source implant 1240b that is disposed in the active emitter mesa 1220b. The IGBT device 1200b also includes a blanket conductive gate electrode 1250b, which differs in configuration from the patterned gate electrode 1250a of FIG. 12A. Similarly to the patterned gate electrode 1250a, the blanket gate electrode 1250b can connect to trench gate electrodes that are adjacent to the active mesa 1220b (e.g., such as the conductive electrodes 1050a illustrated in FIG. 10A). As shown in FIG. 12B, the blanket gate electrode 1250b is isolated from the active emitter mesa 1220b by a gate dielectric 1270a.

Referring now to FIG. 12C, a portion of an IGBT device 1200c that can be included, for example, in the IGBT 900 of FIG. 9 is illustrated. The IGBT 1200c includes a dielectric termination region 1210c, active emitter mesas 1220c, and respective source implants 1240c that are disposed in the active emitter mesas 1220c. The IGBT device 1200b also includes a patterned conductive gate electrodes 1250, which differ in configuration from the patterned gate electrode 1250a of FIG. 12A. Similarly to the patterned gate electrode 1250a and the blanket gate electrode 1250b, the patterned gate electrodes 1250c can connect to trench gate electrodes that are adjacent to the active emitter mesas 1220c (e.g., such as the conductive electrodes 1050a illustrated in FIG. 10A). As shown in FIG. 12C, the patterned gate electrodes 1250c are isolated from their respective active emitter mesas 1220c by a gate dielectric 1260a.

FIGS. 13A-13J are diagrams (cross-sectional and plan views) that illustrate a semiconductor manufacturing process for producing a trench-gate IGBT device 1300. In certain implementations, the semiconductor process illustrated in FIGS. 13A-13J can be used to produce IGBTs having configurations such as the IGBT devices of FIGS. 9, 10A-10C and 12A-12C, as well as other IBGT implementations, such as those disclosed herein.

As with the semiconductor manufacturing processes of FIGS. 4A-4G and 8A-8H, for purposes of brevity and clarity, each processing step of the process flow shown in FIGS. 13A-13J is not specifically illustrated or described in detail in the following discussion. Accordingly, each drawing of FIGS. 13A-13J can be representative of multiple semiconductor processing operations. The specific semiconductor processing operations (and associated processing parameters) that are performed to produce an IGBT device, such as the IGBT device 1300, will depend on the particular implementation, such as an IGBT device's desired operating parameters (e.g., short circuit withstand time, breakdown voltage, Vce,sat, input capacitance, etc.).

In FIGS. 13A-13J, dielectric termination regions 1310 and active emitter mesa regions 1320 are indicated in each cross-sectional view. In certain implementations, the cross-sectional views of FIGS. 13A-13I can correspond with a view along line 13a in FIG. 12B, as an example, though the numbers of trenches and mesas shown in FIGS. 13A-13J, in at least some instances, differ from the numbers of trenches and mesas along the line 13a shown in FIG. 12B. Further, the cross-sectional view of FIG. 13J can correspond with a view along line 13b in FIG. 12C, as an example.

Figure 13A:
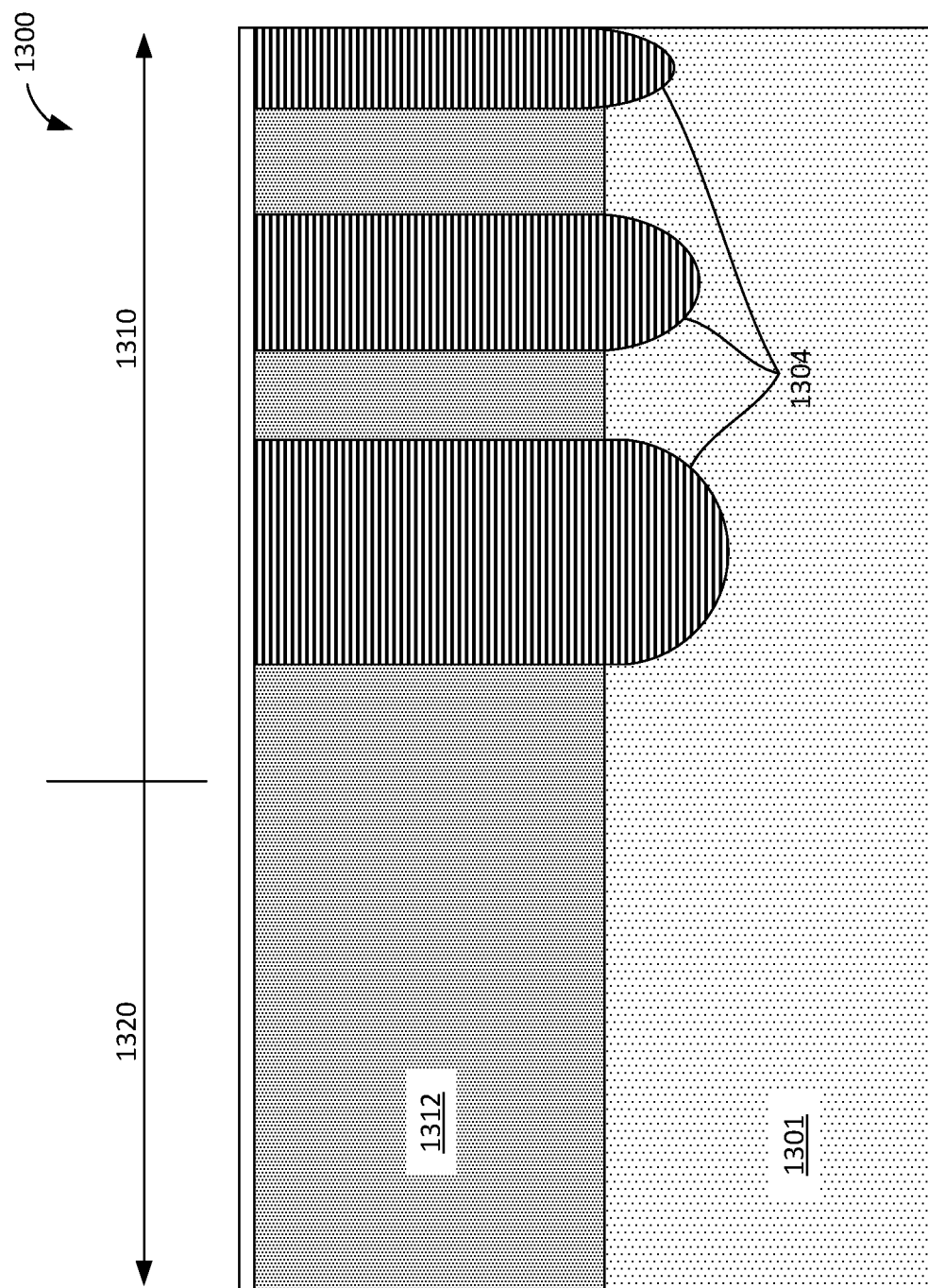

Referring to FIG. 13A a semiconductor (e.g., n-type) substrate 1301 can be used to produce the IGBT device 1300. As noted above, the IGBT device 1300 can include an oxide termination region 1310 and an active emitter mesa region 1320, which are indicated in FIG. 13A. As shown in FIG. 13A, a JFET (n-type) layer 1312 can be formed, where the JFET layer 1312 can have a higher n-type doping concentration than the substrate 1301. As also shown in FIG. 13A, P+ rings 1304 (e.g., boron doped) can be implanted. The P+ rings 1304 can improve a blocking voltage (breakdown voltage) of the IGBT 1300. The P+ rings 1304 can also be included in active segments of other IGBTs described herein, such as the IGBT 200 shown in FIGS. 2A and 2B for example, or IGBTs including oxide filled mesa segments, such as those illustrated in FIGS. 5-7B. In certain implementations (e.g., such as implementations with a dielectric termination region that is deeper than trenches in the active emitter mesa 1320 or wider dielectric termination regions), the P+ rings 1304 can be eliminated, as the deeper and/or wider dielectric termination can provide sufficient voltage blocking.

Figure 13B:
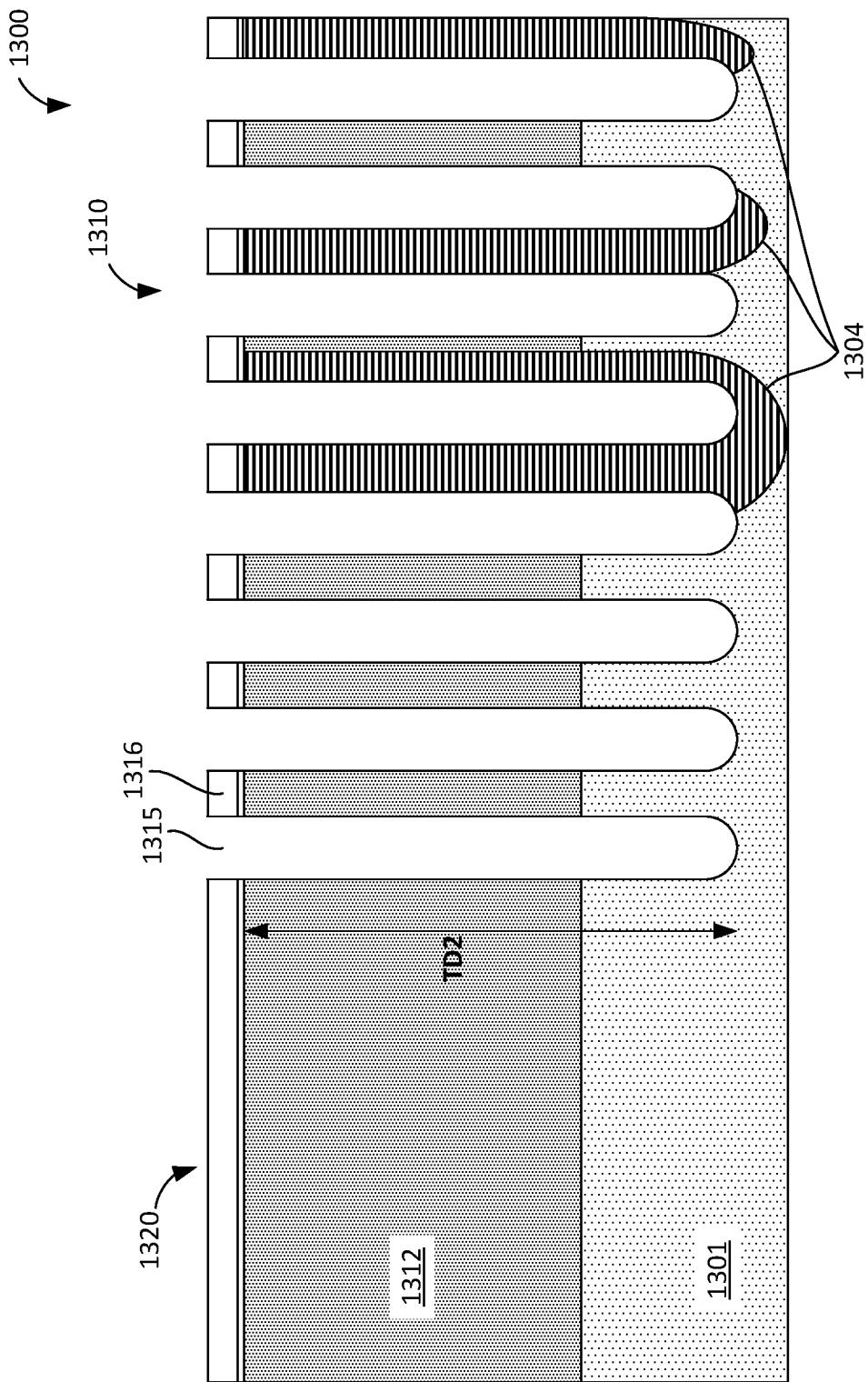

Referring to FIG. 13B, deposition (e.g., TEOS deposition), photolithography and etch operations can be performed to pattern a hard mask layer for etching trenches 1315 (e.g., using an anisotropic trench etch), where forming the trenches 1315 (e.g., at a depth TD2 of approximately 5 μm) can also define pillars 1316 (such as pillars having configurations shown in FIG. 11A) in the dielectric termination region 1310.

Figure 13C:
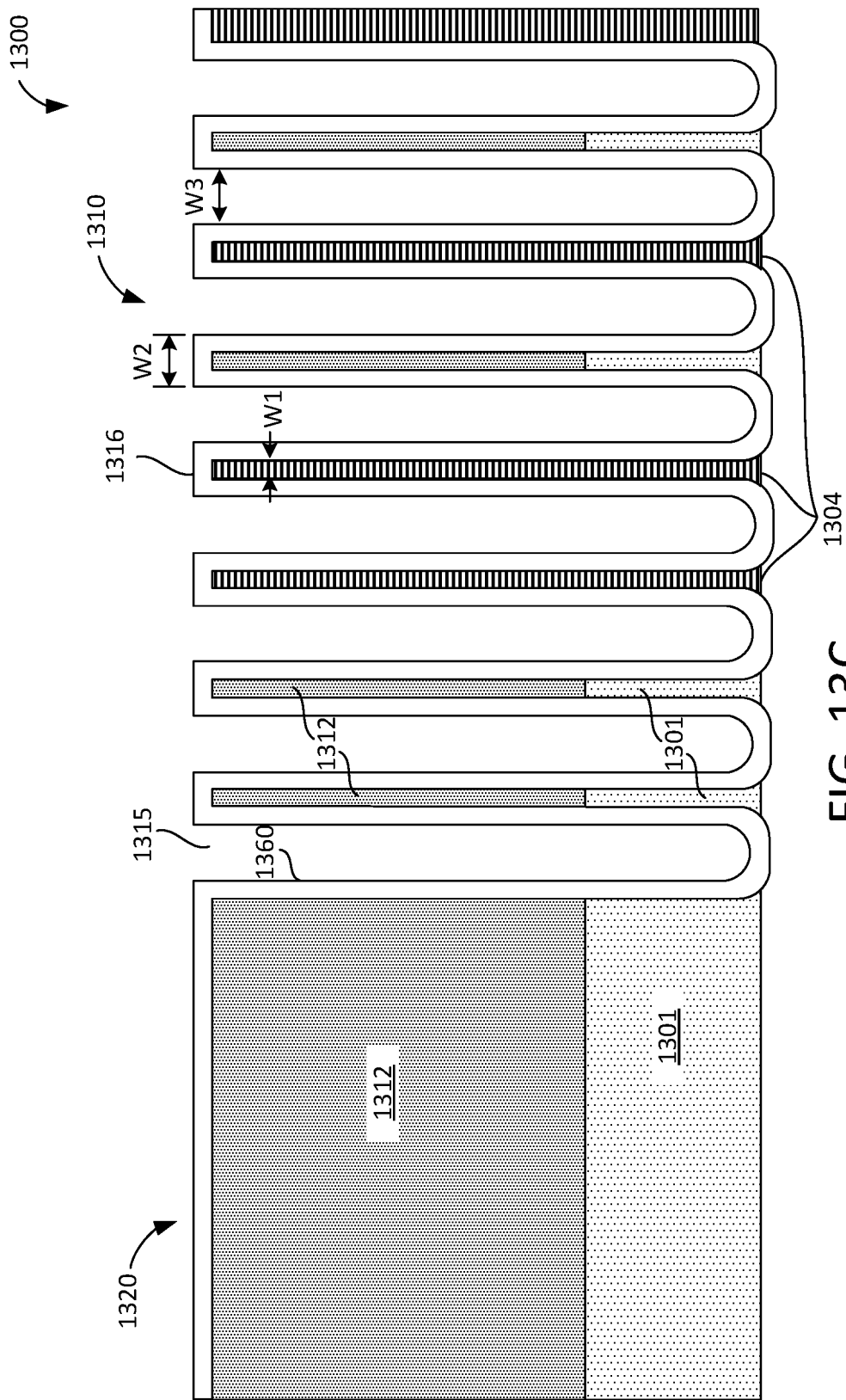

Referring now to FIG. 13C, a sacrificial oxide (SacOX) can be grown and removed, which can help to remove any damage to the semiconductor substrate 1301 (and the JFET layer 1312) caused by the trench etch process of FIG. 13B. After removal of the SacOX layer, a gate oxidation process can be performed, which can form gate oxide 1360 on the sidewalls of the trenches 1315 and at least the upper surfaces of the pillars 1316. In certain implementations, the gate oxidation process can more fully oxidize the pillars 1316 than is illustrated in FIG. 13C. For example, the gate oxidation process could more fully oxidize the semiconductor material of the substrate 1301, the JFET layer 1312, and the P+ rings 1304 that is included in the pillars 1316. The amount of oxidation of the pillars 1316 will depend, at least, on the particular shape and dimensions of the pillars 1316, as well as parameters (time, temperature, etc.) of the gate oxidation process that is performed. As shown in FIG. 13C, in this example implementation, semiconductor material that is within the oxidized pillars 1316 can have a width of W1, where W1 can be approximately 0.0 μm to 0.5 μm. The oxidized pillars 1316 can have a width of W2, which can be approximately 0.5 μm 1.2 μm, while spacing between oxidized pillars can a distance W3, which can be approximately 0.0 μm to 1.0 μm.

Figure 13D:
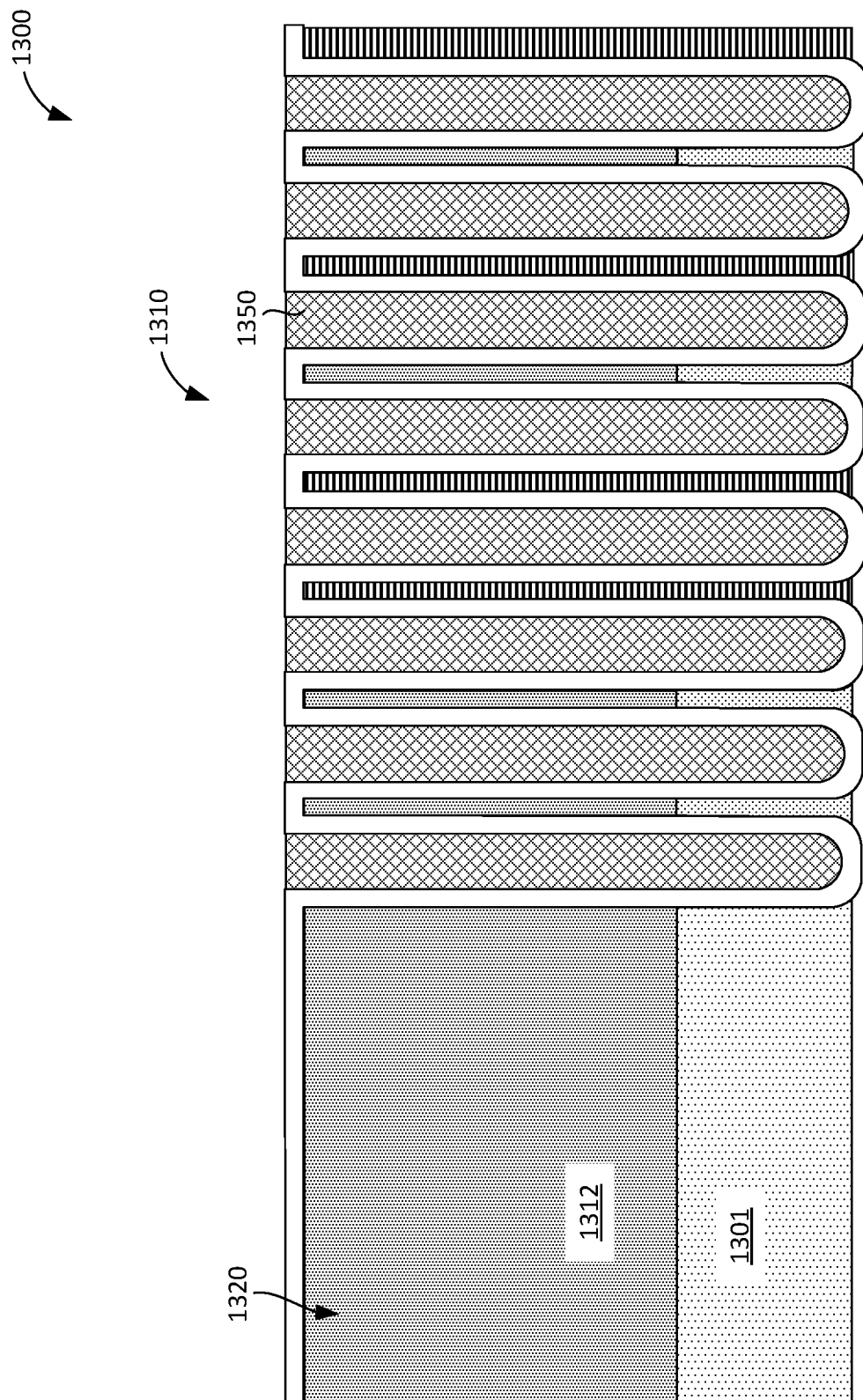
Figure 13E:
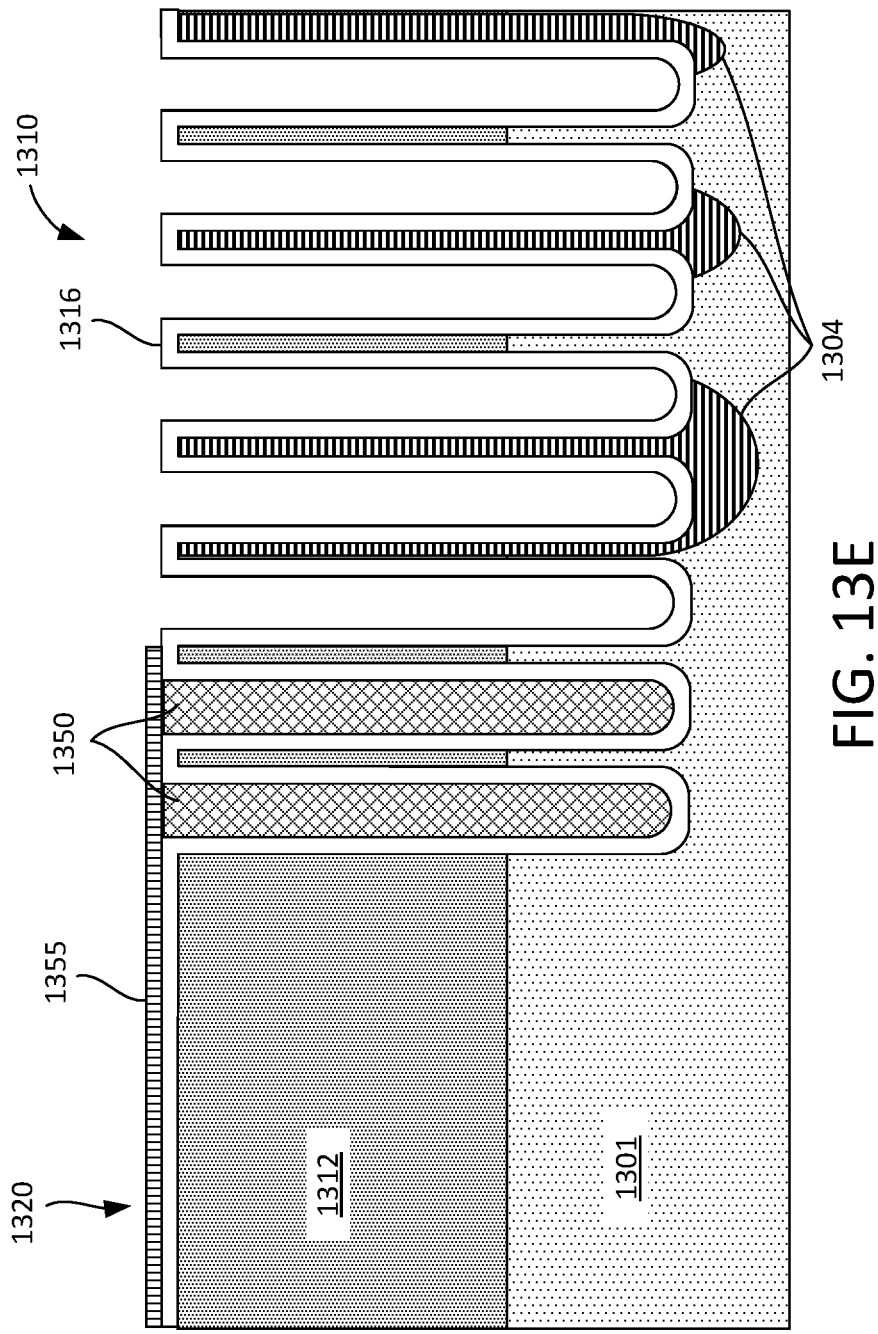

As shown in FIG. 13D, conductive electrodes 1350 can be formed on (within, etc.) the gate oxide 1360 lining the trenches 1315. Formation of the conductive electrodes 1350 (as well as formation of conductive electrodes of the other implementations described herein) can include an etchback process and/or a chemical mechanical polishing process. As shown in FIG. 13E, a mask (such as a nitride mask) 1355 can be formed over the active emitter mesa 1320 (e.g., using photolithography operations). The conductive electrodes 1350 can then be removed (using a polysilicon etch) from the dielectric termination region 1310 using the mask to retain the conductive (e.g., gate) electrodes, 1350 in the active emitter mesa 1320.

Figure 13F:
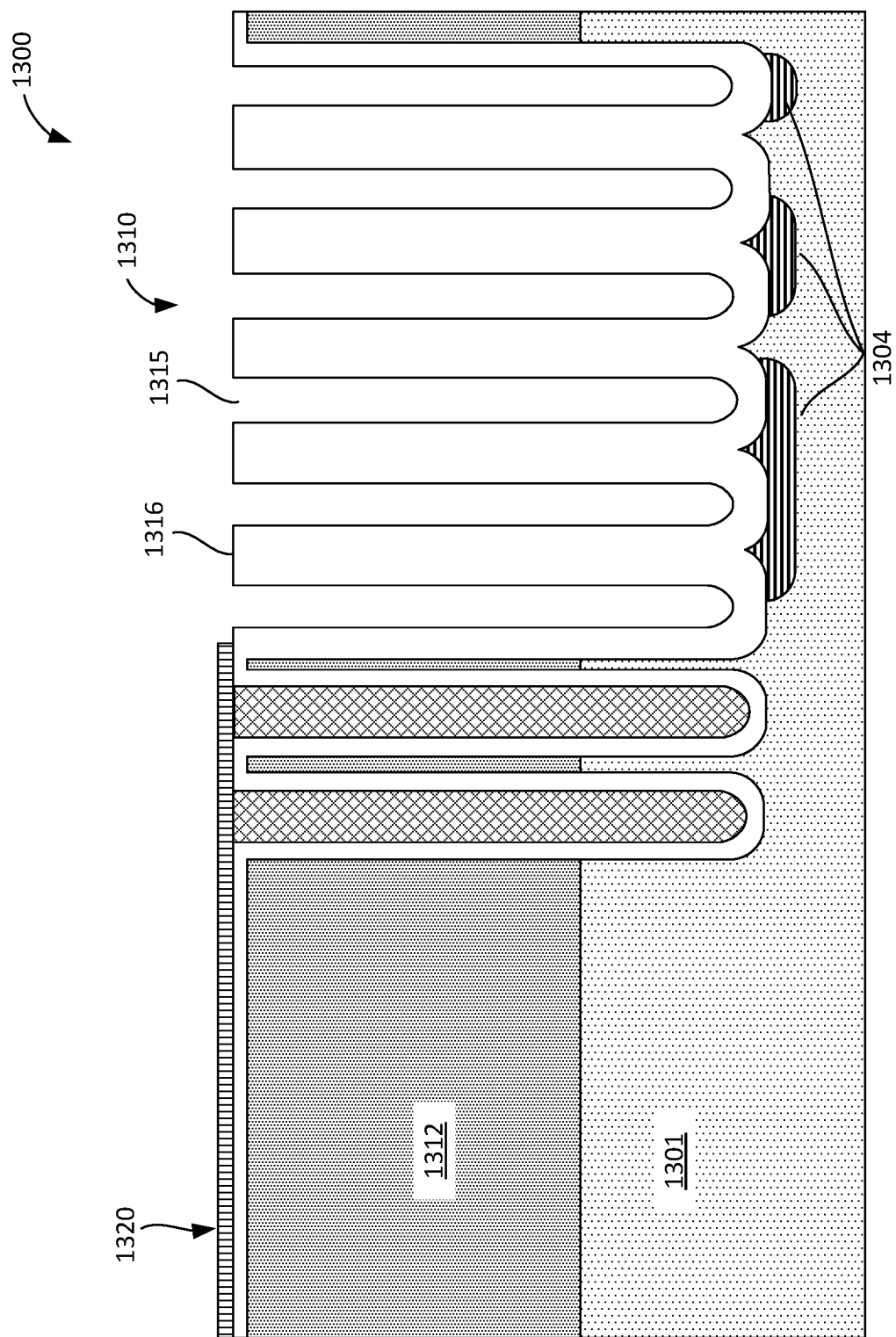

Referring to FIG. 13F, for this implementation, a pillar oxidation process can be formed to more fully (e.g., completely, or nearly completely) oxidize semiconductor material within the pillars 1316. The pillar oxidation process can also spread the P+ ring 1304 implant across the bottom of the oxide termination region 1320, as shown in FIG. 13F.

Figure 13G:
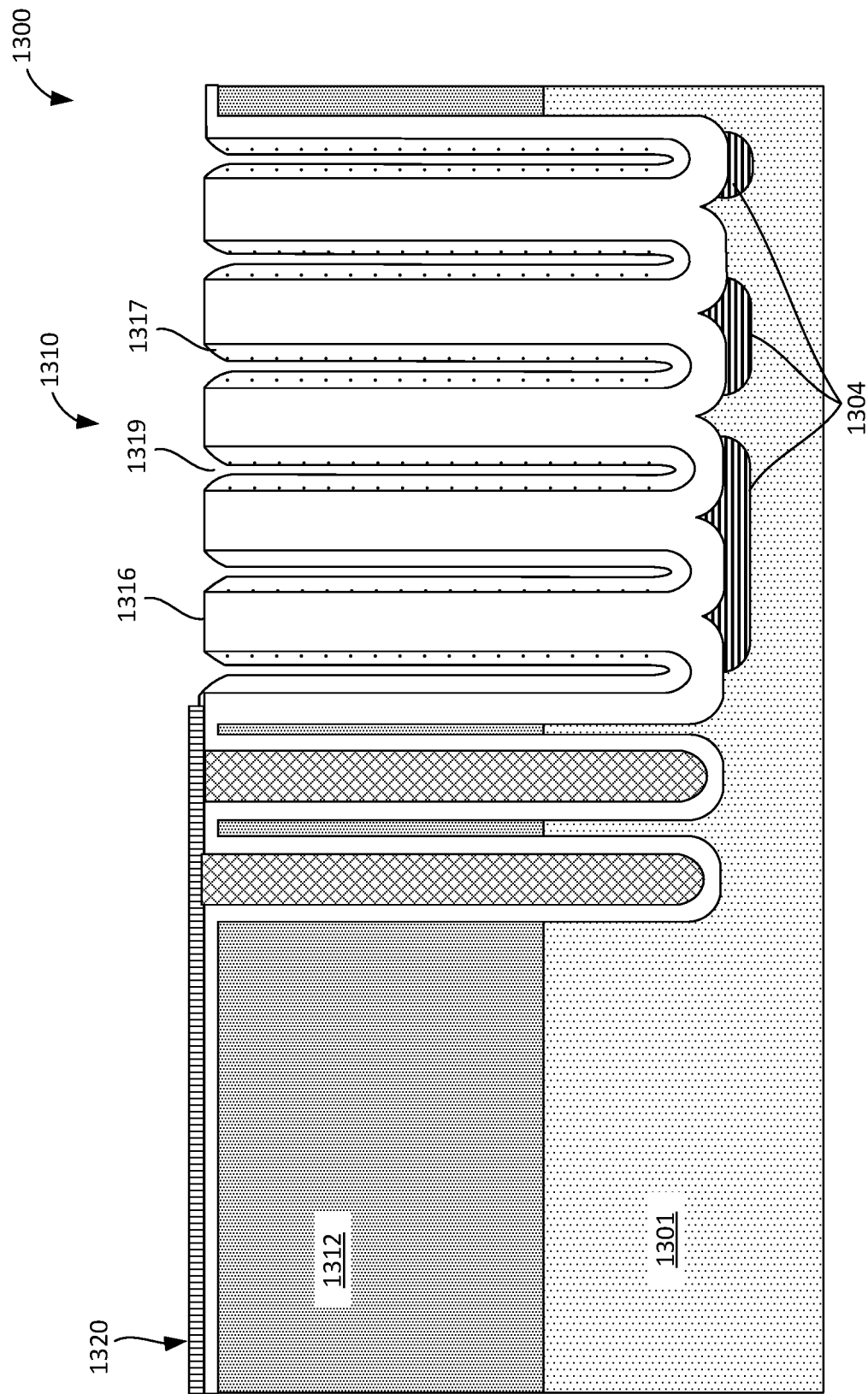

As illustrated in FIG. 13G, a dielectric deposition (e.g., such as a CVD oxide deposition) and dielectric etchback can be performed to further line the trenches 1315 between the oxidized pillars with dielectric material 1317. As shown in FIG. 13G, air gaps 1319 can remain in the dielectric material 1317, where the air gaps 1319 can reduce an amount of stress, or bowing that could occur as a result of subsequent high temperature processing.

Figure 13H:
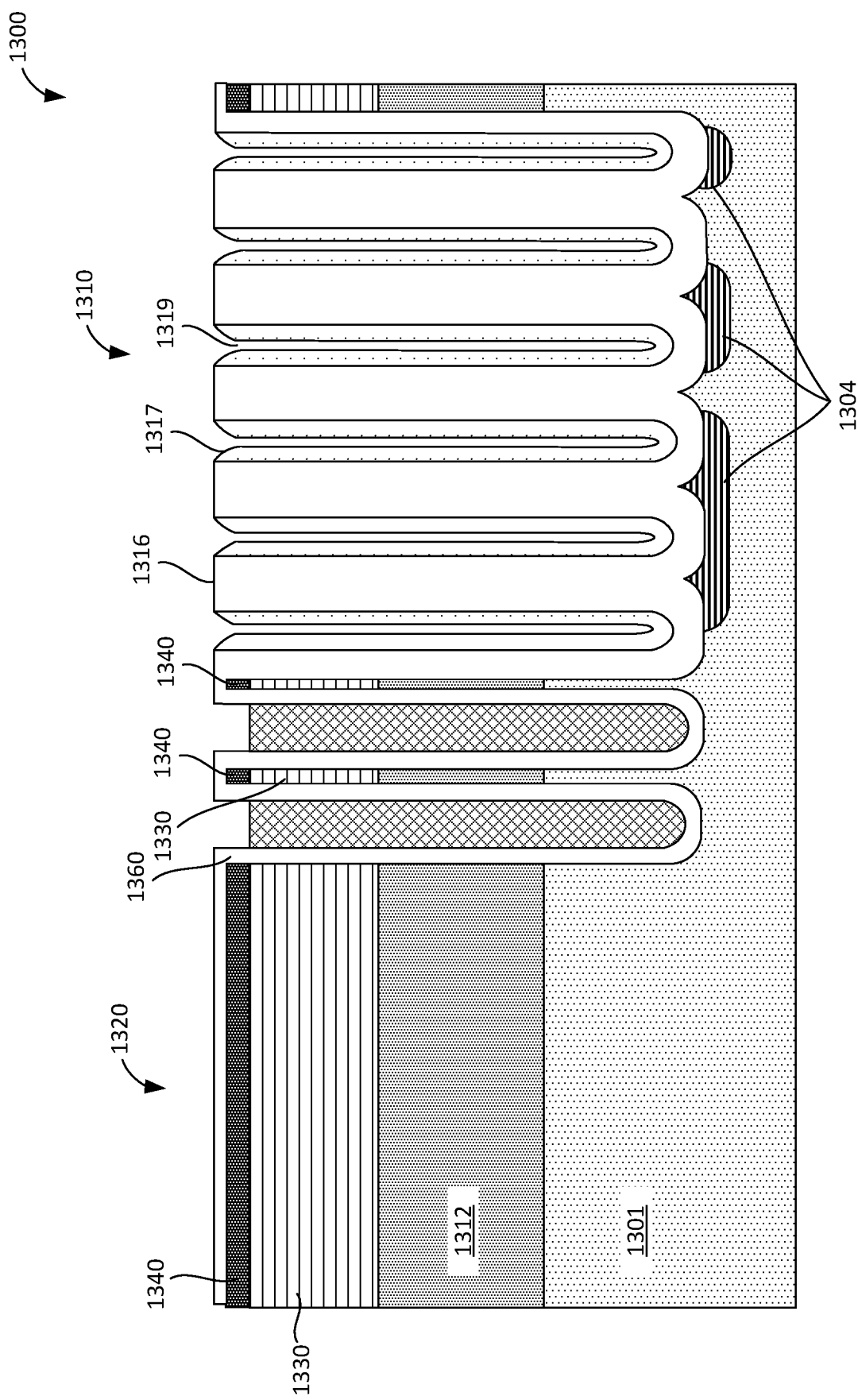

As shown in FIG. 13H, dopant implant and thermal drive operations can be performed to form p-wells 1330 and n-type source implants 1340 in the active emitter mesa 1320. In this example implementation, the source implant process can be self-aligned (e.g., by the dielectric termination region blocking the source implant).

Figure 13I:
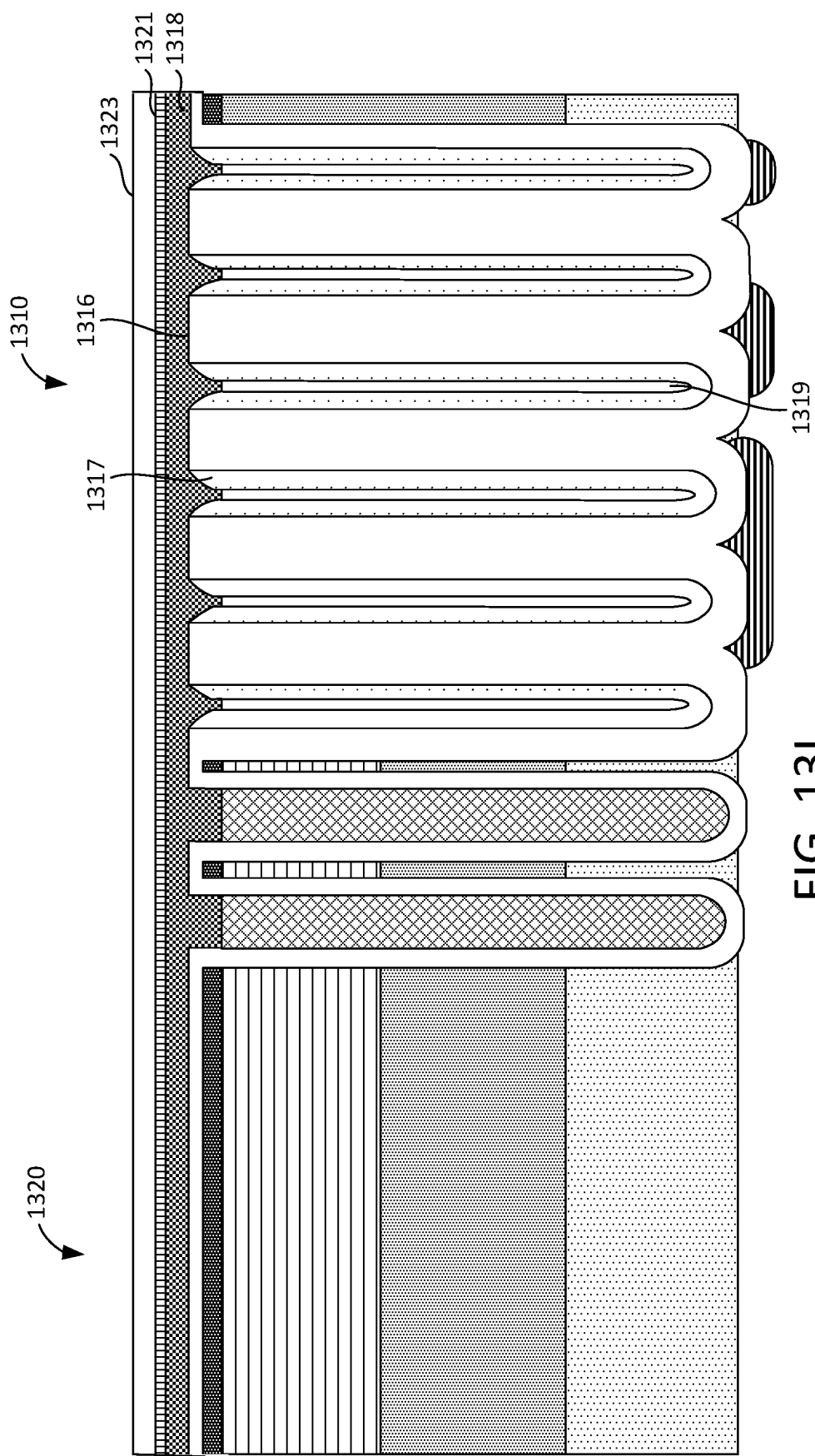

Referring to FIG. 13I, a dielectric cap can be formed to seal the air gaps 1319 in the dielectric termination region 1310. The dielectric cap can include a borophosphosilicate glass (BPSG) layer 1318 (and/or other dielectric material or materials), which can be reflowed to planarize the upper surface of the IGBT 1300. The dielectric cap can also include a nitride barrier layer 1321 and a TEOS layer 1323.

As shown in FIG. 13J (which corresponds with a cross-section along the line 13b in FIG. 12C), metal interconnects to the various elements of the IGBT 1300, as well as other features of the IGBT 1300 can be formed. These features can include, for example, p-type enhancement implants 1362, source contacts 1364, metallization layers 1366 and 1376, and a passivation layer 1368. Conductive contacts (though not specifically shown in FIG. 13J) can also be made to the conductive gate electrodes 1350 in the active emitter mesa 1320. Depending on the implementation, additional features can be formed and/or one or more of the illustrated features of the IGBT 1300 could be eliminated.

Figure 14:
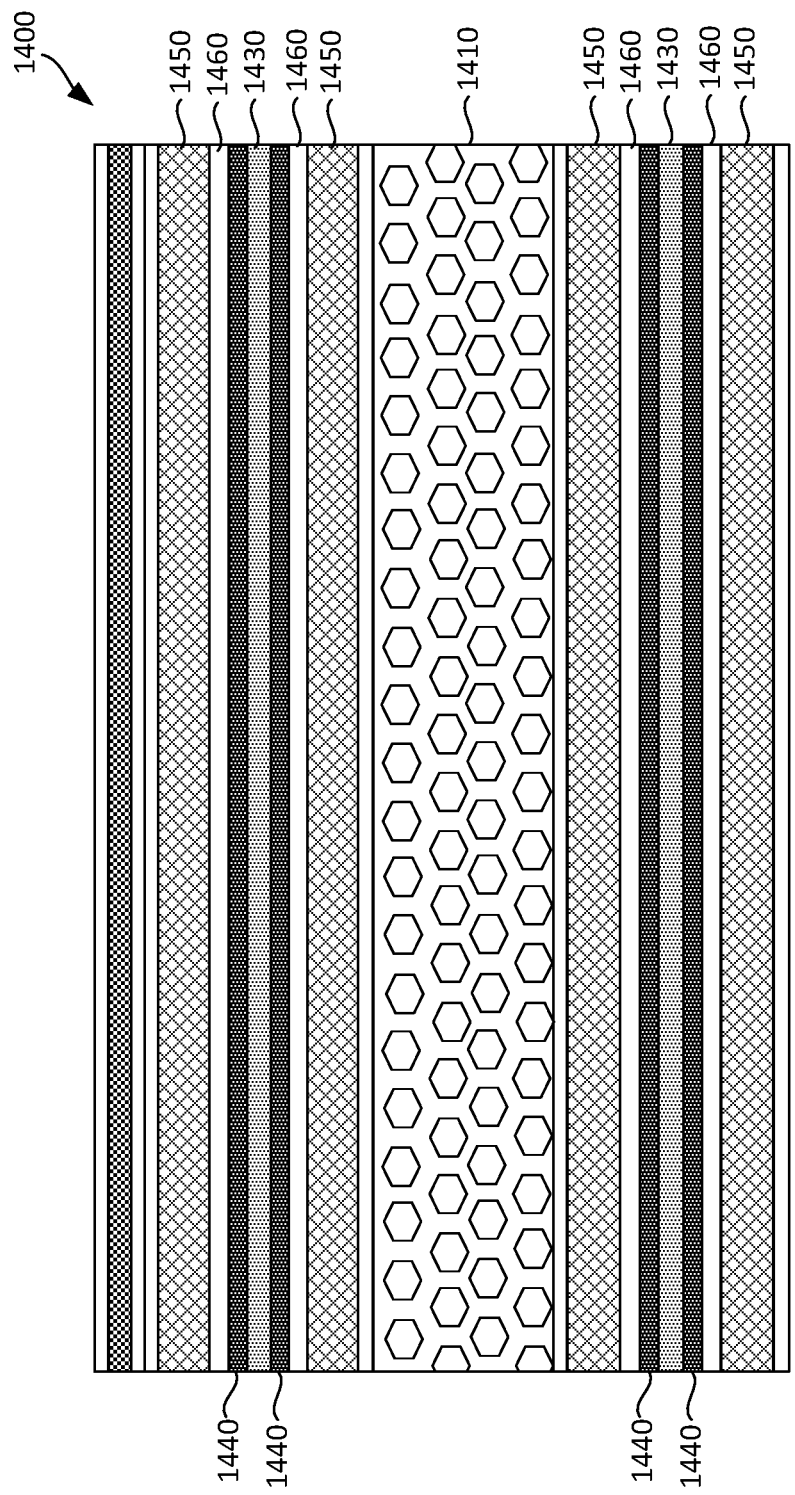
FIG. 14 is a diagram that schematically illustrates a portion of a trench-gate IGBT device.

FIG. 14 is a diagram that schematically illustrates a portion of a trench-gate IGBT 1400 that can be produced using the techniques described herein, such as by combining various operations described herein. As shown in FIG. 14, the IGBT 1400 includes a dielectric (isolation) termination region 1410 that isolates and terminates two active IGBT segments. The dielectric termination region can be formed (produced, etc.) using the approaches described above with respect to FIGS. 11A-11C and 13A-13P, while the active IGBT segments of the IGBT 1400 (e.g., one above and one below the dielectric termination portion 1410) could be formed (produced, etc.) using the approach of FIGS. 4A-4G, for example.

As shown in FIG. 14, the active IGBT segments of the IGBT device 1400 each include an active emitter mesa 1430, which has source implants 1440 disposed therein. Each of the active IGBT segments also includes conductive trench electrodes 1450 (e.g., trench gate electrodes in this example). The active IGBT segments also include gate dielectrics 1460, which can line trenches in which the conductive gate electrodes 1450 are disposed.

The various apparatus and techniques described herein may be implemented using various semiconductor processing and/or packaging techniques. Some embodiments may be implemented using various types of semiconductor processing techniques associated with semiconductor substrates including, but not limited to, for example, Silicon (Si), Gallium Arsenide (GaAs), Silicon Carbide (SiC), and/or so forth.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present.

Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to (or laterally neighboring), vertically adjacent to (or vertically neighboring), or horizontally adjacent to (or horizontally neighboring), where neighboring can indicate that intervening element may be disposed between the elements being described as adjacent.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An insulated gate bipolar transistor (IGBT) device, comprising:
    an active region;
    an inactive region, the inactive region including a termination region;
    a trench extending along a longitudinal axis in the active region;
    a first mesa disposed in the active region, the first mesa defining a first sidewall of the trench and being in parallel with the trench; and
    a second mesa disposed in the active region, the second mesa defining a second sidewall of the trench and being in parallel with the trench,
    at least a portion of the first mesa including, in the active region, an active segment of the IGBT device, and
    at least a portion of the second mesa including, in the active region, an inactive segment of the IGBT device, the inactive segment being defined by a dielectric material.

2. The IGBT device of claim 1, wherein the active segment is a first active segment, the inactive segment is a first inactive segment, the at least a portion of the first mesa includes a first portion of the first mesa and the at least a portion of the second mesa includes a first portion of the second mesa, the IGBT device further including:
    a second active segment included in a second portion of the second mesa in the active region; and
    a second inactive segment included in a second portion of the first mesa in the active region.

3. The IGBT device of claim 1, wherein the first mesa is an active mesa included in the active region and the second mesa is an inactive mesa included in the active region.

4. An insulated gate bipolar transistor (IGBT) device, comprising:
    an active region;
    an inactive region, the inactive region including a termination region;
    a trench extending along a longitudinal axis in the active region;
    a first mesa disposed in the active region, the first mesa defining a first sidewall of the trench and being in parallel with the trench;
    a second mesa disposed in the active region, the second mesa defining a second sidewall of the trench and being in parallel with the trench;
    a first active segment of the IGBT device included in a first portion of the first mesa in the active region;
    a first inactive segment of the IGBT device included in a second portion of the first mesa in the active region, the first inactive segment being defined by a dielectric material;
    a second active segment of the IGBT device included in a first portion of the second mesa in the active region; and
    a second inactive segment of the IGBT device included in a second portion of the second mesa in the active region.

5. The IGBT device of claim 4, wherein the termination region at least partially surrounds the active region.

6. The IGBT device of claim 4, wherein the first mesa is inhomogeneous along the longitudinal axis.

7. The IGBT device of claim 6, wherein the second mesa is inhomogeneous along the longitudinal axis.

8. The IGBT device of claim 4, wherein:
    the first portion of the first mesa includes a first portion of a semiconductor material having a first width, the first sidewall of the trench along the first portion of the first mesa having a first portion of the dielectric material of a first thickness disposed thereon; and
    the second portion of the first mesa includes a second portion of the semiconductor material having a second width, the first sidewall of the trench along the second portion of the first mesa having a second portion of the dielectric material of a second thickness disposed thereon,
    the first width being greater than the second width, and the first thickness being less than the second thickness.

9. The IGBT device of claim 4, wherein:
    the first active segment of the IGBT device is a first emitter segment of the IGBT device; and
    the second active segment of the IGBT device is a second emitter segment of the IGBT device.

10. The IGBT device of claim 4, wherein:
    the first portion of the first mesa is a semiconductor portion of the first mesa; and
    the second portion of the first mesa is a dielectric portion of the first mesa.

11. The IGBT device of claim 10, wherein the dielectric portion of the first mesa is a dielectric-filled portion of the first mesa.

12. The IGBT device of claim 10, wherein the dielectric portion of the first mesa includes a thermally-grown oxide portion of the first mesa.

13. The IGBT device of claim 4, wherein:
    the first active segment and the second active segment of the IGBT device include a source implant; and
    the first inactive segment and the second inactive segment of the IGBT device exclude the source implant.

14. An insulated gate bipolar transistor (IGBT) device, comprising:
    an active region;

an inactive region, the inactive region including a termination region;
a trench extending along a longitudinal axis in the active region;
a first inhomogeneous mesa disposed in the active region, the first inhomogeneous mesa defining a first sidewall of the trench and being in parallel with the trench; and
a second inhomogeneous mesa disposed in the active region, the second inhomogeneous mesa defining a second sidewall of the trench and being in parallel with the trench,
a first portion of the first inhomogeneous mesa including, in the active region, a first active segment of the IGBT device;
a second portion of the first inhomogeneous mesa including, in the active region, a first inactive segment of the IGBT device;
a first portion of the second inhomogeneous mesa including, in the active region, a second active segment of the IGBT device; and
a second portion of the second inhomogeneous mesa including, in the active region, a second inactive segment of the IGBT device.

15. The IGBT device of claim 14, wherein:
the first active segment of the IGBT device is a first emitter segment of the IGBT device and includes a source implant;
the second active segment of the IGBT device is a second emitter segment of the IGBT device and includes the source implant; and
the first inactive segment of the IGBT device and the second inactive segment of the IGBT device exclude the source implant.

16. The IGBT device of claim 14, wherein:
the first portion of the first inhomogeneous mesa includes a first portion of a semiconductor material having a first width, the first sidewall of the trench along the first portion of the first inhomogeneous mesa having a first dielectric material portion of a first thickness disposed thereon; and
the second portion of the first inhomogeneous mesa includes a second portion of the semiconductor material having a second width, the first sidewall of the trench along the second portion of the first inhomogeneous mesa having a second dielectric material portion of a second thickness disposed thereon,
the first width being greater than the second width, and
the first thickness being less than the second thickness.

17. The IGBT device of claim 14, wherein:
the first portion of the first inhomogeneous mesa is a semiconductor portion of the first inhomogeneous mesa; and
the second portion of the first inhomogeneous mesa is a dielectric portion of the first inhomogeneous mesa.

18. The IGBT device of claim 17, wherein the dielectric portion of the first inhomogeneous mesa is a dielectric-filled portion of the first inhomogeneous mesa.

* * * * *